US006583597B2

(12) United States Patent
Tanaka et al.

(10) Patent No.: US 6,583,597 B2
(45) Date of Patent: Jun. 24, 2003

(54) STAGE APPARATUS INCLUDING NON-CONTAINING GAS BEARINGS AND MICROLITHOGRAPHY APPARATUS COMPRISING SAME

(75) Inventors: Keiichi Tanaka, Ageo (JP); Yukiharu Okubo, Kumagaya (JP); Hiroaki Narushima, Tokyo-to (JP); Yukio Kakizaki, Kumagaya (JP); Yasushi Yoda, Fukaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/899,946

(22) Filed: Jul. 6, 2001

(65) Prior Publication Data

US 2002/0070699 A1 Jun. 13, 2002

(30) Foreign Application Priority Data

| Jul. 7, 2000 | (JP) | ................ 2000-206001 |
| Aug. 11, 2000 | (JP) | ................ 2000-243939 |
| Aug. 11, 2000 | (JP) | ................ 2000-243940 |
| Oct. 12, 2000 | (JP) | ................ 2000-311487 |

(51) Int. Cl.$^7$ ............................................. G05B 11/00
(52) U.S. Cl. ..................... 318/687; 318/649; 318/38; 318/135
(58) Field of Search ........................ 318/687, 649, 318/67, 38, 135; 33/1 M; 74/471 XY

(56) References Cited

U.S. PATENT DOCUMENTS 4,485,339 A * 11/1984 Trost ...................... 310/12
5,623,853 A * 4/1997 Novak et al. ............. 355/53
5,760,564 A 6/1998 Novak

FOREIGN PATENT DOCUMENTS

| JP | 62-182692 | 8/1987 |
| JP | 07-335533 | 12/1995 |
| WO | WO 99/6621 | 12/1999 |

* cited by examiner

*Primary Examiner*—Robert E. Nappi
*Assistant Examiner*—Edgardo San Martin
(74) *Attorney, Agent, or Firm*—Klarquist Sparkman LLP

(57) ABSTRACT

Stage apparatus are disclosed for holding an object (e.g., substrate or reticle, for example) in a microlithography system, especially a system for performing microlithography in a vacuum environment. The stage apparatus provides movement of a stage (intended to hold the object) in X and Y directions of a guide plane. The stage is mounted to an arm member having at least first and second ends situated symmetrically relative to the stage. The ends include linear-motor movers that interact with corresponding stators, and include gas bearings on surfaces that slide relative to other surfaces as the stage is moved within the guide plane. The linear-motor movers can be one- or two-dimensional movers and desirably allow θ-direction motion of the stage. Other configurations include guide members and sliders that undergo sliding motion relative to the guide members via non-contacting gas bearings. The sliders can be driven by a combination of a linear motor and a gas cylinder, the latter assisting the driving force by the linear motor during acceleration and deceleration of the stage.

62 Claims, 26 Drawing Sheets

STAGE APPARATUS INCLUDING NON-CONTAINING GAS BEARINGS AND MICROLITHOGRAPHY APPARATUS COMPRISING SAME

FIELD OF THE INVENTION

This invention pertains generally to equipment for executing fabrication protocols directed at producing ultraminiature devices such as microelectronic devices, integrated circuits, display matrices, and the like on a substrate such as a semiconductor wafer. More specifically, the invention pertains to holding and moving mechanisms that provide precision movement and positioning of the reticle and/or substrate during execution of a process such as microlithography is performed on the substrate. The stages according to the invention are especially suitable for operation in a vacuum environment in which microlithography is performed using a charged particle beam.

BACKGROUND OF THE INVENTION

In view of the extremely high accuracy and precision required in contemporary fabrication processes performed on semiconductor wafers and other substrates, various configurations of substrate stages (generally termed "wafer stages" herein) have been developed for use in providing high-precision movement and positioning of the substrate. Similar developments also have occurred with respect to reticle stages. The respective configurations often reflect the particular fabrication process and process conditions in which the stages are used. The various configurations also reflect the urgent need to minimize vibration and friction in the stage as much as possible.

An example conventional wafer stage assembly is disclosed in Japan Kôkai Patent Document No. Sho 62-182692. This wafer-stage assembly includes dual guide shafts and is suspended on box-shaped air bearings (gas bearings). An oblique view of the stage assembly 140 is shown in FIG. 30. The stage assembly 140 includes a base 141 and a pair of box-shaped base guides 142 mounted on the base 141. Permanent magnetic plates (not detailed) are affixed to the inside surfaces of the base guides 142, thereby forming respective motor yokes 142a. Engaged at the upper portion of each of the two base guides 142 is a respective box-shaped coil bobbin 143. The motor yokes 142a and coil bobbins 143 collectively comprise a first linear motor providing movement of a wafer stage 146 in the X direction. A box-shaped movable guide member 144 extends between the coil bobbins 143, thereby connecting the coil bobbins together. A permanent magnetic plate (not detailed) is affixed to the inside surface of the movable guide member 144, thereby forming a motor yoke 144a. Engaged at the upper portion of the movable guide member 144 is a box-shaped coil bobbin 145. The motor yoke 144a and coil bobbin 145 collectively comprise as second linear motor providing movement of the wafer stage 146 in the Y direction. The wafer stage 146 is mounted to the coil bobbin 145.

To form air bearings, air-discharge holes (not shown in FIG. 30) are defined on respective surfaces inside the coil bobbins 143, 145 at locations opposite the respective motor yokes 142a, 144a. The air bearings are constituted by discharging air from the air-discharge holes into gaps between the coil bobbins 143, 145 and the respective motor yokes 142a, 144a.

The wafer-stage assembly shown in FIG. 30 has a configuration in which one movable body (i.e., the guide member 144 and coil bobbin 145) is situated over the upper portion of the other movable body (i.e., the base guide 142 and coil bobbin 143). In other words, the movable body constituted by the guide member 144 and coil bobbin 145 is stacked relative to the movable body constituted by the base guide 142 and coil bobbin. With this stacked configuration, the lower movable body must be large to support the upper movable body adequately. Also, the configuration of FIG. 30 cannot be used in a vacuum because this stage assembly provides no way in which to recover air discharged from the air bearings.

Another conventional wafer stage assembly, disclosed in International application no. WO 99/66221, has a single-shaft configuration that can be used in a vacuum environment. The stage assembly includes a movable body including air-bearing pads. An elevational section of this stage assembly 150 is shown in FIG. 31 and an oblique view of certain details of an air bearing in this stage assembly 150 is provided in FIG. 32.

The stage assembly 150 is mounted on a surface S of a base 151. Two C-shaped guide members 152 are mounted to the bench 151 via respective support members 155. The respective openings in the guide members 152 face each other so as to guide movement of a movable member 153. The fit of the movable member 153 in the openings of the guide members 152 allows a small gap between the movable member 153 and the inside surfaces of the openings. The gap provides an air bearing between the movable member 153 and the guide members 152. A wafer stage 161 is mounted to an upper surface of the movable member 153. A wafer 163 or other suitable substrate is mounted to the wafer stage 161.

The lower surface of the movable member 153 is mounted to a moving member (armature) 156 having a downwardly protruding (⊤) tongue. The tongue fits into an upwardly opening groove defined in a stator 157 having a ⊔-shaped section. The stator 157 extends along a center line (extending in the Y direction) of the stage assembly 150 on the installation surface S. The tongue of the armature 156 fits into the groove in the stator 157 with a small gap therebetween, thereby forming a linear motor. Thus, the member 153 is movable in the Y direction (perpendicular to the plane of the page).

The configuration of an air bearing is described further, with reference to FIG. 32. As noted above, air bearings are defined between the opposing faces of a guide member 152 and the movable member 153 that slides between opposing faces of the guide member 152. Each guide member 152 comprises an upper portion 152a, a side portion 152b, and a lower portion 152c. In FIG. 32, an upper portion 152a has been pivoted upward (note arc-shaped arrow $A_1$) from the position indicated by broken lines to reveal detail, and the side portion 152b has been pivoted downward (note arc-shaped arrow $A_2$) from the position indicated by broken lines to reveal detail.

Defined on the depicted upper surface and end surface of the movable member 153 are respective pairs of air pads 153a. Each air pad 153a comprises a porous material transmissive to a gas. The gas is supplied from a gas source 158 to the air pads 153a via a conduit 153b. Each pair of air pads 153a is surrounded by a respective "guard ring" 153c. A respective gas-exhaust port 154a is defined in the upper portion 152a and the side portion 152b opposite the respective guard ring 153c on the movable member 153. A rotary exhaust pump 159 is connected to the gas-exhaust port 154a via an exhaust conduit 154b. Thus, gas discharged from the air pads 153a is exhausted by the exhaust pump 159.

The movable member 153 moves in the Y direction in FIGS. 31 and 32. In FIG. 32, selected end positions of the movement range of the guard ring 153c are shown by the broken lines on the inside surface of the side portion 152b. As can be understood from this figure, within the range of movement of a guard ring 153c, the guard ring 153c remains at all times in communication with the respective gas-exhaust port 154a. Thus, gas discharged from the air pads 153a is collected by the respective gas-exhaust ports 154a and exhausted with almost no leakage to the chamber or other vacuum environment in which the stage assembly is located.

The stage assembly disclosed in WO 99/66221 can be used in a vacuum. However, this stage assembly has several disadvantages. First, it is based on a single movable member 153 that moves only along one axis (X or Y). If two-dimensional movement of the wafer stage 161 is required or desired, then two movable members are required that must be stacked relative to each other, resulting in a large and bulky structure. Second, two respective air pads 153a are provided on each upper surface and each side surface of the movable member 153. If the stage assembly is configured to have two movable members, then the number of air pads is correspondingly larger, with a correspondingly larger leakage of gas into the vacuum environment of the stage assembly. Third, because the conduit 153b for supplying gas to the air pads 153a is connected to the movable member 153, the tensile strength of the conduit 153b can exert an adverse influence on the controllability of the movable member 153.

Yet another conventional stage assembly is disclosed in U.S. Pat. No. 5,760,564. This stage assembly provides pressurization, in the Z direction, to the wafer stage using air bearings and vacuum pads. FIG. 33 is an oblique view of this stage assembly 170 and FIG. 34 is a plan view.

The stage assembly 170 comprises a base 171. Extending along opposing edges of the upper surface of the base 171 are respective first guide bars 173a, 173b extending in the Y direction. Extending along the other opposing edges of the upper surface of the base 171 are respective second guide bars 174a, 174b extending in the X direction. The first guide bars 173a, 173b include respective stators (arrays of permanent magnets) 176a, 176b arranged along the respective under-surfaces of the first guide bars 173a, 173b. The second guide bars 174a, 174b include respective stators (arrays of permanent magnets) 177a, 177b arranged along the respective under-surfaces of the guide bars 174a, 174b.

A Y-movable member 179 extends between the first guide bars 173a, 173b and moves in the Y direction. Linear-motor armature coils (not shown) are provided at each end of the Y-movable member 179. These armature coils, along with the stators 176a, 176b, constitute a first linear motor.

Similarly, an X-movable member 178 extends between the second guide bars 174a, 174b and moves in the X direction. Linear-motor armature coils (not shown) are provided at each end of the X-movable member 178. These armature coils, along with the stators 177a, 177b, comprise a second linear motor.

A wafer stage 181 is mounted on the movable members 178, 179 so as to be slidable in the X direction relative to the Y-movable member 179 and slidable in the Y direction relative to the X-movable member 178. The wafer stage 181 includes an electrostatic chuck 180 or the like to which a wafer W is mounted.

As shown in FIG. 34, air bearings 183a, 183b, 183c, 183d are provided below the X-movable member 178. The air bearings 183a–183d prevent the X-movable member 178 from contacting the surface of the base 171, so as to reduce friction. Similarly, air bearings 184a, 184b, 184c, 184d are provided below the Y-movable member 179 and provide a similar function with respect to the Y-movable member 179. An additional air bearing 184e is provided at the center of the base 171 to provide a bearing for the mechanical load (stage 181, etc.) on the center of the Y-movable member 179. In addition, three air bearings 185a, 185b, 185c are provided below the stage 181. These air bearings 185a–185c support the load of the stage 181 directly on the base 171.

Thus, with the stage assembly 170, Z-direction suspension of the wafer stage 181 relative to the base 171 is provided by air bearings. This scheme simplifies the manner in which the air bearings are pressurized and allows the overall mass of the assembly (including the wafer stage 181) to be reduced compared to the configuration disclosed in Japan Kôkai Patent Document No. Sho 62-182692. Unfortunately, however, in a vacuum the air bearings of this stage assembly cannot be pressurized properly. Whereas Z-direction suspension could be achieved using magnetic levitation, such a scheme is difficult to use in a charged-particle-beam microlithography apparatus, which is exquisitely sensitive to magnetic-field fluctuations.

SUMMARY OF THE INVENTION

In addressing the shortcomings of the prior art as summarized above, an object of the invention is, inter alia, to provide improved stage apparatus that can be used in a vacuum environment and that exhibits better controllability than conventional stage apparatus.

To such end, and according to a first aspect of the invention, stage apparatus are provided for moving and positioning a stage within a guide plane. An embodiment of such a stage apparatus comprises a stage and a support structure comprising first and second linear-motor stators. The stage is connected to an arm member having a first end extending from the stage in a first direction and a second end extending from the stage in a second direction opposite the first direction in a plane parallel to the guide plane. First and second sets of linear-motor "movers" (armatures) are arranged on the first and second ends, respectively. The movers are configured to interact with the first and second linear-motor stators, respectively, so as to achieve motion, relative to the support structure, of the arm member and stage in the guide plane.

The stage preferably is situated at the center of the arm member. By arranging the movers symmetrically relative to the stage, movements of the stage are made very smooth. Also, by situating the movers at respective ends of the arm member separately from the stage, magnetic-field fluctuations accompanying movements of the movers relative to the stators are isolated more effectively from the stage.

This stage apparatus can include a guide bar connected to the arm member. The guide bar has a first end extending from the stage in the first direction and a second end extending from the stage in the second direction. Each end of the guide bar comprises a respective bearing by which the guide bar slides relative to a respective surface on the support structure without contacting the support structure. The bearings desirably are air bearings or, more generally, gas bearings that provide a near-frictionless motion of the guide bar (and hence the arm member and stage) relative to the respective surfaces on the support structure.

The arm member desirably defines a conduit, internal with respect to the arm member, that conducts a coolant fluid to and from the mover coils. The arm member can include any of various other conduits as required, for example a conduit for conducting air to and from the air bearings. These internal conduit(s) eliminate the need for external conduits that otherwise interfere with free motion of the stage.

According to another embodiment, a stage apparatus according to the invention comprises a support structure, a stage, and a guide bar. The guide bar is attached to the stage and defines at least three end portions extending in respective directions from the stage in a plane parallel to the guide plane. Each end portion comprises a respective plane bearing configured to support the respective end portion relative to the support structure without the respective plane bearing contacting the support structure. This combination of a guide bar and plane bearings more effectively maintains the stage as required (e.g., horizontally) within the guide plane and reduces drive friction.

This apparatus configuration can further include an arm, having first and second ends, connected in a parallel manner to the guide bar. Each of the first and second ends of the arm includes at least one respective linear-motor mover. The support structure further comprises a respective linear-motor stator for the respective mover(s) on each of the first and second ends of the arm. Hence, each respective linear-motor mover interacts with the respective linear-motor stator so as to achieve motion of the arm, guide bar, and stage, relative to the support structure, in the guide plane.

Each plane bearing can be configured as a gas bearing comprising at least one gas-bearing pad. In this configuration, the guide bar desirably defines internal conduits providing gas supply to and gas recovery and exhaust from the gas bearings.

According to yet another embodiment, a stage apparatus comprises a stage and a plurality of arm members connected to and extending from the stage. Each arm member has respective first and second end portions each having attached thereto a respective linear-motor mover. The apparatus also includes a plurality of guide bars extending from the stage. Each guide bar has at least one respective end portion including a non-contacting bearing. The apparatus also includes a support structure that comprises (1) a respective linear-motor stator associated with each of the linear-motor movers, and (2) a respective guide plate associated with each linear-motor stator (wherein the bearings are configured to slide along respective guide plates). The stators and respective guide plates are arranged in a stacked configuration relative to each other in a direction perpendicular to the guide plane.

According to yet another embodiment, a stage apparatus according to the invention comprises a support structure, a main stage, and a substage. The main stage is configured to hold a process object and to move, with the process object, relative to the support structure within a guide plane. The substage is situated relative to the main stage and the support structure. The substage is configured to mediate flow of a fluid to and from the main stage while the substage is being moved and positioned relative to the main stage. The substage also reduces warping of the main stage.

The main stage and substage desirably interrelate with each other via non-contacting plane bearings situated at respective interrelation portions of the main stage and substage at which the main stage and substage, respectively, interrelate with each other. The flow of the fluid to and from the main stage desirably occurs at the respective interrelation portions. The plane bearings can be respective air bearings each comprising a respective air pad.

This embodiment also can include a linear motor situated and configured to drive the main stage in the guide plane relative to the support structure. The linear motor desirably comprises a respective linear-motor stator at each of the interrelation portions. In such a configuration the main stage and substage interrelate with each other in a Z direction, perpendicular to the guide plane, via the respective non-contacting plane bearings at the respective linear-motor stators. This embodiment also can include a reaction-force-attenuation mechanism situated to support a center of gravity of the linear-motor stators relative to a member vibrationally isolated from the stage apparatus. Thus, adverse effects arising from vibrations or reaction forces associated with driving of the main stage can be reduced.

In yet another embodiment, a stage apparatus according to the invention comprises (1) a support structure, (2) a stage, (3) multiple Y-axis guide members extending in a Y direction, (4) a respective Y-axis slider associated with each Y-axis guide member; (5) at least one X-axis guide member mounted to the Y-axis sliders and extending in an X direction between the Y-axis sliders, and (6) a respective X-axis slider situated and configured to slide in the X direction along the respective X-axis guide member. Each Y-axis slider is situated and configured to slide in the Y direction along the respective Y-axis guide member. The X-axis sliders are attached to the stage. At least one respective non-contacting air bearing is situated between each guide member and the respective slider, and at least one respective gas cylinder is situated and configured to drive each X-axis slider and the Y-axis sliders relative to the respective guide members. By employing at least one gas cylinder in this manner, magnetic-field fluctuations are either reduced substantially or eliminated.

Each slider desirably includes multiple respective gas bearings situated between the slider and the guide member. Each gas bearing desirably includes at least one respective guard ring situated and configured to exhaust air from the gas bearing. Also, each guard ring can be situated and configured to exhaust air from the respective gas cylinder. These configurations reduce leakage of gas from the bearings, thereby making the stage apparatus more suitable for use in a vacuum environment.

In this embodiment, each guide member desirably defines a respective internal passage that includes at least one conduit for exhausting gas from the respective gas cylinder and from the respective gas bearings. The respective internal passage also can include respective conduits for supplying air to the bearings and for recovering air from the bearings. By providing internal conduits in this manner, the need to provide external conduits to the gas cylinder or to the stage is eliminated, thereby imposing fewer restrictions on stage movement and improving stage controllability.

Yet another embodiment of a stage apparatus according to the invention is configured for moving and positioning a stage within a guide plane and relative to an axis extending perpendicularly to the guide plane. The stage apparatus comprises a guide member, a slider, a stage attached to the slider, and a drive mechanism. The slider is situated relative to the guide member and is configured to undergo a sliding motion in the guide plane relative to the guide member as guided by the guide member. The sliding motion is on at least one non-contacting gas bearing situated between the slider and the guide member. The drive mechanism is operably coupled to the slider so as to cause the sliding motion of the slider relative to the guide member. The drive mechanism comprises at least one linear motor and at least one gas cylinder. The gas cylinder is configured to provide a driving force (that assists a driving force imparted to the slider by the linear motor) during acceleration and deceleration of the slider. The gas cylinder provides a high-magnitude driving force that achieves high acceleration and deceleration characteristics. The linear motor effectively provides high-precision positioning and movement of the stage, and excellent control of stage acceleration, deceleration, and velocity during scanning exposures, for example. By using a gas cylinder, the size of the linear motor can be reduced from the size that otherwise would be required if only a linear motor were used.

The linear motor can be any of various types, such as linear motors based on electromagnetism, electrostatics, electrostriction (including ultrasonic-wave systems), or magnetostriction.

In this embodiment, the stage apparatus can include a respective guard ring associated with each gas bearing. The guard rings generally are configured to recover and exhaust air from the respective gas bearing and from the gas cylinder.

Further regarding this embodiment, a first gas cylinder and respective linear motor can be situated at a central region of the slider. Meanwhile, a second gas cylinder and respective linear motor are situated in opposition to the first gas cylinder and respective linear motor, so as to flank the slider. In this configuration the point at which driving forces meet is located substantially at the center of gravity of the cylinder. Thus, it is possible to provide the driving force at the center of gravity of the cylinder, which allows positional control to be performed with high precision at high velocity.

This embodiment can include multiple guide members desirably connected to a base by respective dampers. Such a configuration absorbs reaction forces in the X and Y directions resulting from slider movement.

Further regarding this embodiment, each linear motor can comprise a respective stator each including permanent magnets and having a C-shaped transverse profile. In such a configuration including multiple stators, the stators can be situated such that respective openings in the C-shaped profiles face away from the axis perpendicular to the guide plane.

A stage apparatus according to yet another embodiment of the invention comprises a support structure comprising multiple Y-axis guide members extending in the Y direction. A respective Y-axis slider is associated with each Y-axis guide member. Each Y-axis slider comprises at least one gas bearing and is situated relative to the respective Y-axis guide member and configured to slide on the at least one gas bearing relative to the respective Y-axis guide member, as guided by the respective Y-axis guide member, but without contacting the respective Y-axis guide member. An X-axis guide member is attached to the Y-axis sliders and extends in the X direction relative to the Y-axis guide members. The stage apparatus includes an X-axis slider comprising at least one non-contacting gas bearing. The X-axis slider is situated relative to the X-axis guide member and is configured to slide on the at least one gas bearing relative to the X-axis guide member, as guided by the X-axis guide member, but without contacting the X-axis guide member. The stage is mounted to the X-axis slider. The apparatus includes a respective drive mechanism associated with each of the Y-axis sliders and with the X-axis slider. Each drive mechanism comprises a respective linear motor and a respective gas cylinder. Each gas cylinder is connected to the respective at least one gas bearing so as to augment a driving force applied to the respective slider by the respective linear motor during acceleration and deceleration of the respective slider.

This embodiment can further comprise a respective guard ring associated with each gas bearing. The guard rings are configured to exhaust air from the respective gas bearing and from the respective gas cylinder.

With respect to each drive mechanism, the respective gas cylinder can comprise a first gas subchamber and a second gas subchamber. The first and second gas subchambers are situated in opposition to each other so as to impart motion to the respective slider in both longitudinal directions relative to the respective guide member. The first and second gas subchambers can be located in a central region of the respective slider, and desirably are separated from each other by a division plate. The first and second gas subchambers desirably are flanked by the respective linear motor. With respect to each drive mechanism, the respective linear motor can comprise a stator including permanent magnets and having a C-shaped transverse profile. The stators can be situated such that respective openings in the C-shaped profiles face away from the axis.

A stage apparatus according to yet another embodiment is used for moving and positioning a stage within a guide plane defined by first and second orthogonal dimensional axes, relative to a third axis perpendicular to the guide plane. This embodiment comprises a support structure, two first-axis sliders, a second-axis guide member, a second-axis slider, and a stage. The support structure comprises two first-axis guide members extending in the first-axis direction. Each of the first-axis sliders comprises respective non-contacting gas bearings. The first-axis sliders are situated relative to respective first-axis guide members and are configured to slide on the gas bearings relative to and as guided by the respective first-axis guide members. The second-axis guide member is attached to and extends in the second-axis direction between the two first-axis sliders. The second-axis slider comprises non-contacting gas bearings, wherein the second-axis slider is situated relative to the second-axis guide member and is configured to slide on the gas bearings relative to and as guided by the second-axis guide member. The stage is mounted to the second-axis slider. A respective gas bearing is situated on each of the upper, lower, left, and right sliding surfaces of one of the first-axis sliders. A respective gas bearing is situated on each of the upper and lower sliding surfaces of the other first-axis sliders. This configuration allows the stage apparatus to be made compact and permits ease of manufacture. Also, the number of air pads is reduced, thereby reducing the quantity of gas released from them.

Desirably, two second-axis guide members are situated parallel to each other and attached to and extending in the second-axis direction between the two first-axis sliders. This configuration reduces play of the stage around its second axis.

Further desirably, each gas bearing is an air bearing comprising a respective air pad. Each air bearing desirably comprises a respective guard ring situated and configured to recover and exhaust air discharged into the respective air bearing. This configuration reduces air leakage into a surrounding vacuum environment.

With respect to each air bearing, the respective guide member desirably includes respective conduits for supplying, recovering, and exhausting air from the air bearings on the respective slider. Each air bearing is connected to the respective conduits. This configuration eliminates the need to provide external hoses for air supply, air recovery, and exhaust.

The stage apparatus can further comprise an arm member attached to the stage. The arm member includes end portions extending from the stage in a plane parallel to the guide plane. At least one respective set of linear-motor or planar-motor movers desirably is situated on each end portion. The sets of movers are configured to interact with and move relative to respective stators of respective linear motors or planar motors, respectively, to move the stage in at least one of the first and second axis directions. These symmetrical arrangements achieve very smooth stage movement. Also, by situating the actuators at respective end portions of the arm, the actuators are distant from the stage. As a result, magnetic-field fluctuations accompanying actuator movement are prevented from reaching the stage. These motors can be based on electromagnetics, electrostatics, electrostriction, ultrasonic, or magnetostriction.

Each end portion of the arm member can comprise two respective sets of linear-motor movers. Each set of linear-motor movers is configured to interact with and move relative to a respective stator. The two respective sets of linear-motor movers associated with each end portion are disposed in a symmetrically stacked arrangement in a direction parallel to the third axis. Of the two sets of linear-motor movers on one end portion, one set drives the stage in the first-axis direction, and the other set drives the stage in the second-axis direction. Similarly, of the two sets of linear-motor movers on the other end portion, one set drives the stage in the first-axis direction, and the other set drives the stage in the second-axis direction. In this configuration, the intersection of the drive forces can be located substantially at the centroid of the moving members of the stage. As a result, drive force is applied to the centroid, allowing stage position to be controlled with high accuracy at high velocity.

The respective drive forces imparted by the linear motors associated with the end portions of the arm member desirably are centered on the centroid of the stage and the second-axis slider.

Each end portion of the arm member can have a respective set of linear-motor movers configured to move the second-axis slider, with the stage, along the second-axis guide member. In this configuration, each first-axis slider has associated therewith a respective first-axis linear motor configured to move the respective first-axis slider along the respective first-axis guide member.

The stage can be provided with a freedom to undergo an amount of θ-direction rotation about the third axis. In this configuration the sets of respective linear-motor movers are configured to apply a motive force to the arm member sufficient to apply a θ-direction rotation to the stage. This achieves an adequate amount of θ-direction motion without having to provide a separate mechanism for it.

Each gas bearing can be configured to provide the stage with a freedom to undergo an amount of θ-direction rotation about the third axis. In this configuration, the sets of respective linear-motor movers situated on the end portions of the arm member are configured to apply a motive force to the arm member sufficient to apply a θ-direction rotation to the stage.

In this embodiment, each linear-motor mover can be a respective armature coil exhibiting substantially no variation in magnetic field during motion of the coil relative to the respective stator. Such a configuration reduces magnetic-field fluctuations, thereby reducing adverse effects on a charged particle beam whenever the stage apparatus is used in a charged-particle-beam microlithography apparatus.

The arm member desirably defines an internal passage configured to route a coolant fluid to and from the respective sets of linear-motor movers. This configuration improves stage controllability without requiring external connecting hoses to supply coolant.

The arm member can include multiple anti-vibration actuators to reduce arm vibration. The anti-vibration actuators can be respective piezoelectric elements or magnetostrictive elements.

According to another aspect of the invention, microlithography systems are provided that comprise any of the various embodiments of stage apparatus according to the invention.

The foregoing and additional features and advantages of the invention will be more readily apparent from the following detailed description, which proceeds with reference to the accompanying drawings.

BRIEF DESCRIPTION OF THE DRAWINGS

FIGS. 22(A)–22(C) are respective plots showing the results of controlling the stage apparatus of the fifth representative embodiment using the control system of FIG. 21, wherein FIG. 22(A) shows plots of stage velocity and stage acceleration versus time; FIG. 22(B) shows plots of the driving force of the gas cylinder and the linear motor versus time; and FIG. 22(C) is a plot of the gain tables of the gas cylinder and the linear motor.

DETAILED DESCRIPTION

Figure 1:
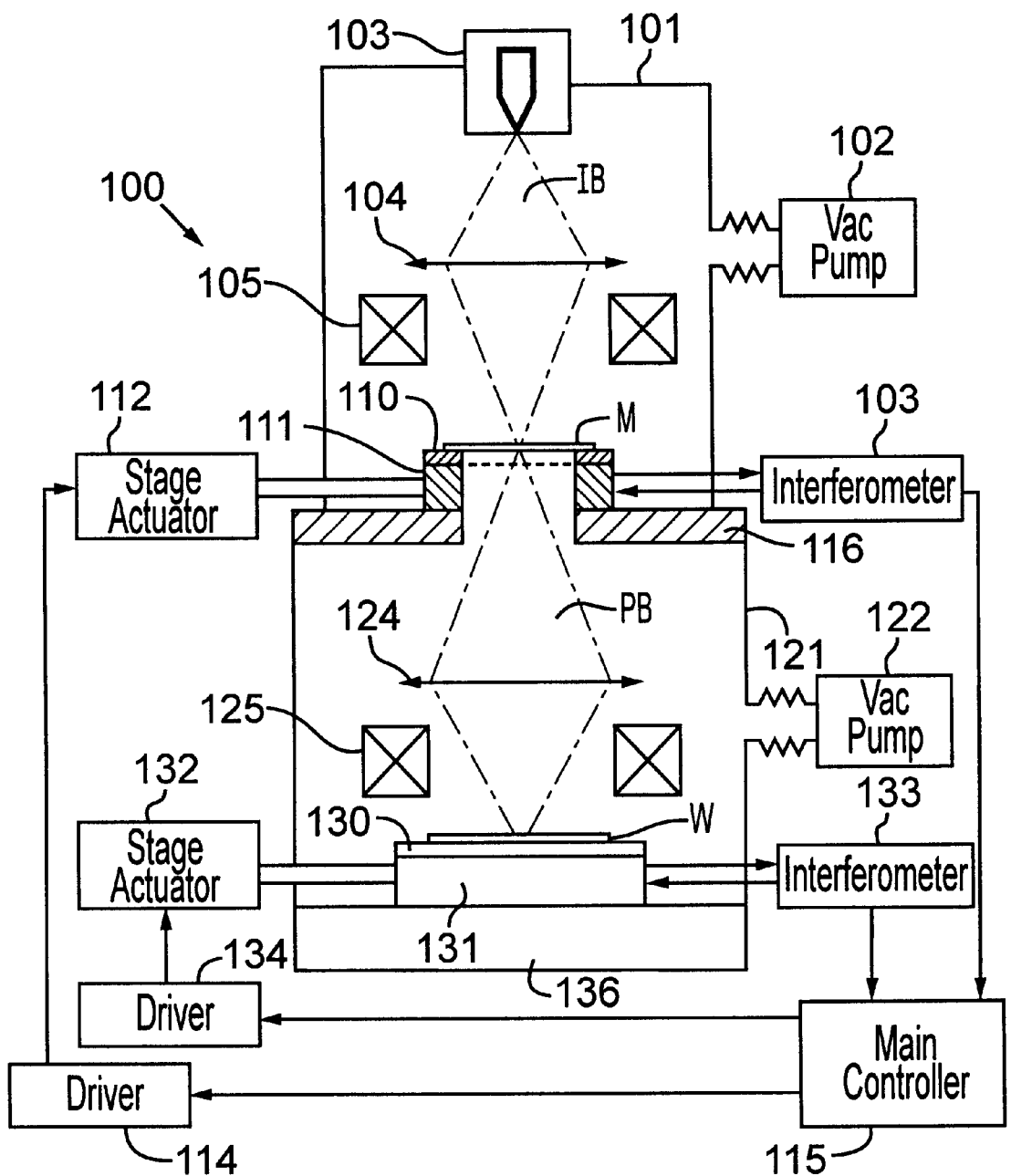
FIG. 1 is an elevational schematic diagram of a charged-particle-beam (e.g., electron-beam) microlithography system, as described in the first representative embodiment, including a stage apparatus according to the invention.

This invention is described below in the context of representative embodiments, which are not intended to be limiting in any way.
First Representative Embodiment This embodiment is directed to a charged-particle-beam ("CPB"; e.g., electron beam) microlithography system that can comprise any of various embodiments of a stage apparatus according to the invention. A schematic diagram of the system 100 is shown in FIG. 1. The system 100 comprises an illumination-lens column 101 defining an interior space that is evacuated to a desired vacuum level by a vacuum pump 102.

At the far upstream end of the illumination-lens column 101 is an electron gun 103 that emits an electron beam propagating in a downstream direction (downward in the figure) from the electron gun 103. The electron beam ("illumination beam" IB) emitted from the electron gun 103 passes through a condenser lens 104 and a deflector system 105 to a reticle (or "mask") M. The condenser lens 104 and deflector system 105 comprise an "illumination-optical system" of the apparatus. The condenser lens 104 condenses the illumination beam IB. Any required scanning of the illumination beam IB (in a direction lateral to the propagation direction of the beam) is performed by the deflector system 105. For example, the illumination beam IB can be deflected laterally to facilitate illumination of selected small pattern regions ("subfields") on the reticle M within the visual field of the illumination-optical system.

The reticle M is secured by electrostatic attraction or other suitable method to a reticle chuck 110 mounted on an upstream-facing surface of a reticle-stage apparatus 111. The reticle-stage apparatus 111 is mounted on a base 116 at the downstream end of the illumination-lens column 101. The reticle-stage apparatus 111 is connected to and actuated by a reticle-stage actuator 112. The reticle-stage actuator 112 is connected to a main controller 115 via a reticle-stage driver 114. The positional coordinates of the reticle-stage apparatus 111 in the X and Y directions are determined by respective laser interferometers 113 (only one is shown). Data from the laser interferometers 113 are routed to the main controller 115 to which the laser interferometers 113 are connected. Based on such data as processed by the main controller 115, the main controller produces and routes appropriate commands to the reticle-stage driver 114 to actuate the reticle-stage actuator 112. Thus, the reticle-stage apparatus 111 is feedback-controlled accurately in real time.

Situated downstream of the reticle R and base 116 is a "wafer chamber" 121. The wafer chamber 121 defines an interior space evacuated to a suitable vacuum level by a vacuum pump 122. Arranged in the wafer chamber 121 are a condenser lens 124, a deflector system 125, and a wafer-stage apparatus 131. The wafer-stage apparatus 131 is mounted to a base 136. A wafer chuck 130 is mounted on the wafer-stage apparatus 131. A wafer W is mounted on the wafer chuck 130 by electrostatic attraction.

An electron beam transmitted through the reticle M is condensed by the condenser lens 124 and deflected by the deflecting system 125. The resulting image of the illuminated region of the reticle M is formed and resolved at a prescribed location on the wafer W.

The wafer-stage apparatus 131 is connected to and actuated by a wafer-stage actuator 132. The wafer-stage actuator 132 is connected to the main controller 115 via a wafer-stage driver 134. The positional coordinates of the wafer-stage apparatus 131 in the X and Y directions are determined by respective laser interferometers 133 (only one is shown). Data from the laser interferometers 133 are routed to the main controller 115 to which the laser interferometers 133 are connected. Based on such data as processed by the main controller 115, the main controller produces and routes appropriate commands to the wafer-stage driver 134 to actuate the wafer-stage actuator 132. Thus, the wafer-stage apparatus 131 is feedback-controlled accurately in real time.

Any of the stage assemblies according to this invention, such as any of those described below, can be used as a reticle-stage apparatus 111 and/or wafer-stage apparatus 131 in the system of FIG. 1.

Second Representative Embodiment

Figure 2:
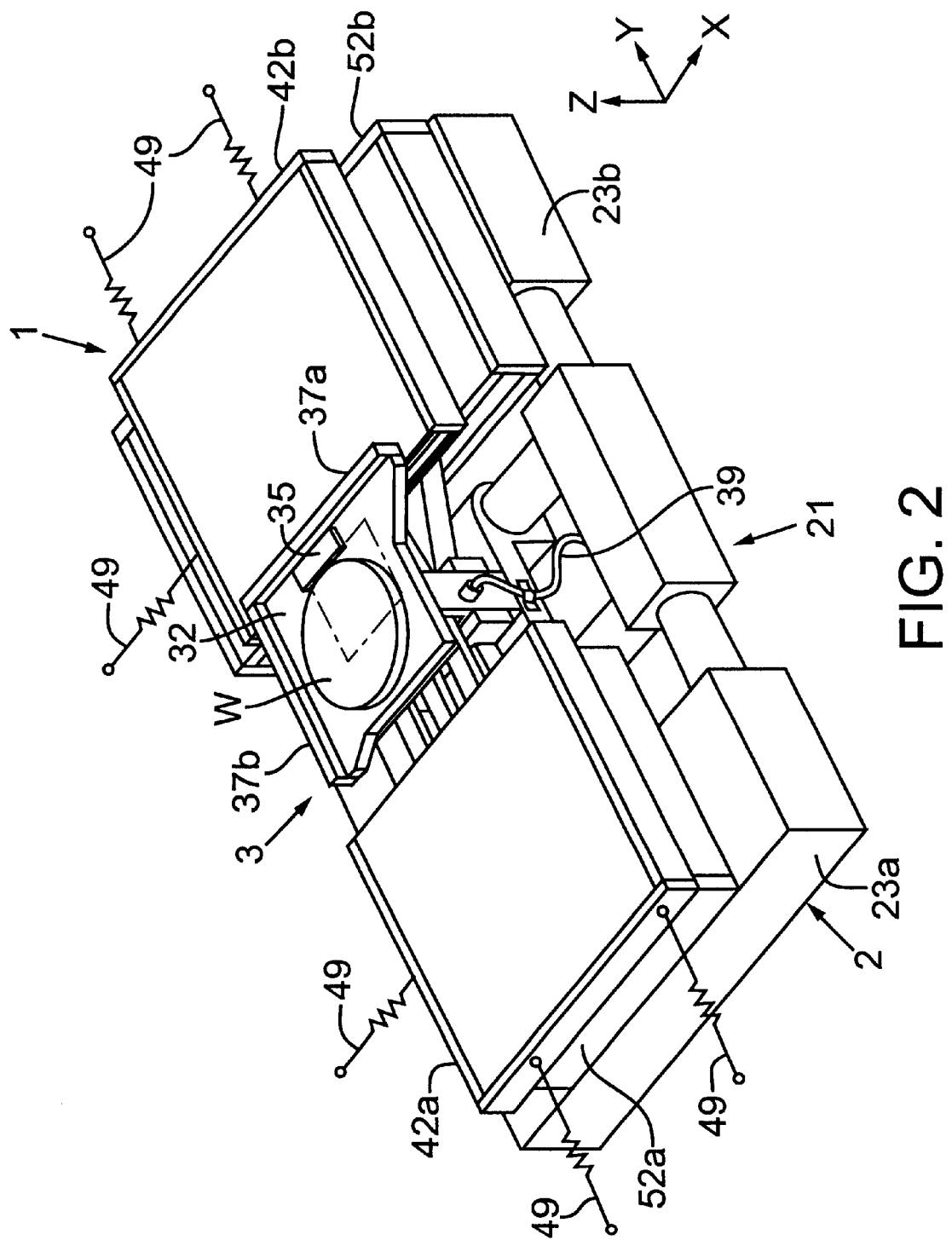
FIG. 2 is an oblique view showing general features of a stage assembly according to the second representative embodiment.
Figure 4:
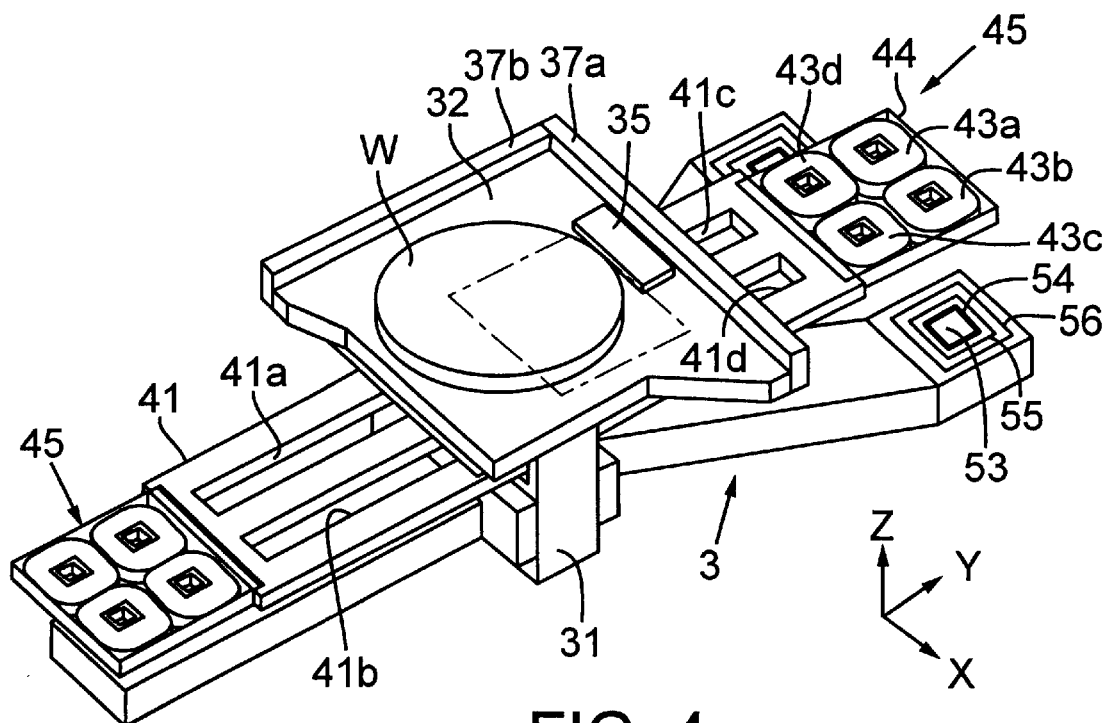
FIG. 4 is an oblique view of the "main stage" portion of the stage assembly of the second representative embodiment including the arm and armatures.
Figure 5:
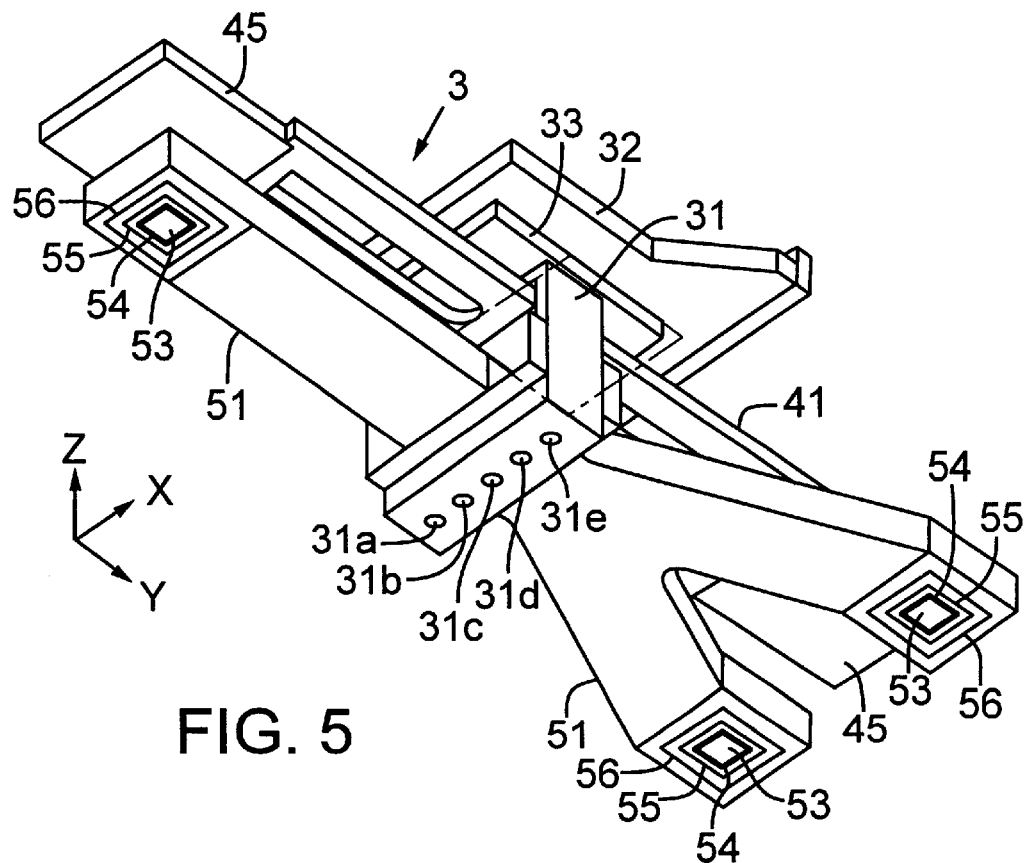
FIG. 5 is an oblique view of the underside of the "main stage" portion shown in FIG. 4.

A stage assembly 1 according to this embodiment is shown generally in FIG. 2. The stage assembly 1 can be used, for example, as the wafer-stage apparatus 131 in the first representative embodiment (FIG. 1). The stage assembly 1 comprises a sub-stage 2 and a main stage 3. As shown in FIGS. 4 and 5, the main stage 3 comprises a moving stage 31 on which a wafer table 32 is mounted, an arm 41 extending in symmetrical directions relative to the moving stage 31, and a Y-shaped guide bar 51. The guide bar 51 has three ends each provided with a respective air pad 53 on the upper and lower surfaces thereof (see especially FIG. 5). The air pads 53 are movable (with the guide bar 51) within an X–Y "guide plane." The arm 41 has two ends each provided with multiple respective two-dimensional linear-motor movers ("armatures") 45 that are movable in the X–Y guide plane and also are movable (in the θ direction) about an axis perpendicular to the guide plane.

The substage 2 mediates the inflow and outflow of fluids between the main stage 3 and the exterior of the wafer chamber while being moved and positioned up against the main stage 3.

At each end of the sub-stage 2 is a respective fixed unit 23a, 23b, configured as a rectangular parallelepiped, that is secured to the base (e.g., item 136 in FIG. 1). Although not detailed in the figures, the fixed units 23a, 23b include respective conduits that supply air and remove exhausted gases from air pads. Air and exhaust-gas conduits also are connected to respective ports on the outside surfaces of the fixed units 23a, 23b (explained in detail below). Guide plates 52a, 52b that guide motion of the guide bar 51 are mounted on upper surfaces of the fixed units 23a, 23b. Respective linear-motor stators 42a, 42b are situated on upstream-facing surfaces of the respective guide plates 52a, 52b.

Figure 3A:
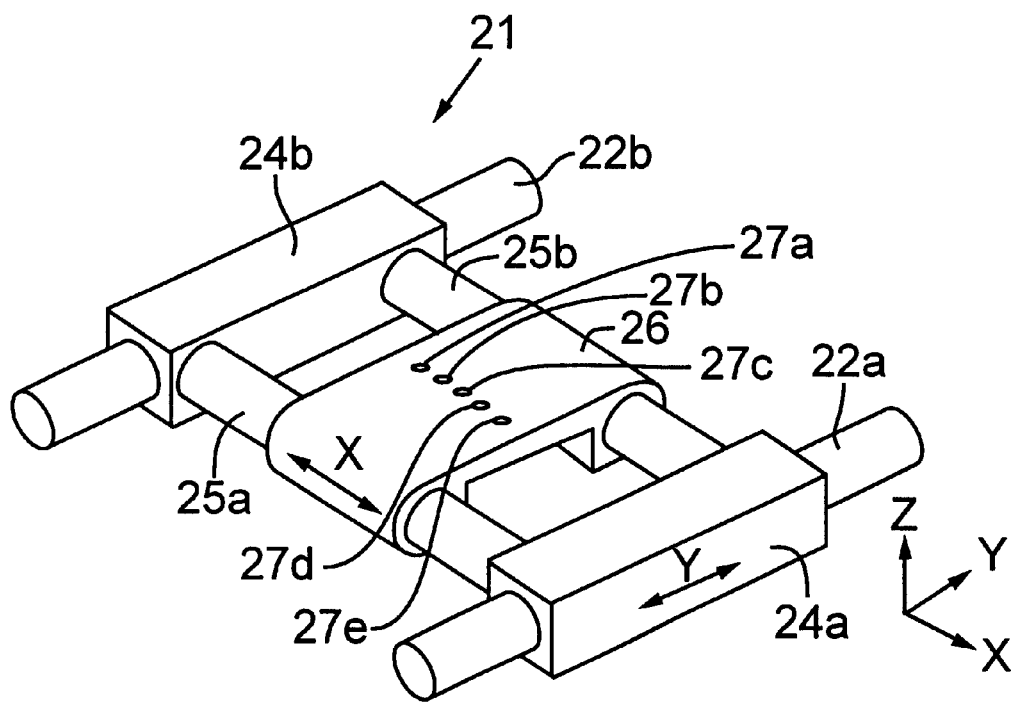
FIG. 3(A) is an oblique view of the moving subassembly of the stage assembly of the second representative embodiment.

A moving subassembly 21 is situated between the fixed units 23a, 23b. As shown in FIG. 3(A), the moving subassembly 21 comprises a pair of rigid parallel shafts 22a, 22b extending in the Y direction and a pair of rigid parallel shafts 25a, 25b extending in the X direction. The shafts 22a, 22b guide movement of and include internal conduits (not shown) that supply air to respective air cylinders 24a, 24b. Similarly, the shafts 25a, 25b guide movement of and include internal conduits (not shown) that supply air to a linked set of air cylinders 26. In FIG. 2 the respective left-hand ends of the shafts 22a, 22b are connected to the left-hand fixed unit 23a, and the respective right-hand ends of the shafts 22a, 22b are connected to the right-hand fixed unit 23b. Similarly, the shafts 25a, 25b extend parallel to each other between the air cylinders 24a, 24b.

Each shaft 22a, 22b has a circular transverse section and, as noted above, includes respective internal conduits that supply and evacuate air used for driving motion of the air cylinders 24a, 24b. The shafts 22a, 22b also supply air and helium (He) to the main stage 3, and perform vacuum exhaust as required. Similarly, each shaft 25a, 25b has a circular transverse section and, as noted above, includes respective internal conduits that supply and evacuate air as used for driving motion of the linked air cylinders 26.

The air cylinders 24a, 24b are engaged with the respective shafts 22a, 22b such that air supplied to the air cylinders 24a, 24b via the respective conduits in the shafts 22a, 22b causes the air cylinders 24a, 24b to move together in the Y-direction relative to the shafts 22a, 22b. The air cylinders 24a, 24b are configured as rectangular parallelepipeds defining respective cylindrical through-holes through which the respective shafts 22a, 22b extend in the Y direction. Although not detailed in the figures, respective conduits for supplying air and providing exhaust also are defined inside the air cylinders 24a, 24b. (Configurational details of these conduits and their respective functions are disclosed in Japan Kôkai Patent Document No. Hei 7-335533.) So as to be useful in a vacuum environment, the air cylinders 24a, 24b include air-leakage countermeasures such as seals and exhaust means.

As an alternative to pneumatic actuation as described above, the stage assembly according to this embodiment can employ electrostatic actuation or ultrasonic actuation of the components 24a and 24b.

The linked air cylinders 26 are engaged with the respective shafts 25a, 25b, such that air supplied to the linked air cylinders 26 via the respective conduits in the shafts 25a, 25b causes the linked air cylinders 26 to move as a unit in the X direction relative to the shafts 25a, 25b. The linked air cylinders 26 are configured to define respective cylindrical through-holes through which the respective shafts 25a, 25b extend. Although not detailed in the figures, respective conduits for supplying air and providing exhaust also are defined inside the linked air cylinder 26. (Configurational details of these conduits and their respective functions are disclosed in JP Hei 7-335533, cited above.) So as to be useful in a vacuum environment, the linked air cylinders 26 include air-leakage countermeasures such as seals and exhaust means. For example, air supplied from the shaft 22b is supplied to the linked air cylinders 26 via the shafts 25a, 25b, thereby causing the linked air cylinder 26 to be driven as a unit in the X direction. Air-leakage countermeasures such as seals and exhaust means additionally are employed in the linked air cylinder 26. See the JP Hei 7-335533 reference cited above.

The upstream-facing surface (serving as a sub-stage) of the linked air cylinders 26 is planar and defines an air-supply port 27a, a He-supply and exhaust port 27b, a low-vacuum exhaust port 27c, a high-vacuum exhaust port 27d, and an atmospheric-venting port 27e. These ports desirably are aligned and arrayed in the X direction at the center of the planar surface. Although not detailed in the figures, respective low-vacuum guard rings and high-vacuum guard rings are defined around each port to prevent leakage of air from the respective ports to a surrounding high-vacuum environment (e.g., wafer chamber). As explained below, the various ports 27a–27e are located opposite corresponding ports on the main stage 3. Hence, by means of the linked air cylinders 26 moving along with movements of the moving stage 31, it is possible to perform supply and exhaust of air and He gas in the main stage 3 while performing vacuum exhaust of the surrounding environment (e.g., wafer chamber).

In this embodiment, it is desirable that air bearings be provided on the upstream-facing surface of the linked air cylinders 26.

Figure 3B:
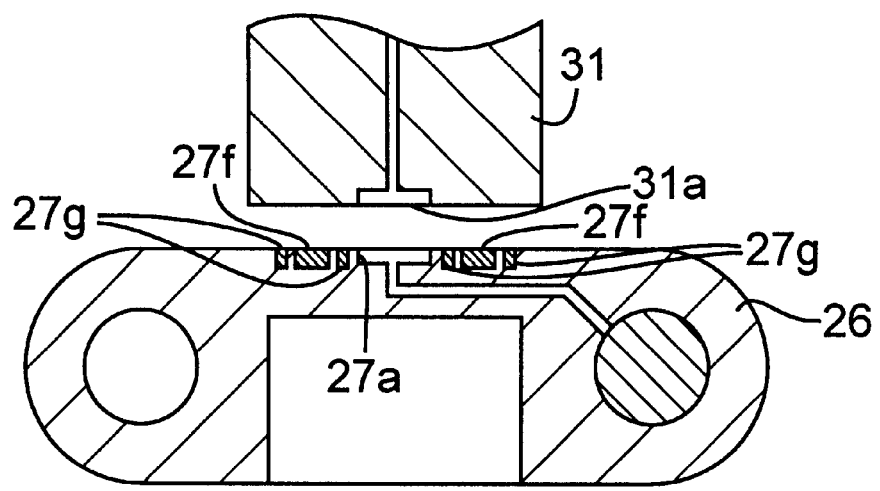
FIG. 3(B) is an elevational section through the linked air cylinders of the stage apparatus of the second representative embodiment, showing details of the air bearings.
Figure 32:
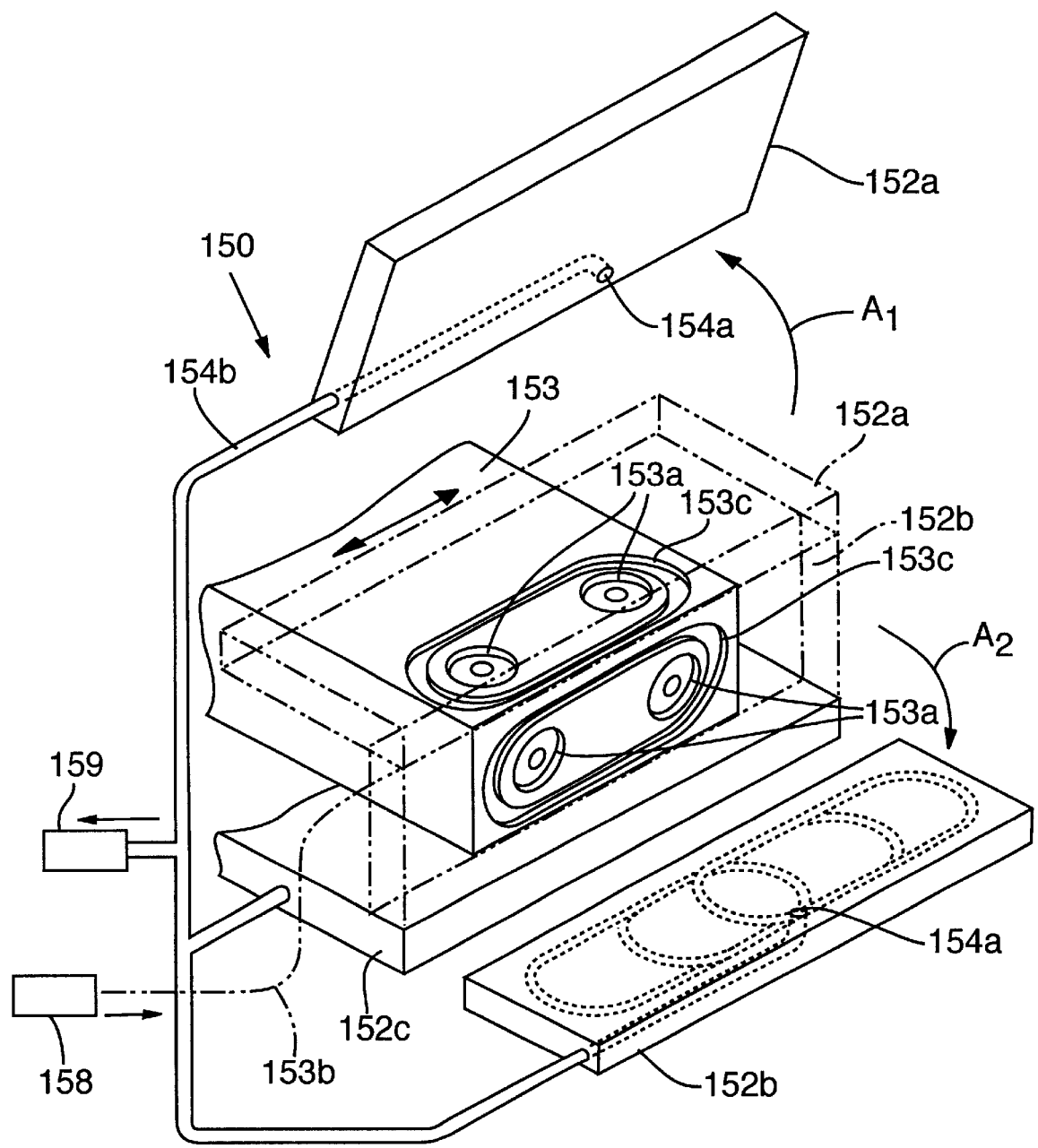
FIG. 32 is an "unfolded" view of an air bearing as used in the conventional stage apparatus shown in FIG. 31.
Figure 33:
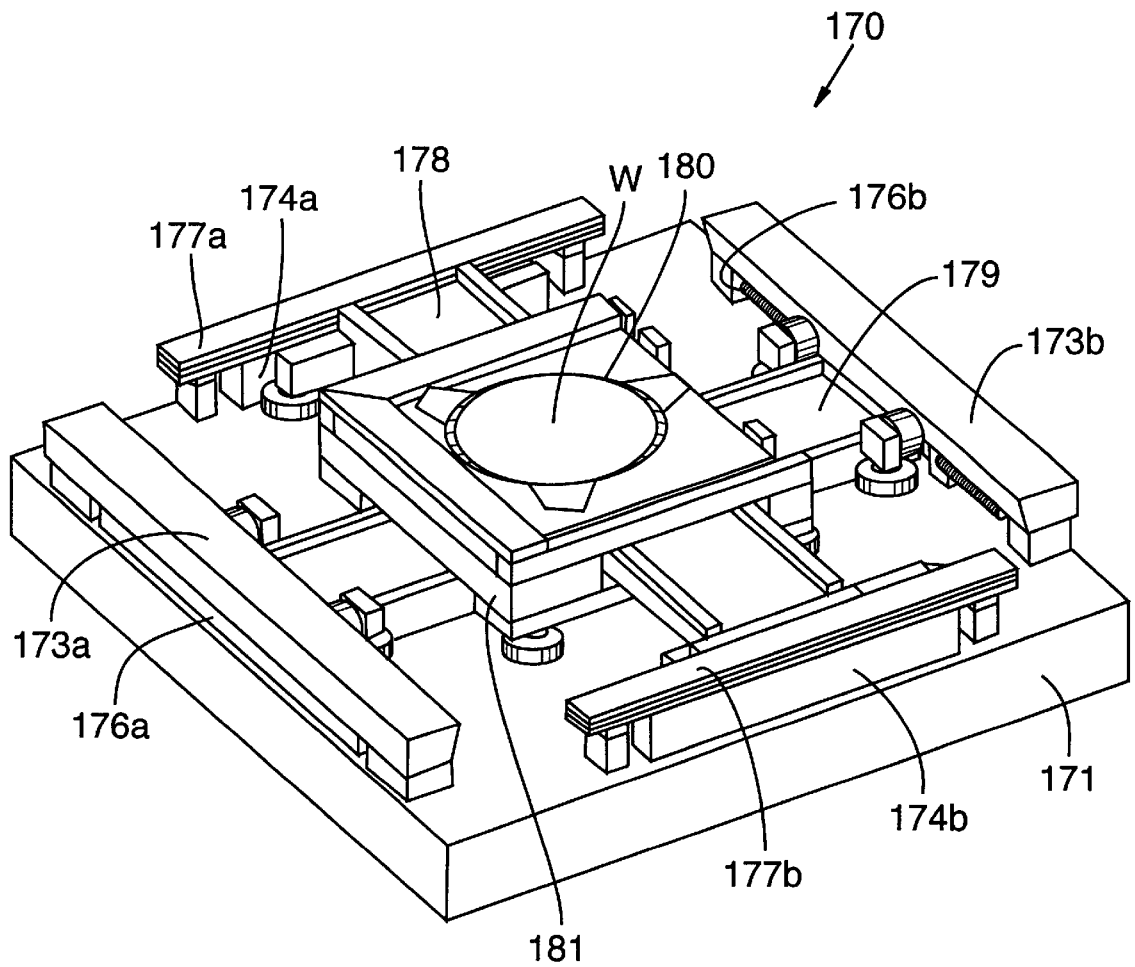
FIG. 33 is an oblique view of a conventional stage apparatus as disclosed in Japan Kôkai Patent Document No. Hei 9-34135.
Figure 33:
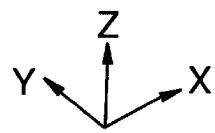
Figure 34:
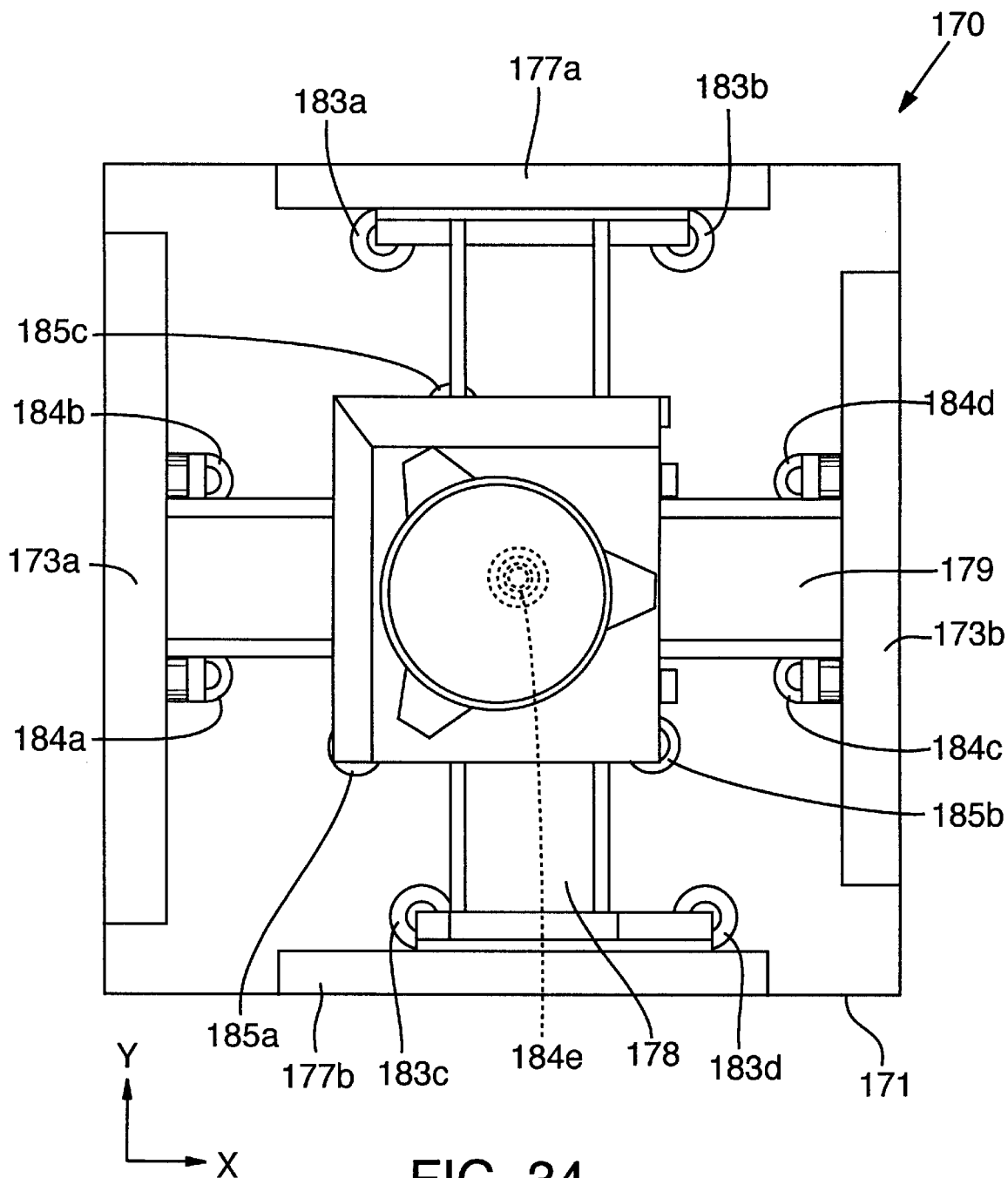
FIG. 34 is a plan view of the stage apparatus of FIG. 33.

FIG. 3(B) depicts air bearings formed on the upstream-facing surface of the linked air cylinders 26. A respective air pad 27f consisting of a porous material (such as shown in FIG. 32) is arranged in the vicinity of each port 27a–27e. Although air pads 27f are shown in two locations in FIG. 3(B), it is possible, for example, to form the air pads in each of the four corners of the upstream-facing surface of the linked air cylinders 26. Similar to the configuration shown in FIG. 32, a respective guard ring 27g (for exhausting air discharged from the respective air pad 27f) is situated at the perimeter of each respective air pad 27f. The guard rings 27g associated with the atmospheric-venting ports 27e, the guard rings 27g associated with the low-vacuum exhaust ports 27c, and the guard rings 27g associated with the high-vacuum exhaust ports 27d desirably are arranged sequentially. A respective conduit in a respective shaft 22a, 22b is connected to each air pad and guard ring.

The moving stage 31 is located above the linked air cylinders 26. Air supplied from conduits in the shafts 22a, 22b is discharged from the holes of the air pads 27f and thus applies pressure to the lower surface of the moving stage 31. Under such a pressure discharge, a resulting gap (approximately 5 μm) between the linked air cylinders 26 and the moving stage 31 is maintained. Gas discharged from the air pads 27f associated with the atmospheric-venting ports 27e is released into the atmosphere by the respective guard rings 27g. Any leaked gas is exhausted by the guard rings 27g associated with the low-vacuum exhaust ports 27c and by the guard rings 27g associated with the high-vacuum exhaust ports 27d, thereby preventing the gas from leaking into the wafer chamber maintained at a high vacuum.

By discharging air from the holes of the air pads 27f in this way, it is possible to maintain a fixed gap between the linked air cylinders 26 and the main stage 3. Also, the linked air cylinders 26 and moving stage 31 can be moved in a stable manner while maintaining a prescribed gap therebetween. In addition, because air pressure is applied to the under-surface of the main stage 3, warping of the main stage 3 is reduced.

The main stage 3 is shown in FIGS. 2, 4, and 5, depicting the moving stage 31 at the center of the main stage 3. The Y-shaped guide bar 51 is mounted below the moving stage 31. The arm 41 extending symmetrically relative to the moving stage 31 is engaged and secured above the guide bar 51.

The moving stage 31 desirably is configured as a rectangular parallelepiped as shown in FIG. 4. The moving stage 31 defines respective rectangular through-holes through which the guide bar 51 and arm 41 extend in the Y direction. If air pads are provided on the linked air cylinders 26, then the pressure of air discharged from the air pads is received at the lower surface of the moving stage 31. Consequently, the moving stage 31 has sufficient width to accommodate the air pads.

The under-surface of the moving stage 31 defines an air-supply port 31a, a He-supply and He-exhaust port 31b, a low-vacuum exhaust port 31c, a high-vacuum exhaust port 31d, and an atmospheric-venting port 31e, all desirably aligned with each other in the X direction. The respective ports 31a–31e are positioned so as to correspond to the air-supply port 27a, the He-supply and He-exhaust port 27b, the low-vacuum exhaust port 27c, the high-vacuum exhaust port 27d, and the atmospheric-venting port 27e located on the upper surface of the linked air cylinders 26. Thus, connections of air and He gas, as well as connections for vacuum exhaust and venting are made to the moving stage 31 from the linked air cylinders 26. Although not detailed in the figures, respective conduits extend inside the wafer stage 31 from the ports 31a–31e to the guide bar 51, arm 41, and wafer table 32.

As shown in FIG. 2, one end of a flexible conduit 39 is connected to a side of the moving stage 31. The other end of the conduit 39 is connected to the side of the linked air cylinder 26, with sufficient length of the conduit 39 provided so as not to hinder movement of the moving stage 31 relative to the linked air cylinders 26. The conduit 39 is configured to perform various functions such as supplying and circulating a coolant to an electrostatic chuck (not detailed) mounted to the wafer table 32 and to the coils of the linear motor, and supplying electric power to the linear motor and the electrostatic chuck.

The wafer table 32 is mounted to the upper portion of the moving stage 31 via a stage plate 33 (FIG. 5). An electrostatic wafer chuck (not shown but well understood in the art) is mounted to the upper surface of the wafer table 32 so as to secure a wafer W to the wafer table 32. A channel defined in the surface of the wafer chuck forms a respective conduit by mounting a wafer W to the wafer chuck; through this conduit a heat-transfer gas such as He gas is circulated. The He gas is supplied to the wafer chuck by a He gas supply and exhausted from the wafer chuck via the He-supply and He-exhaust port 31b on the underside of the moving stage 31.

A mark plate 35, defining an alignment mark used for measuring the position of the wafer W, is provided adjacent the wafer W on the wafer table 32 (FIG. 4). Respective moving mirrors 37a, 37b are mounted along two sides of the wafer table 32. The reflecting surfaces of the moving mirrors 37a, 37b are polished with high precision, and are used for reflecting light from respective laser interferometers (see items 133 in FIG. 1, for example).

The guide bar 51 desirably is Y-shaped, and is shown with the branches of the Y oriented to the right. The guide bar 51 extends through a rectangular through-hole in the moving stage 31 such that the moving stage 31 is situated at about mid-length of the guide bar 51. As shown in FIGS. 4 and 5, two respective air pads 53 are located at each end of the guide bar 51, wherein at each end one air pad 53 is located on the upper surface and another air pad is located on the lower surface. Each air pad 53 comprises a porous material. Each air pad 53 is surrounded by a respective atmospheric-venting guard ring 54, a respective low-vacuum exhaust guard ring 55, and a respective high-vacuum guard ring 56. These air pads 53 and guard rings 54–56 are connected via respective conduits (not shown) to the air-supply port 31a, the low-vacuum exhaust port 31c, the high-vacuum exhaust port 31d, and the atmospheric-venting port 31e, respectively, of the lower portion of the moving stage 31.

The ends of the guide bar 51 (on which respective air pads 53 and guard rings are formed) are inserted into respective guide plates 52a, 52b (FIG. 2). The guide plates 52a, 52b are secured to the upper surfaces of the respective fixed units 23a, 23b. The "height" in the Z direction of the guide plates 52a, 52b is greater than the thickness (in the Z direction) of the guide bar 51.

During use, air is discharged from each of the six air pads 53. The resulting pressure of discharged air is applied to the upper and lower surfaces, respectively, of the respective guide plates 52a, 52b. Because air pads 53 are present on both the upper and lower surfaces of each end of the guide bar 51, a prescribed gap is maintained between the guide bar and the inside surfaces of the through holes extending (in the X direction) through the guide plates 52a, 52b. This gap allows free (low-friction) movement in the X direction of the guide bar 51 relative to the guide plates 52a, 52b. Also, because both the top and bottom surfaces of the guide bar 51 have a total of three air pads 53, the guide bar 51 maintains parallelism within the movement range.

Most of the air discharged from each air pad 53 is collected by the respective atmospheric-venting guard ring 54. In the vicinity of each air pad 53, any gas that otherwise would leak is exhausted by the respective low-vacuum guard ring 55. The gas is further exhausted by the high-vacuum guard ring 56. Thus, substantially no gas is allowed to leak from the air pads 53 into the wafer chamber normally maintained at a high vacuum.

Figure 6:
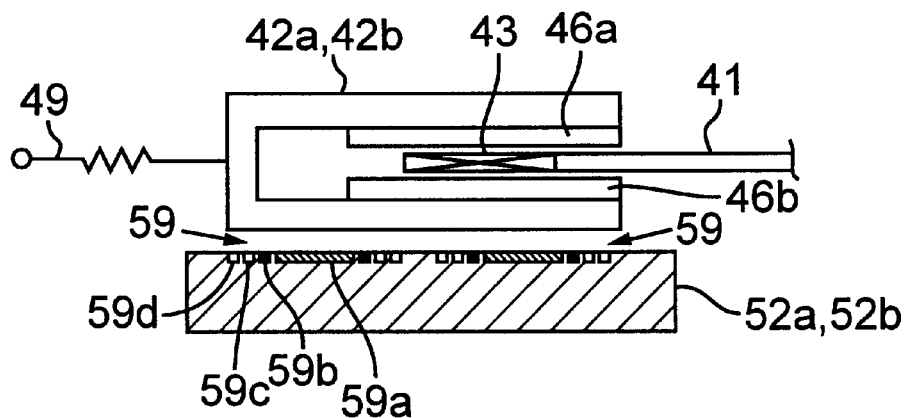
FIG. 6 an elevational section of a portion of the stage assembly of the second representative embodiment, showing details of the stator and armature of a linear motor, and of the plane bearings.

As shown in FIG. 6, respective non-contacting plane bearings 59 are formed on the upper surfaces of the guide plates 52a, 52b. Each plane bearing 59 is formed by respective air pads 59a comprising a porous material. Each air pad 59a is surrounded by a respective atmospheric-venting guard ring 59b, a respective low-vacuum guard ring 59c, and a respective high-vacuum guard ring 59d. These features have respective functions as described above for corresponding features located elsewhere. By providing at least three air pads 59a in association with each guide plate 52a, 52b, the resulting linear-motor stators 42a, 42b can maintain desired parallelism. Thus, the linear-motor stators 42a, 42b are arranged on the upper surfaces of the guide plates 52a, 52b by means of the non-contacting plane bearings 59, thereby eliminating any adverse effects of vibration, from components such as the guide plates 52a, 52b, on the wafer table 32.

The arm 41 desirably is configured as a rectangular plate having a prescribed thickness and defining four through-holes 41a, 41b, 41c, 41d extending lengthwise in the Y direction (FIG. 4). The arm 41 extends through a corresponding through-hole in the moving stage 31. The arm 41 also includes conduits for conducting a cooling medium used for removing heat from coils, as discussed below. The arm 41 also includes electrical wiring for driving the coils. The wiring and conduits of the arm 41 are connected to respective wiring and conduits in the flexible conduit 39 so as to bring in electrical power and coolant from an exterior source. As shown in FIGS. 4 and 5, square two-dimensional linear-motor movers (armatures) 45 are provided at each end of the arm 41.

Figure 7:
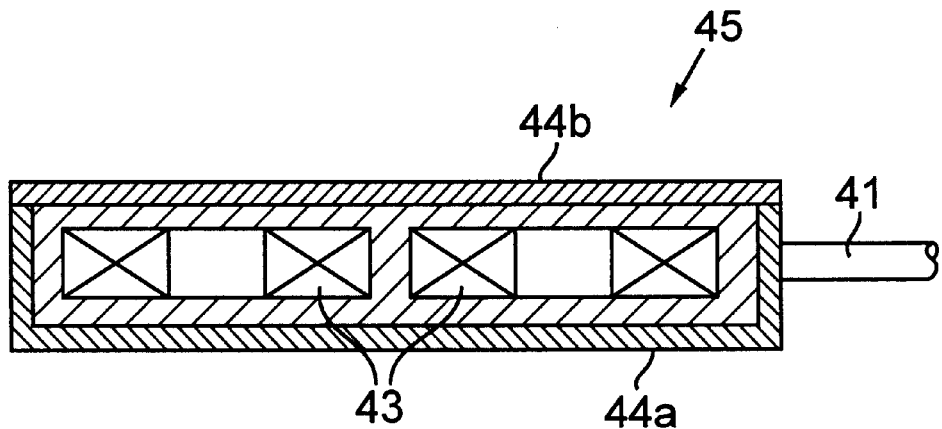
FIG. 7 is an elevational section of the armature of a two-dimensional linear motor of the stage assembly of the second representative embodiment.

An exemplary armature 45 is shown in FIG. 7. The armature 45 comprises a can-like enclosure 44a connected to the arm 41. Inside the enclosure 44a are arranged four flat coils 43a, 43b, 43c, 43d (see also FIG. 4) secured to the inside surface of the enclosure 44b using an adhesive or the like. The enclosure 44a is covered with a lid 44b mounted to the upper portion of the enclosure 44a. The enclosure 44a (and lid 44b if desired or indicated) includes conduits for passing a cooling medium used for cooling the coils 43a, 43b, 43c, 43d. The conduits are connected to similar conduits defined in the arm 41, and the conduits collectively circulate a coolant supplied from an external source. The enclosure 44a (and lid 44b if desired or indicated) also defines holes through which wiring is passed for energizing the coils 43a–43d. The arm 41, enclosure 44a, and lid 44b desirably are made of a non-magnetic material such as a ceramic, an engineering plastic, or austenitic stainless steel.

Figure 8:
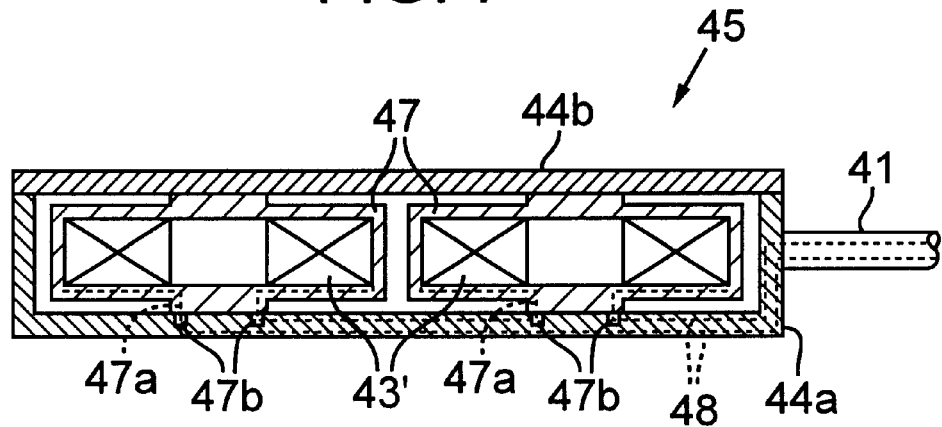
FIG. 8 is an elevational section of the armature of the two-dimensional linear motor of the stage assembly of the second representative embodiment, showing details of the potted coils.

The coils 43a–43d desirably are potted in resin, as described with reference to FIG. 8, depicting coils 43' mounted inside the enclosure 44a, 44b. A suitable potting resin 47 is molded at the perimeter of each coil 43'. The resin 47 is molded to a prescribed diameter at the perimeter of each coil 43', and the upper and lower portions of each coil 43' are molded to have a thickness approximately equal to the depth of the enclosure 44a. Electrical wiring 47a for driving the coils 43' extends from each of the coils 43' (downward in the figure) through the resin 47 to respective connection terminals 47b. The connection terminals 47b are engaged with and secured to a socket (not shown in the figure) provided on the enclosure 44a. Electrical wiring 48 extends from the socket to the arm 41. Thus, it is possible to secure each connection terminal 47b conveniently through engagement with the socket, thereby eliminating the inconvenience of having to use an adhesive for this purpose. In addition, this technique allows electrical wiring of multiple coils to be performed simultaneously.

As shown in FIG. 2, the end portions of the arm 41, on which the armatures 45 are formed, are inserted into the respective linear-motor stators 42a, 42b. Each stator 42a, 42b has a flat box shape with a respective opening oriented toward the moving stage 31. Also, the stators 42a, 42b are arranged on the upper surfaces of the respective guide plates 52a, 52b. As shown in FIG. 6, magnet arrays 46a, 46b are provided at the upper and lower surfaces, respectively, of the inside of each stator 42a, 42b.

Figure 9:
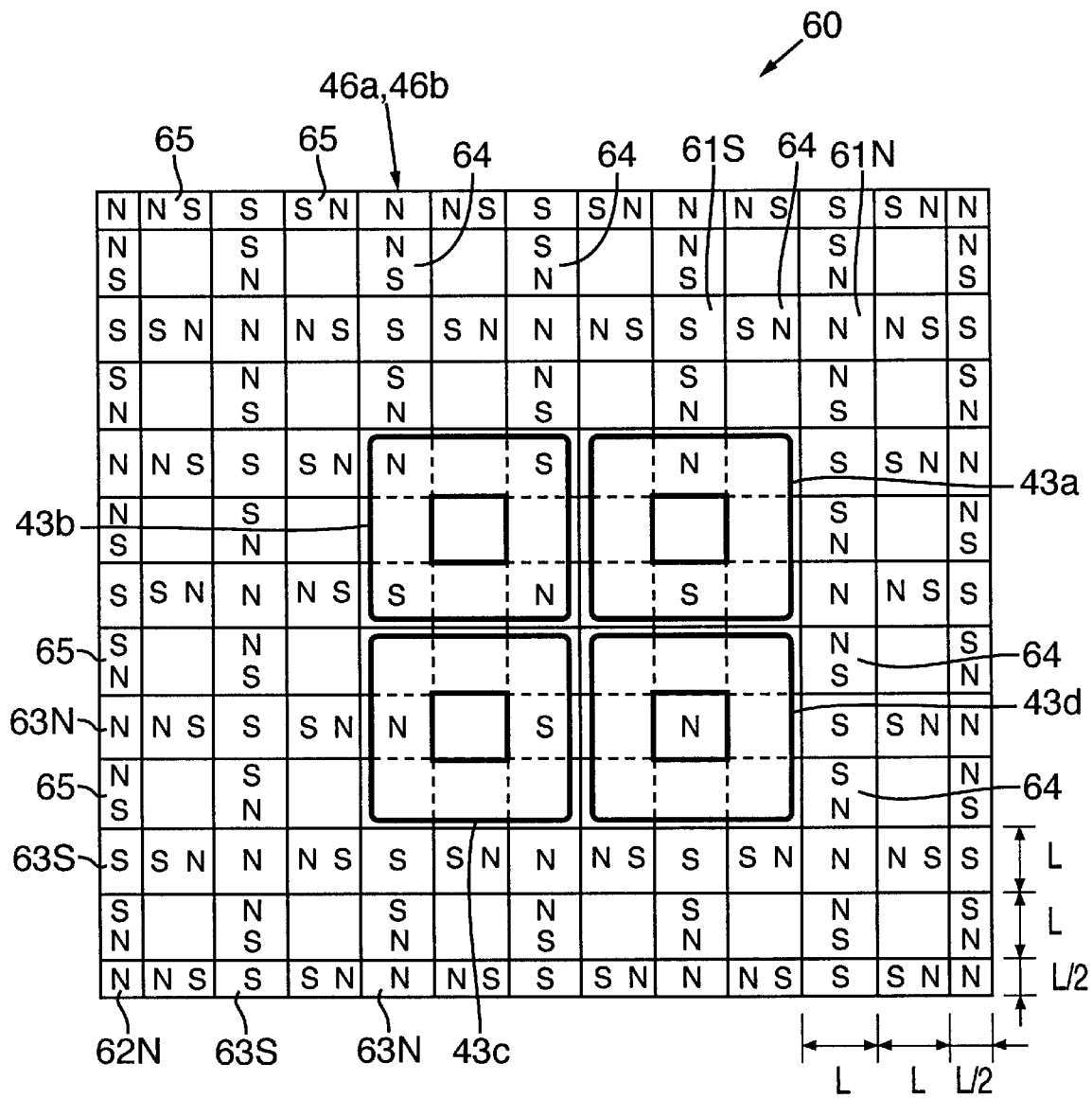
FIG. 9 is a plan view of the magnet array of a stator of the two-dimensional linear motor of the stage assembly of the second representative embodiment.

FIG. 9 depicts one of the magnet arrays (46a or 46b) of the two-dimensional linear motor 60. Square permanent magnets 61S and 61N (each side having a length L) are arranged alternatingly in an every-other-box manner in the center region of the depicted magnet array. The polarity of the exposed pole face of the permanent magnet 61S is an S pole, and the polarity of the exposed pole face of the permanent magnet 61N is an N pole. Arranged around the perimeter of the depicted magnetic-pole unit are rectangular permanent magnets 63S and 63N each having a minor side having a width of L/2. The polarity of the exposed pole face of the permanent magnet 63S is an S pole, and the polarity of the exposed pole face of the permanent magnet 63N is an N pole. At each corner of the depicted magnet array is a square N-pole permanent magnet 62N (each side having a width of L/2). The polarity of the exposed pole face of the permanent magnet 62N is an N pole. Note that the opposing face (not shown) of the depicted magnetic-pole unit has a similarly configured array of permanent magnets.

The depicted magnet array in FIG. 9 also includes other permanent magnets situated adjacent the magnets discussed above. Specifically included are square permanent magnets 64 (each side of which having a length L), wherein four magnets 64 are situated to the top, bottom, left and right, respectively, of each permanent magnet 61S and 61N. Also included are rectangular permanent magnets 65 (each minor side having a length L/2) situated between permanent magnets 63S and 63N around the perimeter. The permanent magnets 64 and 65 are arranged such that the polarities of the pole faces of adjoining permanent magnets 61S, 61N, 63S, 63N and 62N are the same. For example, between each pair of permanent magnets 61S and 61N is a permanent magnet 64 situated with its S pole oriented toward the permanent magnet 61S and its N pole facing toward the permanent magnet 61N.

By arranging the permanent magnets in the manner described above, the resulting magnetic circuits are closed at the upper and lower surfaces of each two-dimensional linear motor 60. Hence, any magnetic flux that otherwise would leak from the upper and lower surfaces of the two-dimensional linear motor 60 can be shielded magnetically. Also, the amount of leaked magnetic flux and the amount of magnetic-field fluctuation that otherwise would adversely affect peripheral components and apparatus can be reduced.

The flat coils 43a, 43b, 43c, 43d are aligned and arranged relative to the magnet arrays 46a, 46b (in FIG. 9, the enclosure 44a and lid 44b are not shown). In the depiction in FIG. 9, below the coil 43a, a permanent magnet 61N is situated at top center flanked by permanent magnets 64, and a permanent magnet 61S is at the bottom center flanked by permanent magnets 64. Below the coil 43b, a permanent magnet 64 is situated at top center flanked on the right by a permanent magnet 61S and on the left by a permanent magnet 61N. A permanent magnet 64 is situated at the bottom center flanked on the right by a permanent magnet 61N and on the left by a permanent magnet 61S. Below the coil 43c, a permanent magnet 61S is at the right center flanked by permanent magnets 64, and a permanent magnet 61N is at the left center flanked by permanent magnets 64. Below the coil 43d, a permanent magnet 64 is situated at the center of the top, bottom, left, and right, with a permanent magnet 61N situated at the center.

Whenever an electric current flows in the respective coils 43a, 43b, 43c, 43d of the armature 45 of the two-dimensional linear motor 60, the armature 45 tends to move relative to the respective magnet array 46a, 46b of the respective stator 42a, 42b. The armature 45 is moved through the action of Lorentz forces generated in response to energizing the coils. Specifically, in FIG. 9, whenever an electric current flows counterclockwise (as viewed from above the plane of the page) in the coil 43a, the armature 45 is urged by the resulting Lorentz force to move in the X direction upward in the figure. Whenever an electric current flows clockwise (as viewed from above the plane of the page) in the coil 43a, the armature 45 is urged by the resulting Lorentz force to move in the X direction downward in the figure. Whenever an electric current flows to the coil 43b, the forces generated by interaction of the energized coil 43b with the permanent magnets, wherein magnets having the same poles are arranged diagonally with each other, are equal but opposite to each other. As a result, the forces negate each other, yielding no net motion of the armature 45. Whenever an electric current flows counterclockwise (as viewed from above the plane of the page) in the coil 43c, the armature 45 is urged by the resulting Lorentz force to move to the left (in the Y direction). Whenever an electric current flows clockwise (as viewed from above the plane of the page), the armature 45 is urged by the resulting Lorentz force to move to the right (in the Y direction). Hence, even though the motor 60 is termed a "linear" motor, the armature 45 thereof is not limited only to linear motion, but alternatively can move relative to the respective stator in the X–Y plane. A motor (such as the motor 60) movable in two dimensions (e.g., X–Y plane) is also termed a "linear motor." With respect to the coil 43d, the windings are separated from the magnetic field generated by the stator, so the net force received from the array of permanent magnets is always zero, yielding no net motion of the armature 45.

The depicted arrangement of the permanent magnets and the coils 43a–43d, as described above, is exemplary only. In any event, the armatures can be made, by selective energization of the coils 43a–43d, to move relative to the respective magnet arrays 46a, 46b. Hence, the coils that drive the armatures 45 in the up/down direction or left/right direction in the figure always change. In any event, the position of the wafer table 32 is determined using the laser interferometer 113, which provides feedback control of the electric current delivered to the coils.

In the positional relationship shown in FIG. 9, movement in the X direction (up/down in the figure) can be achieved by delivering an electric current to the coil 43a, and movement in the Y direction (left/right in the figure) can be achieved by delivering an electric current to the coil 43c. In addition, as shown in FIG. 2, the main stage 3 is provided with two two-dimensional linear motors 60. This allows movement (i.e., θ-direction movement) about an axis that is perpendicular to the "guide plane" (i.e., an X–Y plane). For example, in FIG. 2, if an electric current is caused to flow to the coils in the right-hand two-dimensional linear motor 60 so as to cause movement in the X direction, and an electric current is caused to flow to the coils in the left-hand two-dimensional linear motor 60 so as to cause an opposite motion, then a moment force occurs about the axis perpendicular to the guide plane. This causes the main stage 3 to experience a limited rotation (θ-direction motion) about the axis.

As shown in FIG. 2, vibration-attenuating mechanisms 49 (each comprising, e.g., a spring and a dashpot) can be attached to each of the linear-motor stators 42a, 42b. In the embodiment shown in FIG. 2, two vibration-attenuating mechanisms 49 are provided for each linear-motor stator in the Y direction, and one each is provided in the X direction. The distal ends of the vibration-attenuating mechanisms 49 can be secured to the base or the like.

In this embodiment, the linear-motor stators 42a, 42b are arranged at the upper surfaces of the guide plates 52a, 52b by means of the non-contacting plane bearings 59. Also, the linear-motor stators 42a, 42b are limited to the guide plane by the vibration-attenuating mechanisms 49. Hence, it is possible to absorb the reaction force applied to the linear-motor stators 42a, 42b whenever the main stage 3 moves within the guide plane.

Third Representative Embodiment

Figure 10:
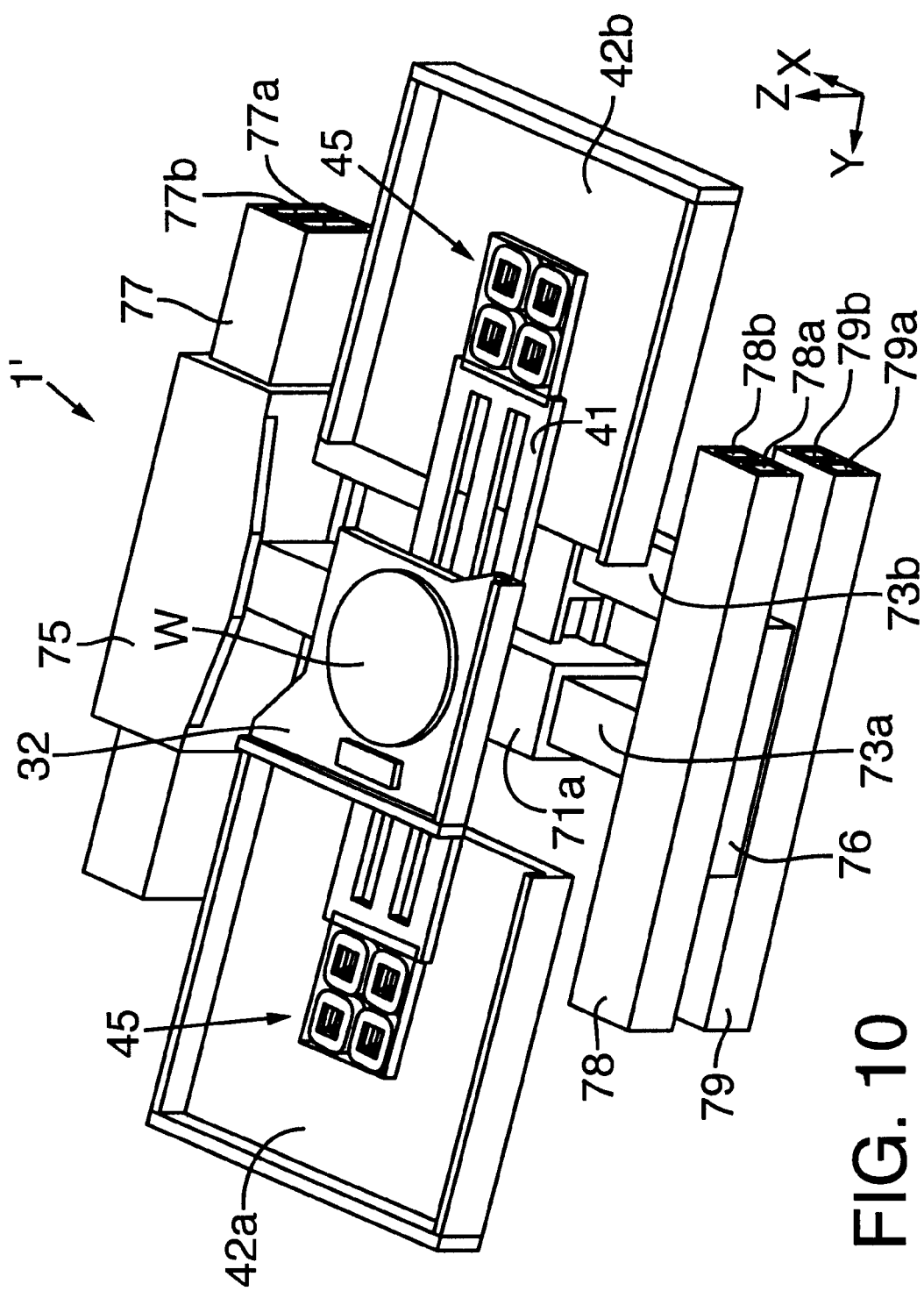
FIG. 10 is an oblique view of a stage apparatus according to a third representative embodiment.
Figure 11:
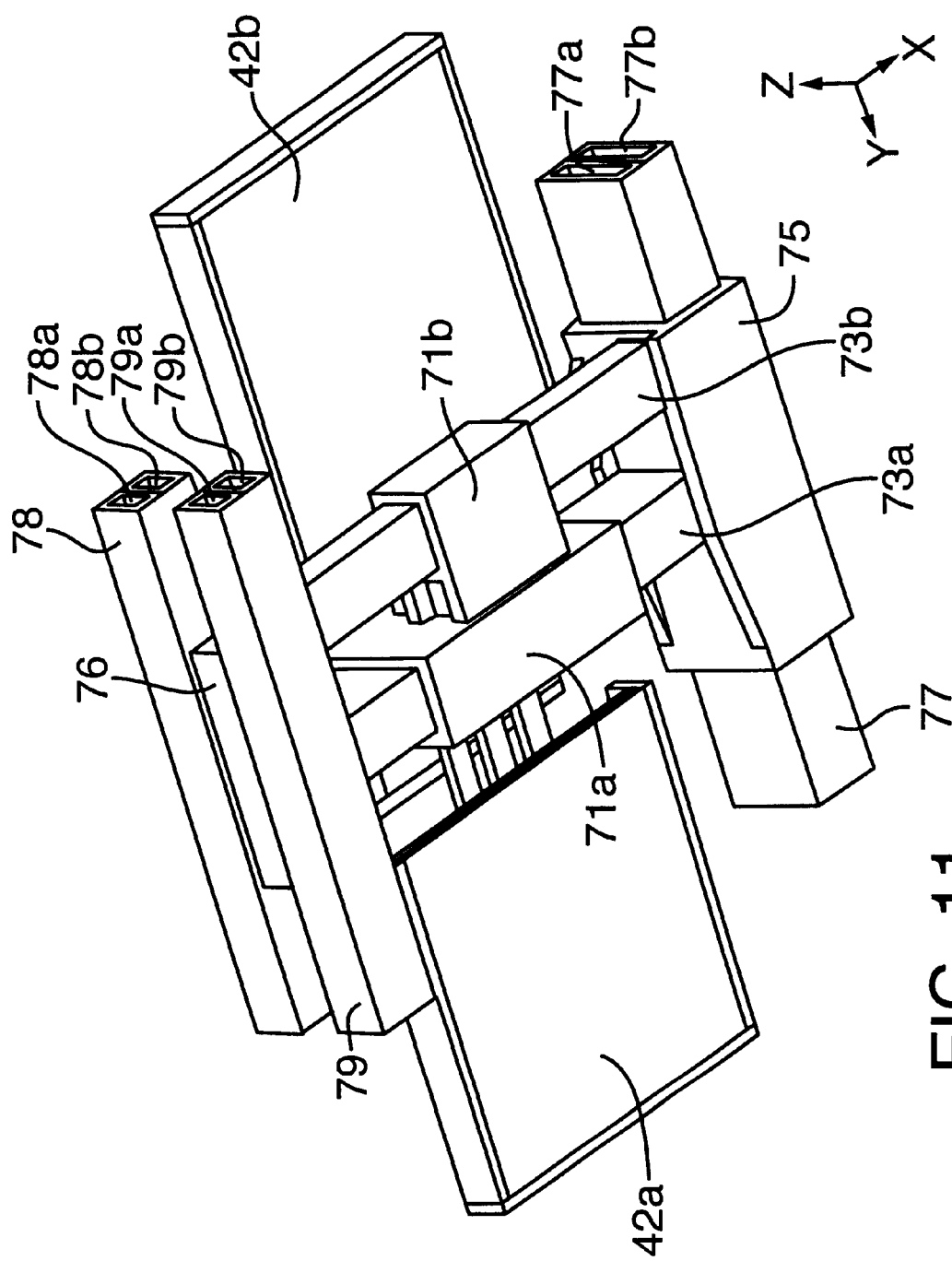
FIG. 11 is an oblique view of the stage apparatus shown in FIG. 10, but viewed from below.

A stage apparatus 1' according to this embodiment is shown in FIG. 10, in which components that are the same as corresponding components in the second representative embodiment have the same reference numerals and are not described further. An oblique view of the embodiment, as viewed from below, is shown in FIG. 11.

The depicted stage apparatus 1' comprises a wafer table 32 on which a wafer W is mounted. An arm 41 extends symmetrically directions in the Y direction with the wafer table 32 at the center. The middle of the arm 41 is mounted to moving stages 71a, 71b. A two-dimensional linear-motor mover ("armature") 45 is provided at each end of the arm 41, allowing movement of the wafer table in the X and Y directions (i.e., within the "guide plane") and movement (θ-direction movement) of the wafer table 32 about an axis perpendicular to the guide plane. In this embodiment, guide members 73a, 73b engage with the respective moving stages 71a, 71b by means of respective gas bearings. Thus, for example, the moving stages 71a, 71b can slide with low friction in the X direction. A guide member 77 is engaged with a sliding body 75, and guide members 78, 79 are engaged with a sliding body 76 by means of gas bearings (and the sliding bodies 75, 76 are connected to the guide members 73a, 73b). Thus, the sliding bodies 75, 76 can slide with low friction in the Y direction relative to the guide members 77 and 78, 79, respectively. Since low-friction movement is achieved using gas bearings, it is relatively easy in this embodiment to provide a stage apparatus exhibiting X, Y, and θ movement using two-dimensional linear motors.

The wafer table 32 on which the wafer W is mounted is an "upper" portion of the stage apparatus 1'. The wafer table 32 and arm 41 in this and in the first representative embodiment can be the same. Associated with each armature 45 is a linear motor stator 42a, 42b of which the upper surface of each is removed in FIG. 10. The armatures 45 and stators 42a, 42b collectively comprise the linear motor that allows X, Y, and θ movements of the wafer stage.

The arm 41 includes, within its thickness dimension, respective conduits for circulating a cooling medium for cooling the coils of the armatures 45 and for routing electrical wiring for energizing the coils. The conduits are connected to corresponding conduits (not shown) included in the moving stages 71a, 71b for ultimate connection to an external source of cooling medium and electrical power, respectively.

Beneath the arm 41, the moving stage 71a defines a through-hole having a rectangular transverse profile through which the guide member 73a extends in the X direction. As shown in FIG. 11, the moving stage 71b (serving as a reinforcing stage to the moving stage 71a) also defines a through-hole having a rectangular transverse profile through which the guide member 73b extends in the X direction. The moving stages 71a, 71b are affixed to each other in the Y direction. Two gas bearings, such as those shown in FIG. 32, are formed on each surface of the guide members 73a, 73b that faces a respective surface of the respective moving stages 71a, 71b. Thus, a total of eight gas bearings are provided for each of the guide members 73a, 73b, thereby permitting the moving stages 71a, 71b to move with very low friction along the guide members 73a, 73b, respectively. Providing two guide members 73a, 73b (wherein the moving stage 71b serves as a reinforcing stage for the moving stage 71a) permits reliable sliding of the moving stage 71a without exhibiting instability about the X axis.

As shown in FIG. 11, the sliding body 75 defines a through-hole having a rectangular transverse profile extending in the X direction. The sliding body 75 is connected to the respective right ends (in the figure) of the guide members 73a, 73b. The guide member 77 extends through the through-hole in the sliding body 75. Two gas bearings, such as those shown in FIG. 32, are provided on each of the surfaces of the guide member 77 that faces a corresponding surface of the sliding body 75. Thus, a total of eight gas bearings is provided for the sliding body 75. The guide member 77 includes a gas-supply conduit 77a for supplying gas to the gas bearings and an exhaust conduit 77b for exhausting gas from the bearings. These conduits 77a, 77b extend lengthwise through the guide member 77. The gas bearings permit the sliding body 75 to slide relative to the guide member 77 with very low friction. The gas bearings also limit movement of the moving stage 71a in the X direction and limit rotation of the moving stage 71a about the Y and Z axes.

Although not detailed in the figures, gas-supply and gas-exhaust ports are provided for supplying and exhausting, respectively, gas to and from, respectively, the guide member 77 and sliding body 75. The ports are formed at respective locations facing the inside surface of the sliding body 75 and the guide member 77. Since the sliding body 75 slides lengthwise relative to the guide member 77, the gas-supply and gas-exhaust ports on the sliding body 75 desirably are extended lengthwise in the Y direction. Each port is surrounded by a respective guard ring for preventing gas from leaking from the respective port into the surrounding vacuum environment. For the guard rings, as shown in FIG. 3(B), guard rings that comprise gas bearings also may be employed. The gas exhausted from the guard rings is exhausted from the exhaust conduit 77b of the guide member 77 to an external dump. Note that gas conduits from the guide member 77 to the guide members 73a, 73b are included in the sliding body 75.

A flat rectangular sliding body 76 is provided at the left side of the guide members 73a, 73b. The sliding body is interposed between the guide members 78, 79. Two gas bearings are defined on each surface of the guide members 78, 79 facing the sliding body 76. Included inside the guide member 78 are a supply conduit 78a for supplying gas to the gas bearings and an exhaust conduit 78b for exhausting gas from the bearings. Similar respective conduits 79a, 79b are included inside the guide member 79. The gas bearings permit the sliding body 76 to slide in the Y direction with very low friction relative to the guide members 78, 79, while the guide members 78, 79 permit the moving stage 71a to slide with stability in the X direction.

Thus, in this embodiment, the moving stage 71a slides in the X–Y plane with low friction due to the gas bearings. The moving stage 71a also moves in the X, Y, and θ directions by means of the linear motor comprising the armatures 45 and the stators 42a, 42b.

Fourth Representative Embodiment

A stage apparatus according to this embodiment is depicted in FIGS. 12–16. The stage apparatus of this embodiment can be used as the sub-stage in the configuration of FIG. 4 or as the main stage (for reticle or wafer) of a microlithography apparatus.

Figure 12:
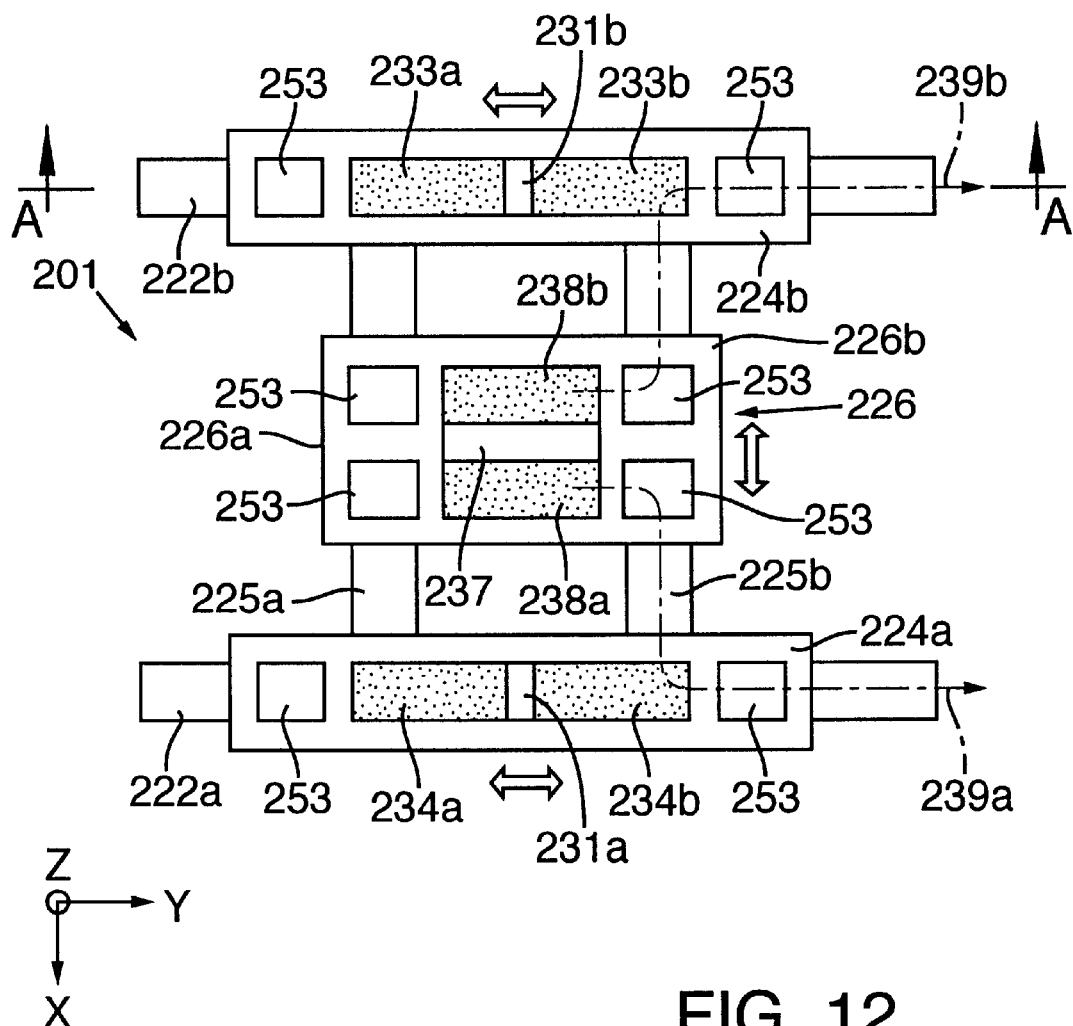
FIG. 12 is a plan section of a stage apparatus according to the fourth representative embodiment.

Turning first to FIG. 12, a stage apparatus 201 according to this embodiment includes two guide members 222a, 222b that extend parallel to each other in the Y direction. The guide members 222a, 222b are secured to a base or the like (not shown). The guide members 222a, 222b extend through respective sliders 224a, 224b that slide along the respective guide members 222a, 222b in the Y direction. Two guide members 225a, 225b are attached to and extend in the X direction between the sliders 224a, 224b. The guide members 225a, 225b extend through respective slider portions 226a, 226b of a stage 226. Thus, the stage 226 is slidable along the guide members 225a, 225b in the X direction. A device such as an electrostatic chuck (not shown), for example, is provided on the upward-facing surface of the stage 226, and a wafer or reticle can be mounted to the chuck.

Air pads 253 are located on the slider portions 226a, 226b between the guide members 222a, 222b. Other air pads 253 also are located near respective ends of the sliders 224a, 224b. Respective air pads 253, described below, are attached to the top, bottom, and both side surfaces of the respective sliders near the respective edge of each slider.

The sliders 224a, 224b and the center portion of the stage 226 are gas cylinders as described in the second representative embodiment.

Figure 14:
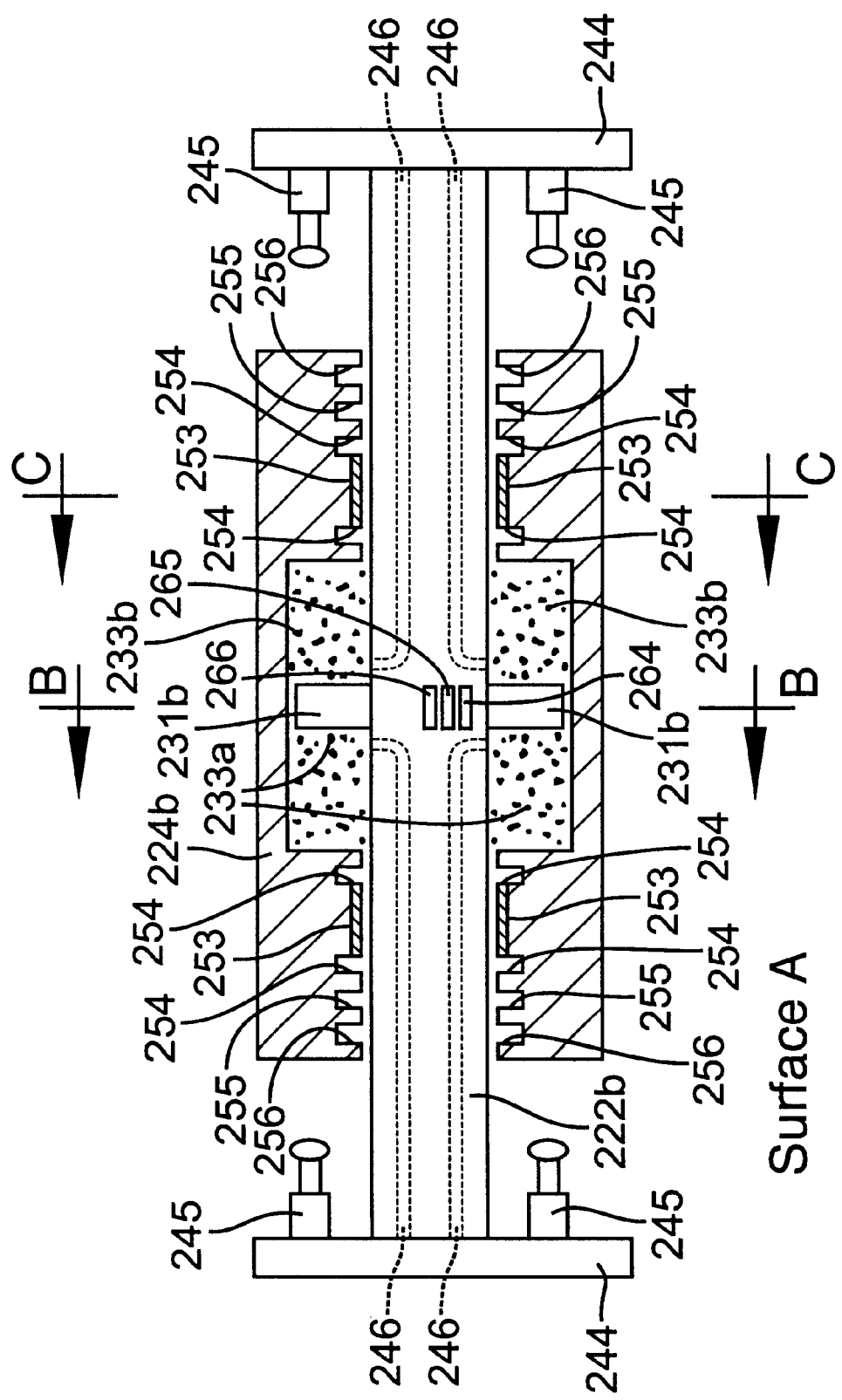
FIG. 14 is an elevational section along the line A—A in FIG. 12.

As shown in FIG. 14, a respective division plate 231a, 231b is provided at a central region of each slider 224a, 224b. Thus the central region of each slider 224a, 224b is divided into two gas subchambers 234a, 234b and 233a, 233b, respectively. The division plates 231a, 231b allow a difference to be created in the pressure of adjacent gas subchambers, which can be used to cause the respective sliders 224a, 224b to be driven in the Y direction. For example, by making the pressure of the gas subchambers 234a, 233a higher than the pressure of the gas subchambers 234b, 233b, differences in the pressure applied to the walls of the respective gas subchambers are created. The walls of the gas subchambers 234a, 233a at the left-hand portion of the figure, where a relatively high pressure is applied, are pushed. This pressure difference causes the sliders 224a, 224b to move relatively toward the right on the guide members 222a, 222b, respectively. Note that gas is supplied to the gas subchambers 233a, 233b and 234a, 234b via conduits inside the respective guide members 222b, 222a.

The configuration of the stage 226 is described below with reference to FIG. 13. The guide members 225a, 225b are arranged in parallel at the center portion of the figure. A division bar 237 extends perpendicularly to the respective guide members 225a, 225b from one guide member to the other at the center portion of the guide members 225a, 225b. Rectangular division plates 237a, 237b that are of a certain thickness and that are extended in the Y direction are provided at the top and bottom of the division bar 237.

Figure 13:
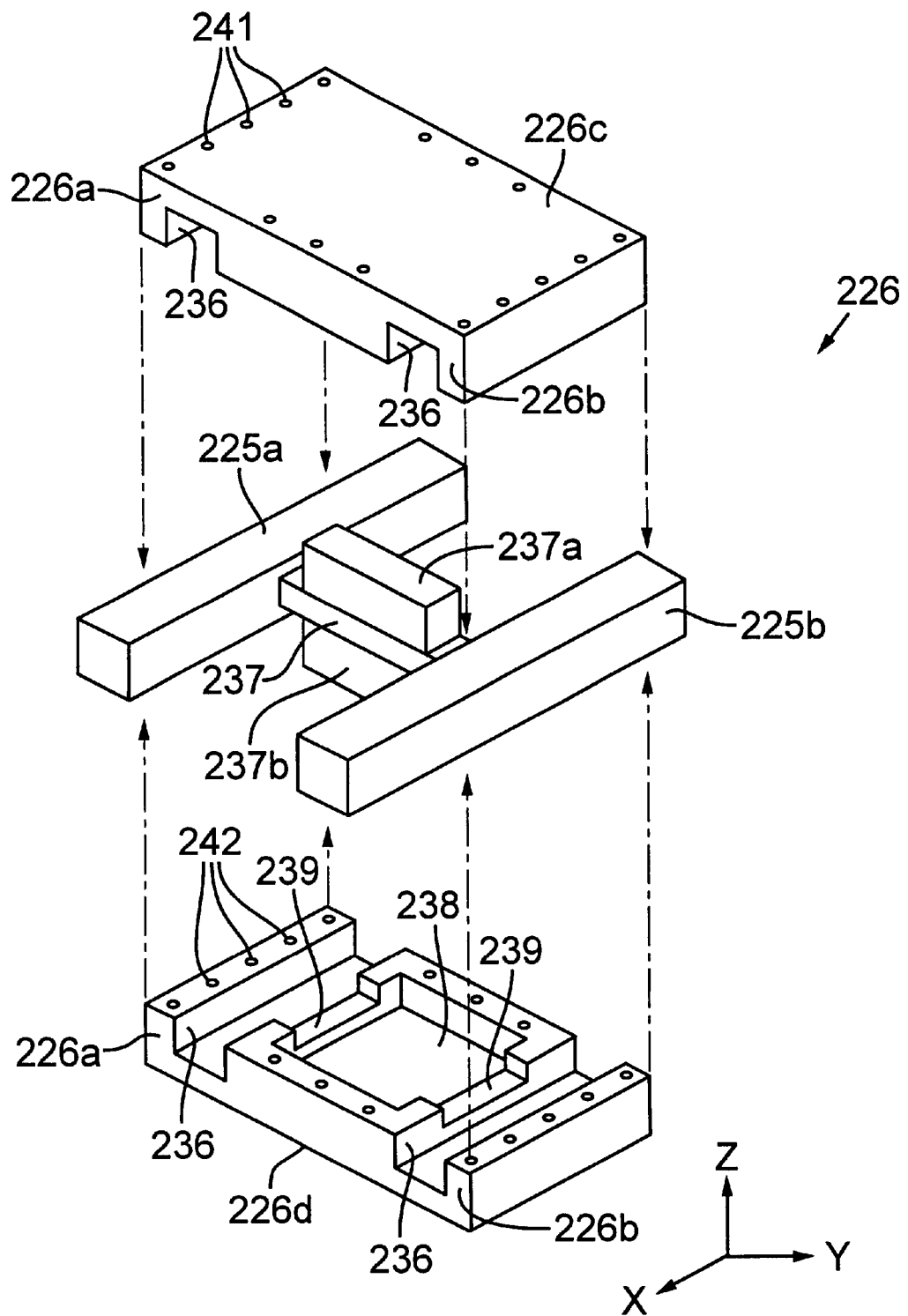
FIG. 13 is an exploded oblique view of the stage of the embodiment shown in FIG. 12.

Also shown in FIG. 13 are stage portions 226c, 226d situated at the top and bottom, respectively, of the figure. Multiple through-holes 241 extending in the Z direction are defined in the stage portion 226c. The through-holes 241 are arranged around the periphery of the stage portion 226c. Similarly, screw-threaded holes 242 are provided at corresponding positions around the periphery of the stage portion 226d. Respective screws are inserted from the top of the screw holes 241, and thread into the screw-threaded holes 242 to conjoin the stage portions 226c, 226d.

Each of the slider portions 226a, 226b defines channels 236 configured to engage with the guide members 225a, 225b, respectively. Respective air pads (not shown but described below) are attached to the inside surfaces of the channels 236. Each of the slider portions 226a, 226b also defines a respective portion of a gas chamber 238 situated in the center regions of the stage portions 226c, 226d. The gas chamber 238 is flanked by cutouts 239 defined in each of the slider portions 226a, 226b. (In FIG. 13, the slider portions 226a, 226b have mirror-image configurations.)

Whenever the stage portions 226c, 226d are fastened together by screws as described above, the cutouts 239 engage the division bar 237 in a manner allowing limited sliding of the assembly in the X direction (the extent of such sliding is determined by the width of the cutouts 239 versus the width of the division bar 237). The division plates 237a, 237b engage the gas chamber 238 in a manner permitting sliding in the X direction while dividing the gas chamber 238 into two subchambers 238a, 238b (see FIG. 12). By creating a pressure differential in the subchambers 238a, 238b, the stage 226 is urged to move in the X direction. For example, by increasing the gas pressure in the subchamber 238a relative to the gas pressure in the subchamber 238b, a pressure differential is created with respect to the pressure applied to the walls of the gas chamber 238. In FIG. 12, the higher pressure in the subchamber 238 urges the stage 226 to move downward (positive X direction in the figure) on the guide members 225a, 225b. In FIG. 12, the arrows 239a, 239b indicate the supply of gas to the subchambers 238a, 238b via conduits inside the respective guide members 222a, 222b, the slides 224a, 224b, the guide member 225b, and the stage 226.

In the stage apparatus 201 of this representative embodiment, by way of example, the gas pressure inside the respective subchambers is $4 \times 10^5$ Pa or more. For example, the gas pressure inside the subchamber 238a is $6.776 \times 10^5$ Pa, and the gas pressure inside the subchamber 238b is $6.421 \times 10^5$ Pa. The resulting pressure differential is $0.355 \times 10^5$ Pa, which is sufficient to provide an acceleration of approximately 1 G to the stage 226. Whereas similar pressure differentials achieve the same acceleration, by setting the pressure of both subchambers 238a, 238b high, it is possible to increase the rigidity of the subchambers, thereby improving response.

The gas bearings of the stage apparatus 201 are now described with reference to FIG. 14, which depicts the guide member 222b. To each end of the guide member 222b is attached a respective rectangular plate 244 having a defined thickness. The plates 244, in turn, are mounted to the base. Dampers 245 (each including a spring or the like) are attached to each plate 244. The dampers 245 on a plate 244 extend toward the slider 224b so as to absorb the impact of the slider 224b moving toward the plate 244. On each plate 244, the respective dampers 245 can be provided at two locations at the top and bottom of the plate 244, as shown in FIG. 14. Alternatively, for example, a separate damper 245 can be installed at each of the four corners of each plate 244.

The section shown in FIG. 14 reveals the division plate 231b situated at the center of and extending above and below the guide member 222b. The division plate 231b defines gas subchambers 233a, 233b. The guide member 222b defines conduits 246 for supplying gas to the gas subchambers 233a above and below the guide member 222b on the left, and to the gas subchambers 233b above and below the guide member 222b on the right. The guide member 222b also includes separate conduits (not shown) connected to the air pads 253 and to guard rings 254, 255, 256 for supplying gas to the air pads 253 and for recovering and exhausting gas from the guard rings, respectively. The guard ring 254 is for venting to atmosphere, the guard ring 255 is for low-vacuum exhaust, and the guard ring 256 is for high-vacuum exhaust. For connection of the conduits to the guard rings 254–256, the guide member 222b also defines through-holes 264, 265, 266 located at the center of the guide member 222b (see also FIG. 16). The through-hole 266 is situated at the center of the surface of the guide member 222b shown in FIG. 14, and the through-holes 265 and 264 are arranged in order below the through-hole 266.

As an alternative to using a conduit in the guide member 222b to supply gas to the air pads 253, it is possible to utilize conduits separate from the guide member 222b and connected to the slider 224b.

Figure 15:
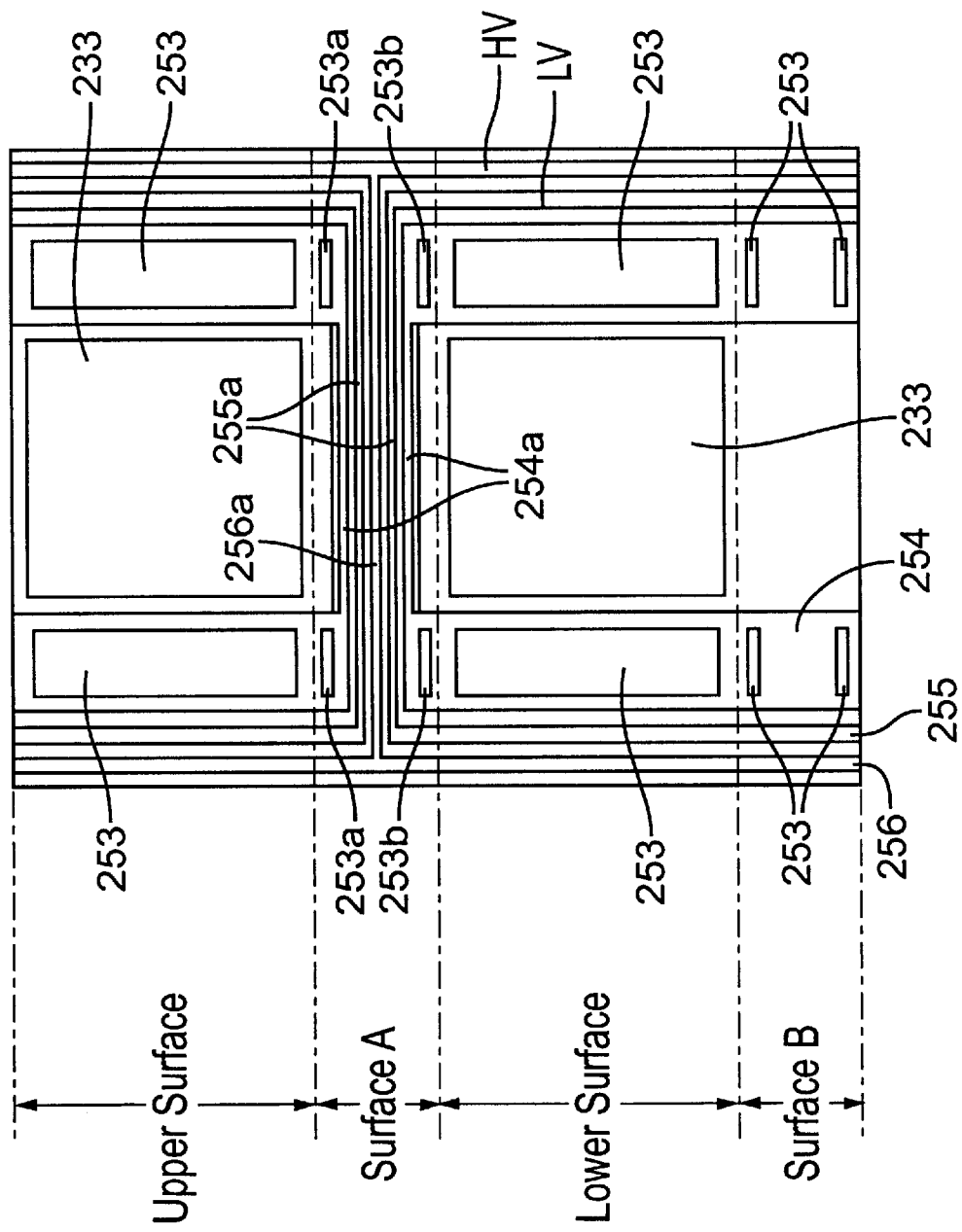
FIG. 15 is an "unfolded" view of the upper sliding surface, sliding surface "A", lower sliding surface, and sliding surface "B" of the stage shown in FIG. 13.
Figure 17:
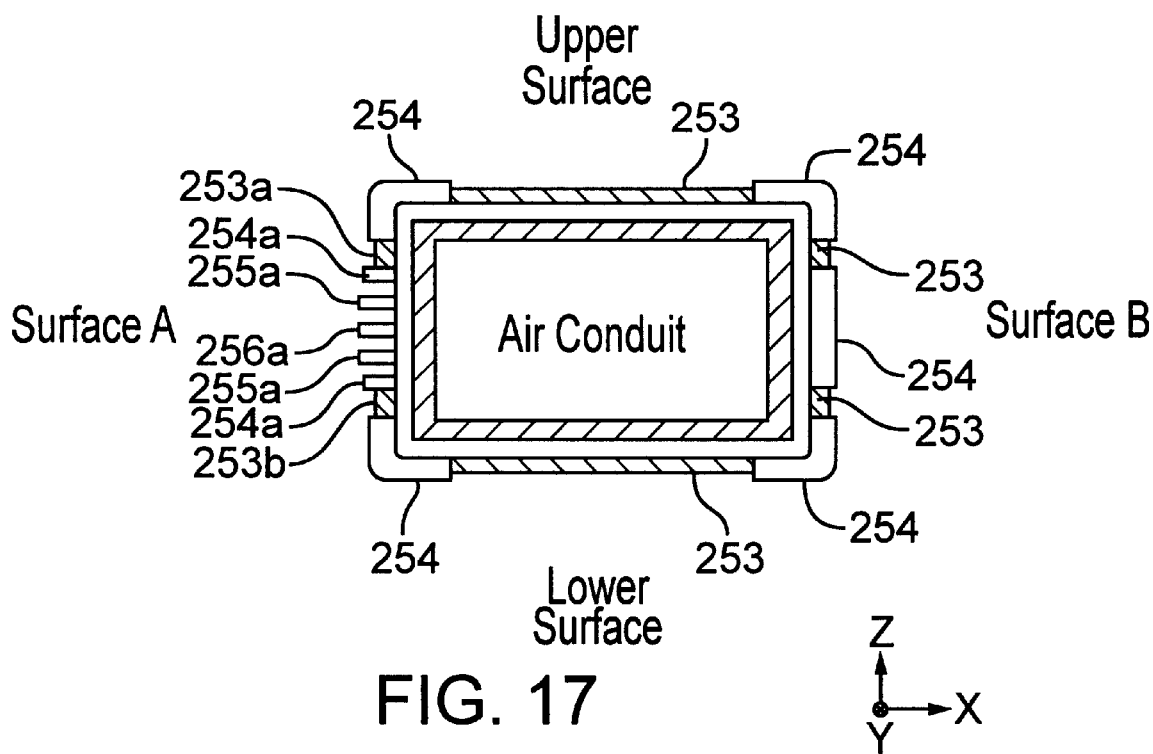
FIG. 17 is an elevational section along the line C—C in FIG. 14.

The respective configurations of the guard rings 254–256 and other features defined in the slider 224b are shown in more detail in FIGS. 15 and 17. FIG. 15 depicts, as viewed from above, the upper surface, side surface A, the lower surface, and side surface B of the slider 224b. Also shown are the two rectangular air pads 253 (each extended in the X direction) situated on each of the upper and lower surfaces of the slider 224b, and four relatively small rectangular air pads 253 (each extended in the Y direction) situated on each of the side surfaces A and B of the slider 224b (note the gap between pairs of these small air pads). The two air pads provided at the upper portion of the side surface A are denoted 253a, and the two air pads provided at the lower portion of the side surface A are denoted 253b.

Atmospheric-venting guard rings 254 are provided at the perimeters of respective air pads 253. The atmospheric-venting guard rings 254 are configured to cover all of the respective air pads 253 provided at the left and right in FIG. 15. However, atmospheric-venting guard rings 254 are not provided between the air pads 253a and 253b provided on the side surface A. Rather, linearly configured atmospheric-venting guard rings 254a (elongated in the Y direction) are provided between the two air pads 253a and between the two air pads 253b provided on the side surface A. These linearly configured guard rings 254a link together the atmospheric-venting guard rings 254 on the left and right of the figure.

Low-vacuum exhaust guard rings 255 are situated outside the atmospheric-venting guard rings 254. Linearly extended guard rings 255a (elongated in the Y direction) are provided between the air pads 253a and 253b provided on the side surface A. These elongated guard rings 255a link together the low-vacuum exhaust guard rings 255 on the left and right of the figure.

High-vacuum exhaust guard rings 256 are situated outside the low-vacuum exhaust guard rings 255. Linearly extended high-vacuum exhaust guard rings 255a (elongated in the Y direction) are provided between the air pads 253a and 253b provided on the side surface A. These elongated guard rings 256a link together the high-vacuum exhaust guard rings 256 on the left and right of the figure.

In the stage apparatus 201 of this example, air is supplied and discharged from respective conduits to the air pads 253. The air discharged into the air pads is vented to the atmosphere via the atmospheric-venting guard rings 254. Any gas that has leaked from the atmospheric-venting guard rings 254 is exhausted via the low-vacuum exhaust guard rings 255. Whenever the stage apparatus 201 is used in a vacuum, gas is further exhausted via the high-vacuum guard rings 256 so that substantially no gas leaks into the vacuum chamber (which is maintained at a high vacuum). In the stage apparatus 201 of this example, gas that has leaked from the gas chamber comprising the gas cylinder is recovered and exhausted from the respective guard rings 254, 255, 266.

Figure 16:
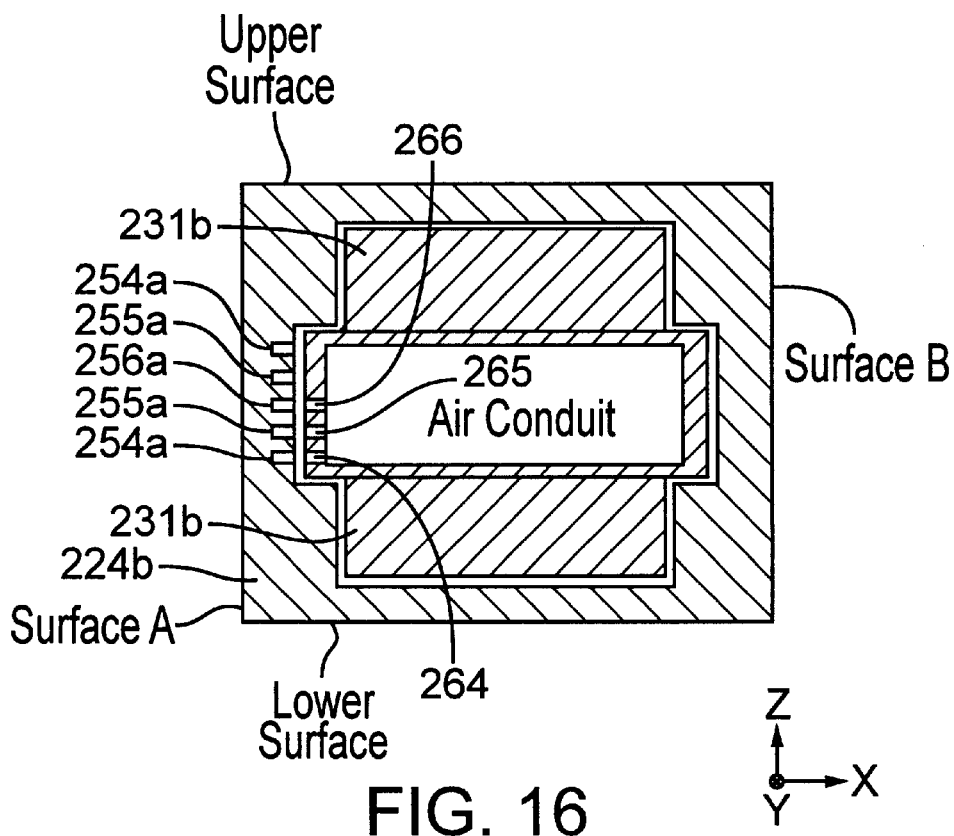
FIG. 16 is an elevational section along the line B—B in FIG. 14.

As shown in FIG. 16, the through-holes 264, 265, 266 face the guard rings 254a (lower side), 255a (lower side), and 256a, and perform air recovery and exhaust. Because the respective guard rings 254a, 255a, 256a are extended linearly, they always are able to perform air recovery and exhaust from the respective through-holes even if the slider 224b moves in the Y direction.

Fifth Representative Embodiment

Figures 18A, 18B:
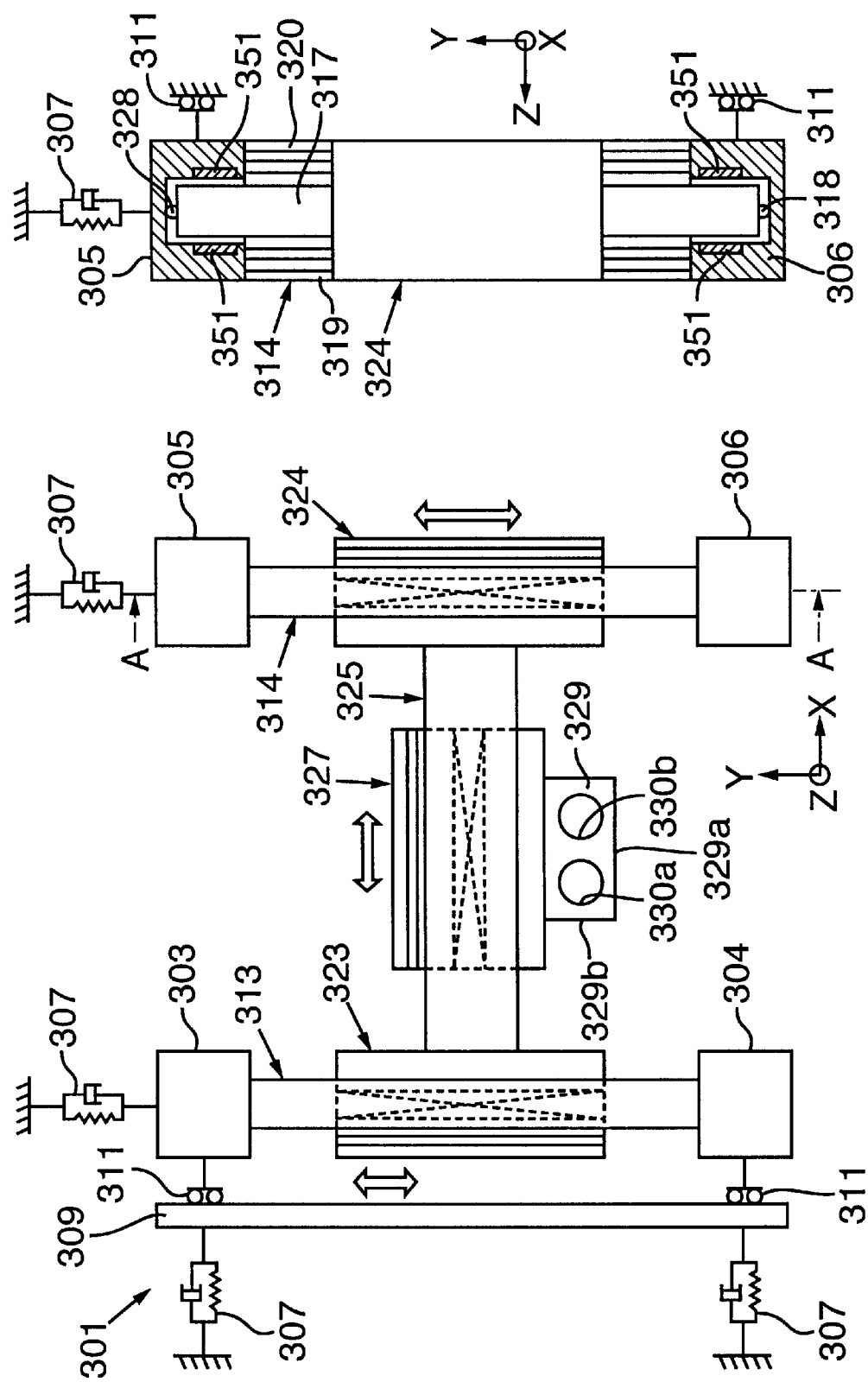
FIG. 18(A) is a plan view showing the overall configuration of a stage assembly according to the fifth representative embodiment.
FIG. 18(B) is a section along the line A—A in FIG. 18(A).

A stage apparatus 301 according to this embodiment is shown in FIGS. 18(A) and 18(B). FIG. 18(A) depicts the stage apparatus 301 as mounted to a base or the like. At each corner of the stage apparatus 301 is a respective guide-fixing member 303, 304, 305, 306. Each guide-fixing member 303, 304, 305, 306 generally is box-shaped with an opening on the respective side on which a guide member 313, 314 is attached. Rollers 311, movable in the X and Y directions, extend from each of the guide-fixing members 303, 304, 305, 306 to enable the guide members to move collectively relative to the base. A damper 307 extends from the guide-fixing members 303 and 305 to an outer wall. The dampers 307 can be any of various shock-absorbing devices, such as spring-dashpots, that absorb the reaction of the stage apparatus. Specifically, the dampers 307 absorb the reaction of the stage apparatus 301 in the Y direction.

A flat plate 309 of a defined thickness is situated at the left side of the guide-fixing portions 303, 304 in FIG. 18(A). Dampers 307 are provided between the plate 309 and an outer wall.

A respective roller 311 is provided between each guide-fixing member 303, 304 and the plate 309. The rollers 311 are movable in the Y direction relative to the plate 309. The dampers 7 are operable to absorb shock and vibration of the guide-fixing portions 303, 304 in the X direction.

Guide members 313, 314 are provided between the guide-fixing members 303, 304 and 305, 306, respectively. As shown in FIG. 18(B), each guide member 313, 314 comprises a center guide shaft 317 flanked by magnets 319, 320. The respective ends of the guide shaft 317 are secured to the guide members 313, 314, respectively, via bearings 318. Also, air pads 351 are situated between the ends of the guide shaft 317 and the respective guide-fixing member 305, 306 as shown. The air pads 351 are attached at the top and bottom (left and right sides in FIG. 18(B)) of the plane of contact of the guide members 313, 314 with the guide shaft 317. Guard rings (not shown) are defined at the perimeter of each air pad 351. The air pads 351 flank the guide shaft 317 from above and below and hold the guide shaft 317 in the center of the respective guide-fixing member. The magnets 319, 320 have a flat C-shaped transverse profile and are extended in the Y direction. The opening in the C-shaped profile faces outwardly from the stage apparatus.

Sliding bodies ("sliders") 323, 324 are engaged with respective guide members 313, 314 via gas bearings. As described below, each slider 323, 324 is provided with a respective gas cylinder and a linear motor, and moves in the Y direction.

A guide member 325 extends between the sliders 323, 324. In the same manner as the guide members 313, 314, the movement guide 325 comprises a guide shaft 317' and flanking magnets 319', 320'. The magnets 319', 320' have a flat C-shaped profile, of which the respective opening faces the top of the figure in FIG. 18(A).

A slider 327 is engaged with the guide member 325 by means of gas bearings. As described below, the slider 327 is provided with a gas cylinder and a linear motor for movement in the X direction. A planar sample table (stage) 329 of defined thickness extends below the slider 327 in FIG. 18(A). Two circular holes 330a, 330b are defined in the stage 329 to accommodate respective reticles mounted on the stage 329. The stage 329 has a front surface 329a and side surface 329b that are polished to high precision and used as respective reflecting surfaces for light from respective laser interferometers (not shown). Even though only one stage 329 is shown (mounted to the side of the slider 327, multiple stages can be attached to the slider, e.g., one stage on each side of the slider 327. Also, although the stage apparatus 301 is described in the context of a reticle stage, the stage apparatus 301 alternatively can be used for any of various other purposes, such as a wafer stage.

Precise movement of the stage apparatus 301 in the X and Y directions is performed by appropriately driving respective linear motors of the sliders 323, 324 and 327. In addition, driving of the respective gas cylinders of the sliders 323, 324 and of the slider 327 reduces the effects of acceleration and deceleration of the stage apparatus 301 in the X and Y directions.

Figures 19A, 19B:
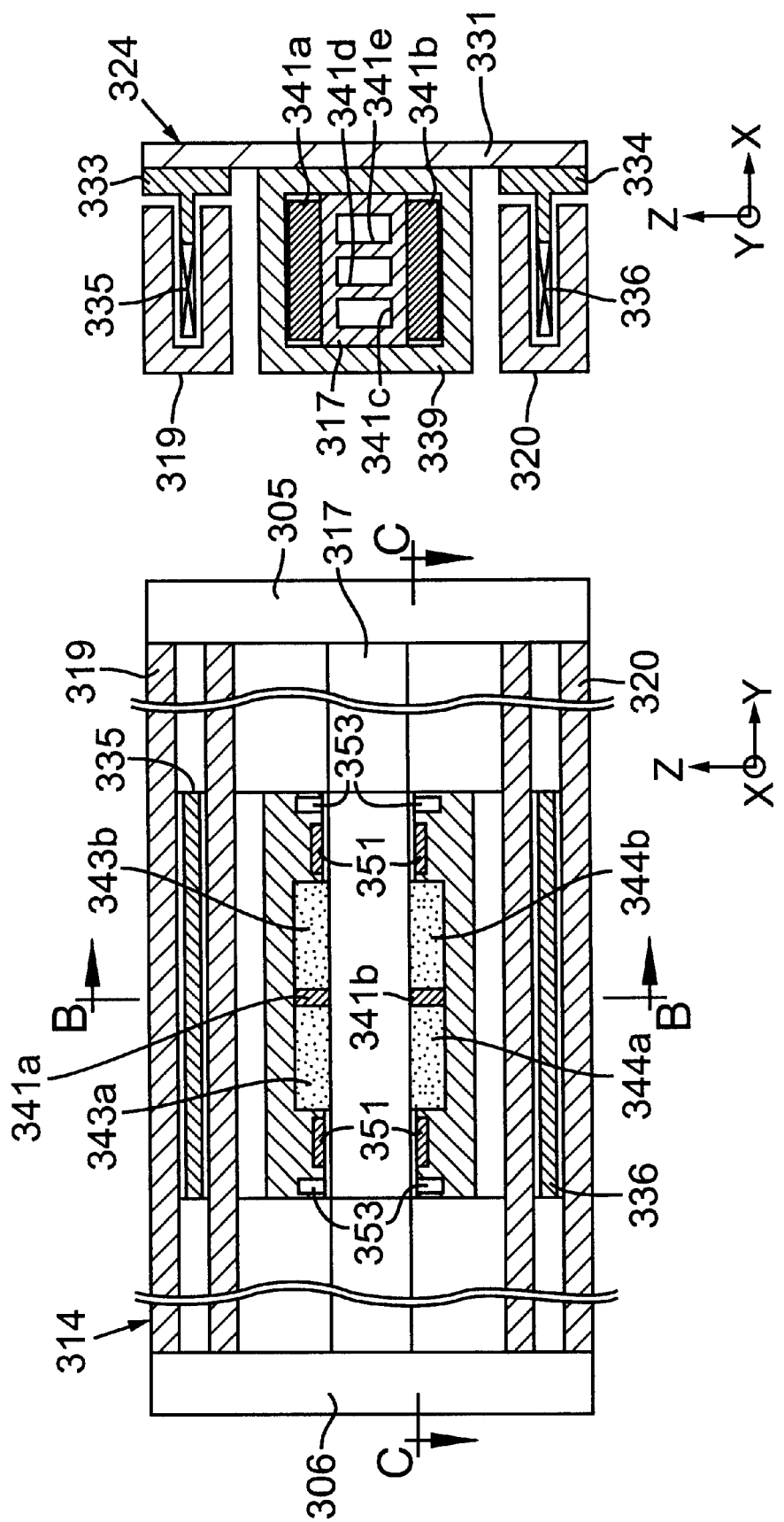
FIG. 19(A) is an elevational section along the line A—A of FIG. 18(A), showing details of the gas cylinder.
FIG. 19(B) is a section along the line B—B of FIG. 19(A).

Details of a gas cylinder and linear motor as used in the stage apparatus of this embodiment are shown in FIGS. 19(A) and 19(B). FIG. 19(A) is of the A—A section in FIG. 18(A), and FIG. 19(B) is of the B—B section in FIG. 19(A). FIGS. 19(A) and 19(B) also show the configurations of the guide member 314 and the slider 324. The guide shaft 317 at the center of the guide member 314 has a flat rectangular transverse section (X-direction section). Respective conduits 341c, 341d, 341e are defined within the guide shaft 317 for supplying air to air pads and for removing air and exhausting air, respectively. In the figure, three conduits 341c, 341d, 341e each having a rectangular transverse section are shown. Actually, each conduit is further divided, and the conduits have complex transverse profiles. A respective division plate 341a, 341b having a defined thickness and transverse profile and being extended in the X direction, is provided above and below, respectively, the center portion of the guide shaft 317 in FIG. 19(A).

A planar slider plate 331 of a defined thickness is provided at the right side of the slider 324 in FIG. 19(B). T-shaped coil mountings 333, 334 that extend lengthwise in the Y direction protrude toward the left at the top and bottom of the left surface of the slider plate 331. Rectangular flat motor coils 335, 336 are provided at the ends of the coil mountings 333, 334, respectively. The motor coils 335, 336 fit into the centers of the C-shaped profiles of the magnets 319, 320, respectively, thereby forming the linear motor for Y-direction movement. The point at which driving forces generated by the linear motor are combined is substantially coincident with the center of gravity of the slider 324. Hence, it is possible to provide a driving force at the center of gravity, thereby allowing positional control to be performed with high precision at high velocity. Although not shown, the slider 324 includes electrical wiring for energizing the motor coils 335, 336 and conduits for circulating coolant to the coils.

A square cylindrical member 339 that is extended in the Y direction is centrally provided on the left surface (as shown) of the slider plate 331. Respective gas chambers are formed at respective center portions of upper and lower surfaces of the square cylindrical member 339. The upper gas chamber is divided by the division plate 341a into gas subchambers 343a, 343b, and the lower gas chamber is divided by the division plate 341b into gas subchambers 344a, 344b. These gas subchambers and division plates collectively comprise a gas "cylinder." By establishing a pressure differential in adjacent gas subchambers, the slider 324 is driven in the Y direction. For example, by increasing the pressure in the gas subchambers 343a, 344a relative to the pressure in the gas subchambers 343b, 344b, a difference in pressure applied to the walls of the gas chamber is created. In FIG. 19(A), the left-hand wall (-Y direction) of the gas subchambers 343a, 344a receives the higher pressure. Thus, the slider 324 is urged to move leftward on the guide shaft 317.

As discussed below, a respective set of air pads 351 and guard rings 353 is provided aside each of the gas subchambers 343a, 343b, 344a, 344b. The air pads 351 flank the guide shaft 317 above and below in FIG. 19(A), and serve to maintain a constant distance (in the Z direction) between the respective sliders and the guide shaft 317.

The description given above of the guide member 314 and slider 324 is equally applicable to the sliders 323 and 327 and their respective guide members 313 and 325.

Figure 20:
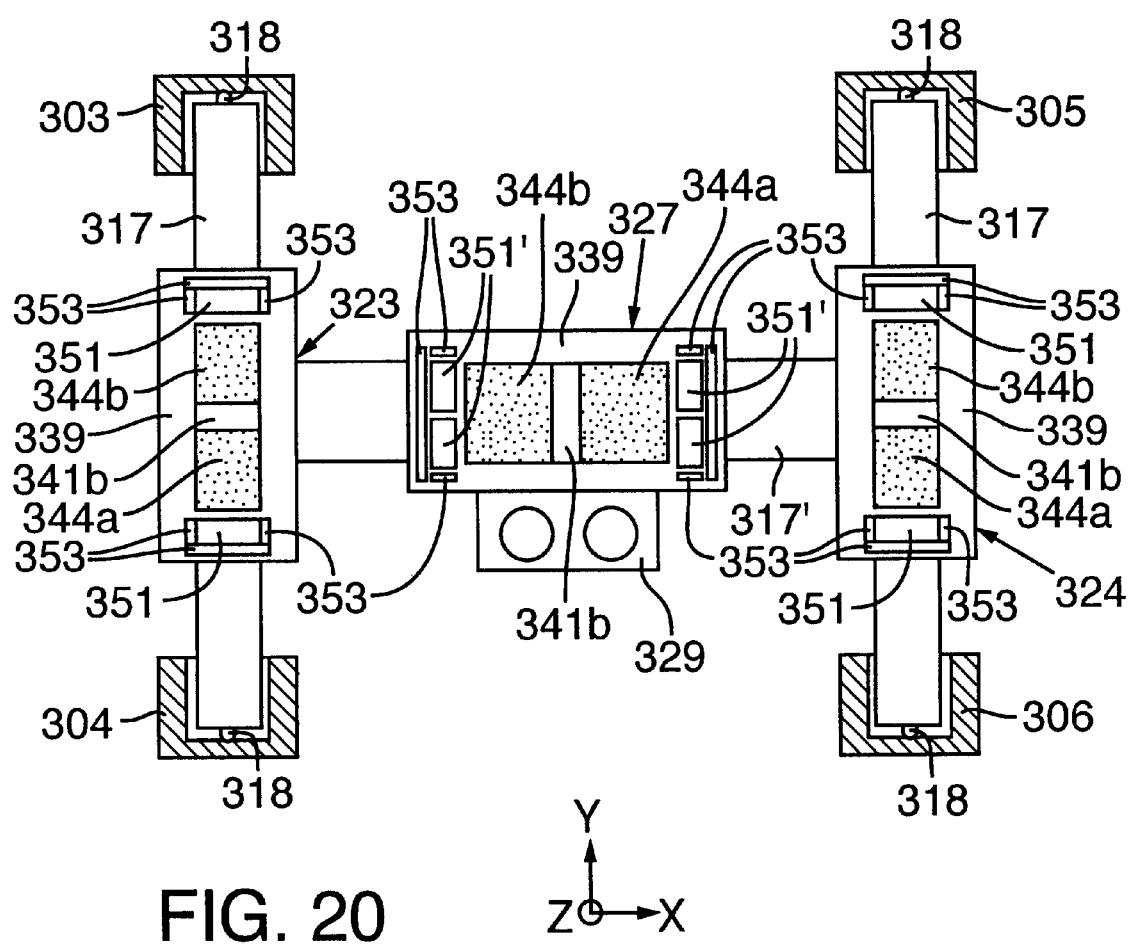
FIG. 20 is a plan section of along the line C—C of FIG. 19(A).

The configurations of the gas cylinder and gas bearings of the stage apparatus of this embodiment are shown in FIG. 20, which is a section along the line C—C in FIG. 19(A). A respective rectangular air pad 351 (extended in the X direction) is situated adjacent a respective outer edge of the respective gas subchamber 344a, 344b in the vicinity of the sliders 323, 324. The air pads 351 are situated above and below the upper and lower, respectively, sliding surfaces of the guide shaft 317 and at both side sliding surfaces of the guide shaft 317. Hence, eight respective air pads 51 are attached to each slider 323, 324. Rectangular guard rings 353 (extended in the Y direction) are situated to the left and right of each air pad 351 in FIG. 20. Also, rectangular guard rings 353 (extended in the X direction) are situated adjacent the respective air pads 351 near the ends of the sliders 323, 324. Air supplied to the air pads 353 and gas subchambers 344a, 344b is exhausted via the guard rings 353.

Two respective rectangular air pads 351' (extended in the Y direction) are situated adjacent the gas subchambers 344a, 344b near the ends of the slider 327. Respective sets of two air pads 351' are situated above and below the sliding surface of the guide shaft 317, and a single respective air pad 351' is situated adjacent each side surface of the guide shaft 317. Hence, the slider 327 includes twelve air pads 351'. In a manner similar to the sliders 323, 324, respective guard rings 353 are situated at the perimeters of the air pads 351'. By arranging two respective air pads 351' at each of the upper and lower surfaces adjacent each end of the slider 327, the slider 327 is prevented from rotating about the X axis.

Figure 21:
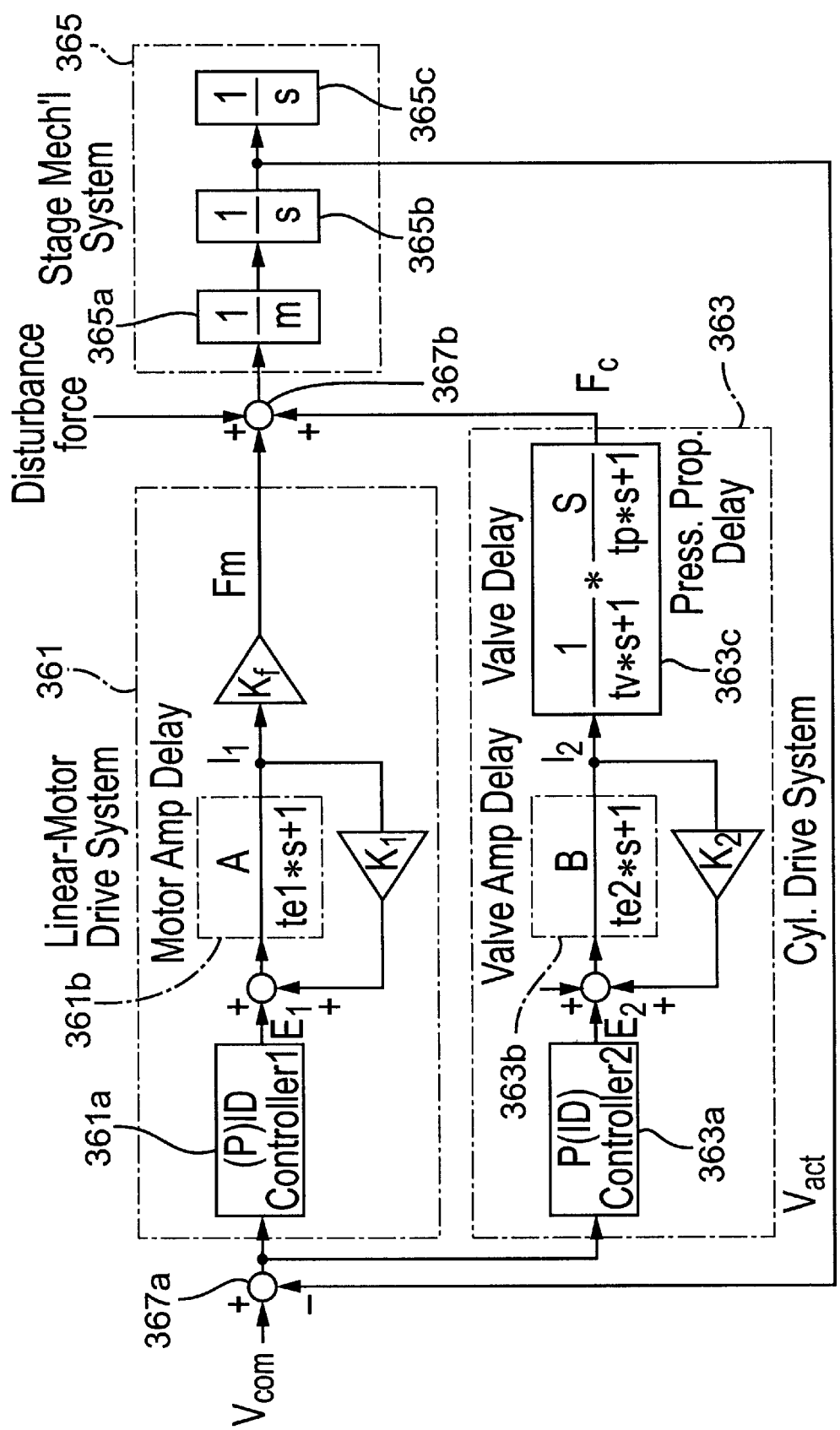
FIG. 21 is a block diagram of the velocity-control system of the stage apparatus of the fifth representative embodiment.

The stage apparatus of this embodiment can be controlled by a control system represented by the diagram of FIG. 21. Specifically, FIG. 21 is a block diagram of the system for controlling stage-movement velocity.

FIG. 21 depicts a linear-motor drive system 361 for the stage apparatus, a drive system 363 for the gas cylinder, and a mechanical system 365 for the stage apparatus. The linear-motor drive system 361 comprises a respective "PID" controller 361a, a first-order delay element 361b for the motor linear amplifier, and a proportional element $K_f$, all connected together in series. With a stage apparatus (e.g., as used in a microlithography apparatus), the linear motor drive system 361 is used mainly for controlling scan velocity and of step positioning of the stage at the time of exposure. The amount of stage movement is small in these controlled movements, but extremely fine control is required. For this reason, the element of proportionality (P) of the PID controller 361a is set relatively low, and the integral and derivative element (ID), which has high compensation, is set relatively high. A feedback circuit is formed in the first-order delay element 361b by means of a proportionality element $K_f$. This allows more accurate positional control of the stage to be achieved.

A gas-cylinder drive system 363 comprises a respective PID controller 363a, a first-order delay element 363b for a valve amplifier for the gas cylinder, and a gasket-connection element 363c for the first-order delay element of valve opening and closing and for pressure propagation, all connected together in series. With a stage apparatus as used in a microlithography apparatus, the gas-cylinder drive system 363 is used mainly during stage acceleration and deceleration. A difference between a target stage-motion velocity and an actual velocity is large during acceleration and deceleration, so any deviations that are larger than deviations realized with fine control must be eliminated rapidly. For this reason, the proportionality element P of the PID controller 363a is set relatively high, and the integral and derivative element ID is set relatively low. A feedback circuit is formed in the first-order delay element 363b of the valve amplifier of the gas cylinder by means of the proportionality element $K_2$. This allows more accurate positional control to be achieved.

An inertia system 365a, an acceleration-integration system 365b, and a velocity-integration system 365c are connected in series in the stage mechanical system 365. The target velocity value $V_{com}$ output from a computer or the like for control is shown at the left of the block diagram of FIG. 21. Whenever the target velocity value $V_{com}$ is input to the block diagram, the target velocity value is added at an addition point 367a, the output of which is conducted to both the linear-motor drive system 361 and the gas-cylinder drive system 363. Respective control data $F_m$, $F_c$, are output from the linear-motor drive system 361 and the gas-cylinder drive system 363 via the elements described above. The control data $F_m$, $F_c$ are input to the stage mechanical system 365 after being added at an addition point 367b. Note that disturbances such as wiring resistance, vibration, stage-reaction force, and the like are added at the addition point 367b. The velocity value $V_{act}$ output from the acceleration-integration system 365b of the stage mechanical system 365 is input to the addition point 367a, thereby forming a feedback circuit.

In this embodiment, as described above, hybrid control is achieved by independently controlling the linear-motor drive system 361 and the gas-cylinder drive system 363, respectively, with feedback. Drive methods according to the invention are not limited to this scheme. Hybrid control can be achieved using any of various control methods.

Figure 22A:
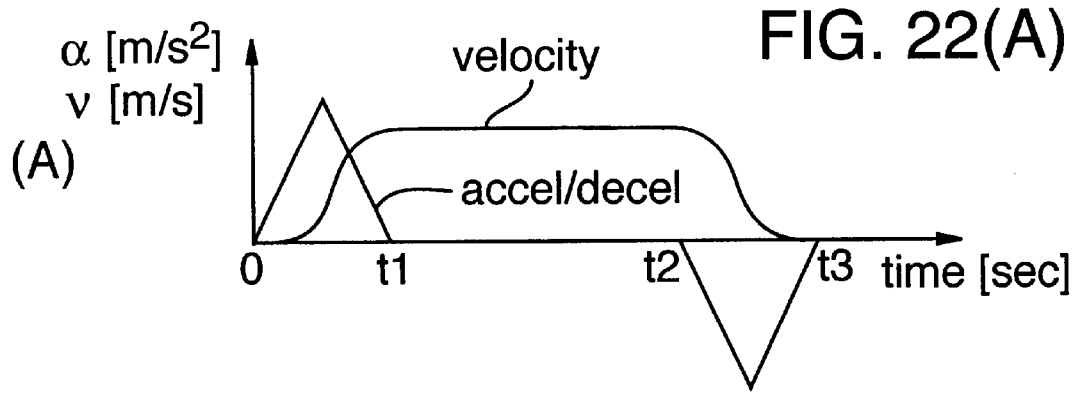
Figure 22B:
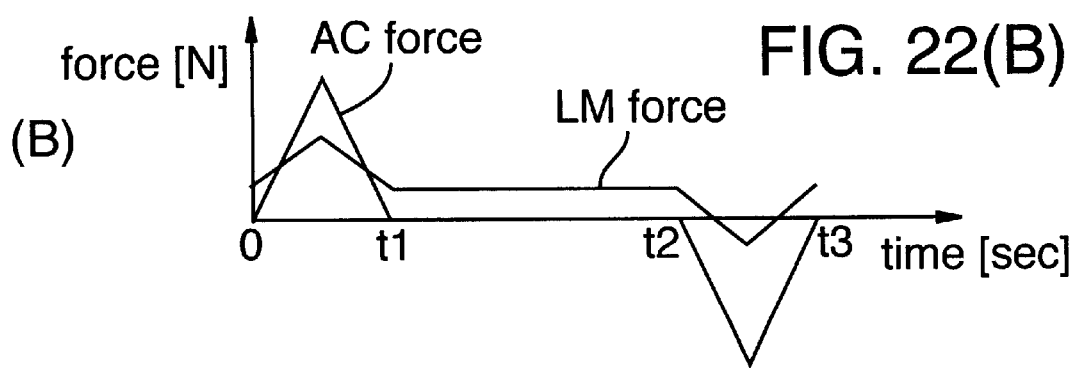
Figure 22C:
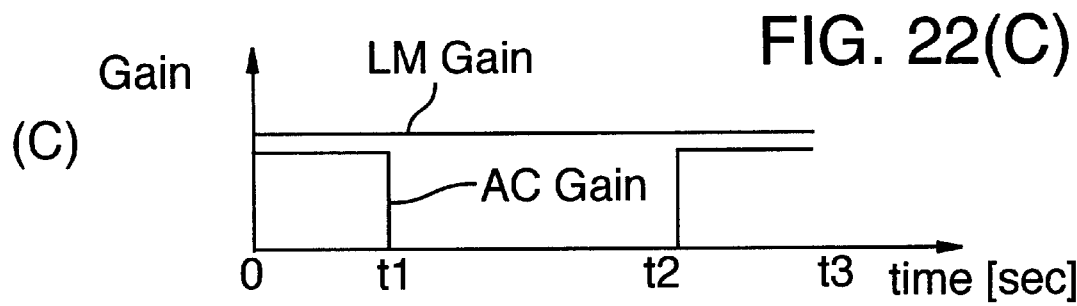

The hybrid control method for a stage apparatus according to this embodiment is illustrated further with reference to FIGS. 22(A)–22(C). FIG. 22(A) is a plot of velocity and acceleration of the stage apparatus, FIG. 22(B) is a plot of the respective driving forces of the gas cylinder and linear motor, and FIG. 22(C) is a plot of the gain tables of the gas cylinder and the linear motor. The period $0 \rightarrow t_1$ is during stage acceleration, the period $t_1 \rightarrow t_2$ is during a scan-velocity control step or a step-positioning control step at time of exposure, and the period $t_2 \rightarrow t_3$ is during stage deceleration. Hybrid control is performed during the periods $0 \rightarrow t_1$ and $t_2 \rightarrow t_3$, and driving of only the linear motor is performed during the period $t_1 \rightarrow t_2$.

The velocity and acceleration (acceleration/deceleration) of the stage apparatus are denoted by v and α, respectively. A plot of acceleration versus time exhibits a peak during acceleration/deceleration of the stage apparatus (during periods $0 \rightarrow t_1$ or $t_2 \rightarrow t_3$), and a plot of stage velocity versus time reveals a curve with a target velocity $V_{com}$ or 0. The acceleration is 0 during periods of scan-velocity control and step-positioning control ($t_1 \rightarrow t_2$), when velocity is controlled at a constant.

FIG. 22(B) depicts plots of the respective driving forces generated by the gas cylinder AC and linear motor LM. The driving force of the gas cylinder AC is larger (smaller) than the linear-motor driving force during periods of acceleration/deceleration of the stage apparatus ($0 \rightarrow t_1$ or $t_2 \rightarrow t_3$). This driving force assists in acceleration/deceleration. The driving force of the gas cylinder AC is 0 during periods of scan-velocity control and step-positioning control ($t_1 \rightarrow t_2$). During this time the driving force of the linear motor LM is controlled at a constant, and the stage is driven.

FIG. 22(C) depicts plots of the gain tables of the gas cylinder AC and linear motor LM. The respective gains of the gas cylinder AC and linear motor LM are high during periods of acceleration/deceleration of the stage apparatus ($0 \rightarrow t_1$ or $t_2 \rightarrow t_3$). The gain of the gas cylinder AC is zero during periods of scan-velocity control and step-positioning control ($t_1 \rightarrow t_2$). This is achieved, for example, by electrically setting the output $F_c$ of the gas-cylinder drive system 363 (in the block diagram of FIG. 21) to zero. On the other hand, the gain of the linear motor LM is set high during both acceleration and deceleration.

Figure 23:
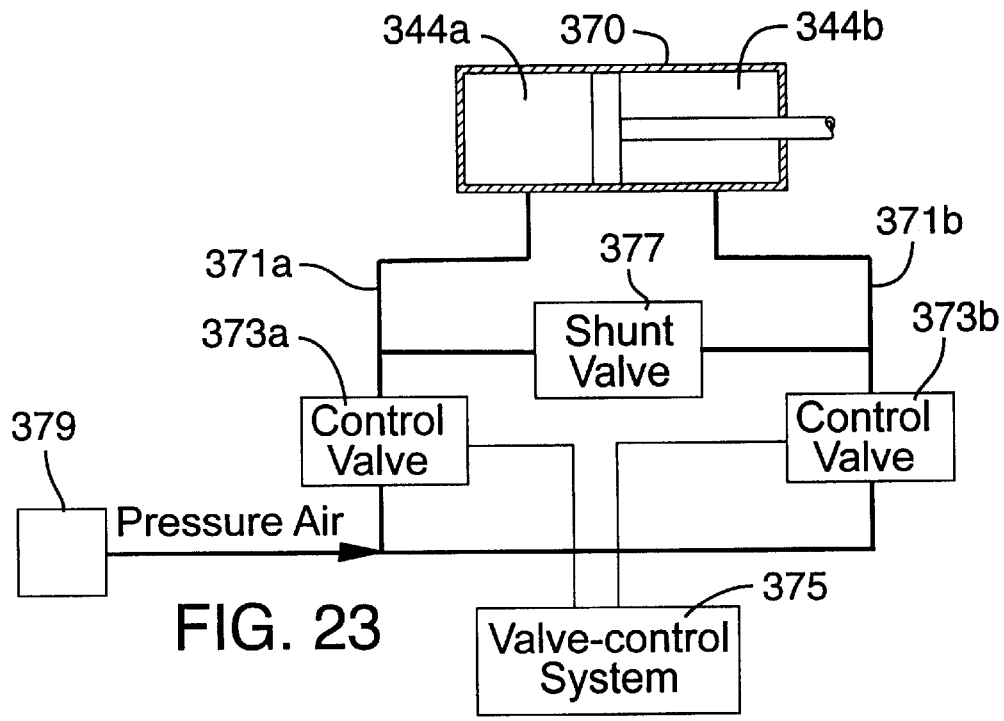
FIG. 23 is diagram of the control system for the gas cylinder of a stage apparatus according to the fifth representative embodiment.

A control method for the gas cylinder of a stage apparatus according to this embodiment is depicted in FIG. 23. In FIG. 22(C), the gain of the gas cylinder AC was set to zero by electrically setting the output $F_c$ of the gas-cylinder drive system 363 of the gas cylinder to zero. FIG. 23 depicts an example in which the gas-cylinder output is set to zero by shunting ("bypassing") the compression of the gas cylinder.

Figure 25:
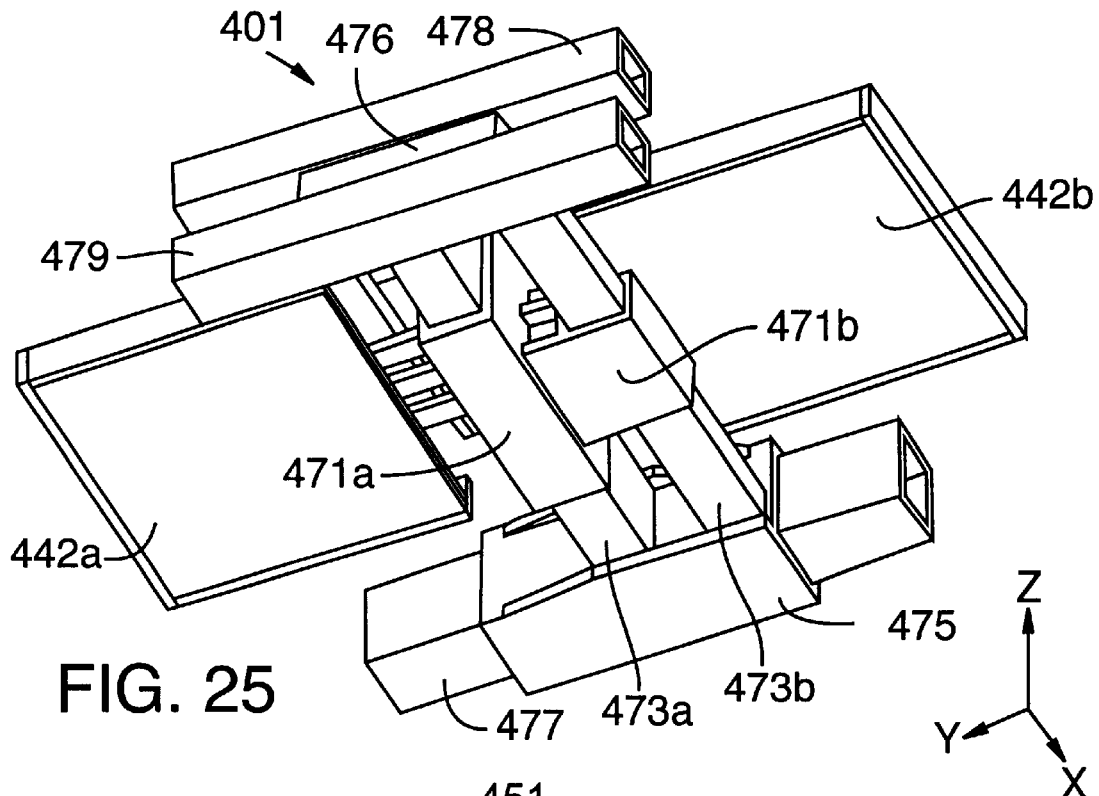
FIG. 25 is an oblique view of the stage apparatus of FIG. 24, but as viewed from below.

An exemplary gas cylinder 370 consisting of the square-cylindrical member 339 and guide shaft 317, as shown in FIG. 20, are depicted at the top of FIG. 25. Two gas subchambers 344a, 344b are provided in the gas cylinder 370. Gas conduits 371a, 371b (provided in the guide shaft 317, for example) are connected to the gas subchambers 344a, 344b. Respective control valves 373a, 373b are connected to the ends of the gas conduits 371a, 371b. The control valves 373a, 373b are connected to a valve-control system 375, and opening and closing of the valves are controlled in a manner as shown in FIGS. 22(A)–22(C). A shunting (bypass) valve 377 is connected to the gas conduits 371a, 371b between the gas subchambers 344a, 344b and the control valves 373a, 373b. A gas-supply source 379 is provided at the ends of the control valves 373a, 373b, and gas is supplied therefrom to the gas subchambers 344a, 344b.

The shunting valve 377 is closed during periods of acceleration and deceleration of the stage apparatus ($0 \rightarrow t_1$ or $t_2 \rightarrow t_3$). Then, compression of the gas subchambers 344a, 344b is controlled by the control valves 373a, 373b so as to drive the gas cylinder 370. The control valves 373a, 373b are closed, and the shunting valve 377 is opened during periods of scan-velocity control and step-positioning control ($t_1 \rightarrow t_2$). This causes the gas pressure in the gas subchambers 344a, 344b to equalize, resulting in zero output from the gas cylinder 370.

Sixth Representative Embodiment

Figure 24:
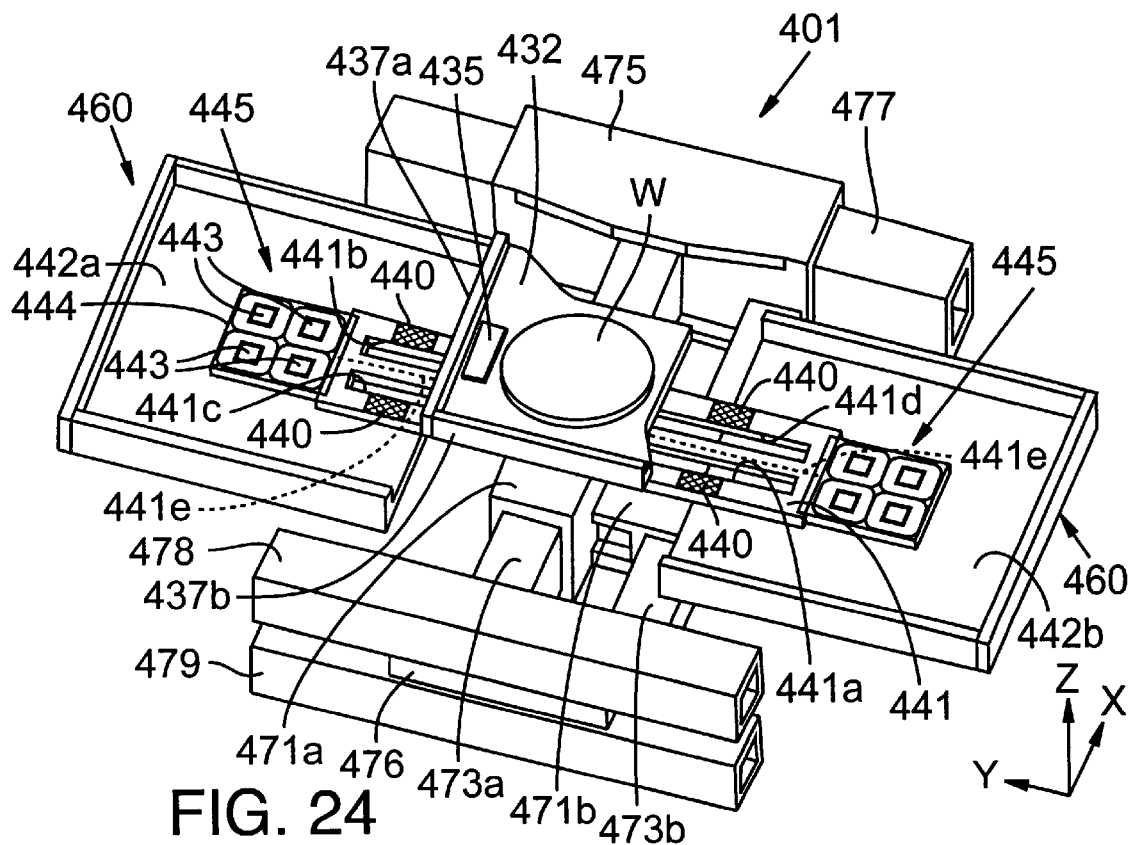
FIG. 24 is an oblique view showing the overall configuration of a stage apparatus according to a sixth representative embodiment.

FIGS. 24 and 25 depict a stage apparatus 401 according to this embodiment. This stage apparatus 401 can be used as a wafer stage in a microlithography apparatus such as the apparatus discussed in the first representative embodiment. The stage apparatus 401 comprises a wafer table 432 configured to hold a wafer, an arm 441 centered with respect to the wafer table 432 and extending symmetrically from the wafer table, and moving stages 471a, 471b. Respective planar motor actuators 445 are provided at each end of the arm 441. The motor actuators 445 can drive in two dimensions in a guide plane (X–Y plane) and rotationally (θ direction) about an axis orthogonal to the guide plane.

The moving stages 471a, 471b engage respective guide members 473a, 473b via gas bearings (see FIG. 26), allowing the moving stages 471a, 471b to slide along the respective guide members 473a, 473b in the X direction with low friction. Sliders 475, 476 are connected to each end of the guide members 473a, 473b. The slider 475 engages a guide member 477, and the slider 476 engages guide members 478, 479 via respective gas bearings (see FIG. 26), thereby allowing the sliders 475, 476 (and hence the moving stages 471a, 471b) to move in the Y direction with low friction. Respective gas bearings (including air pads) are provided at the upper, lower, left, and right sliding surfaces of the moving stage 471a and of the slider 475, and at the upper and lower sliding surfaces of the moving stage 471b and of the slider 476.

The wafer table 432 is configured to hold a wafer W. To such end, situated atop the wafer table 432 is a device, such as an electrostatic chuck, that secures the wafer W. The surface of the chuck defines grooves or channels through which a heat-transfer gas is conducted whenever a wafer is secured to the surface of the chuck. An exemplary heat-transfer gas is He gas, as supplied and removed via respective hoses (not shown) connected to the moving stage 471a.

Left of the wafer W on the wafer table 432 in FIG. 24 is a mark plate 435 that defines an alignment mark used for confirming the position of the wafer table 432 in the Z direction. Moving mirrors 437a, 437b are disposed along an X and Y edge, respectively, of the wafer table 432. The moving mirrors 437a, 437b are highly polished and are used as reflective surfaces for respective laser interferometers (not shown).

In FIG. 24 the arm 441 is provided beneath the wafer table 432. The arm 441 is a rectangular flat plate having a defined thickness. The arm 441 defines four through-holes 441a, 441b, 441c, 441d that are elongated in the Y direction. The through-holes 441a–441d reduce the movable mass of the arm 441 and wafer table 432, hence improving stage-drive performance. A respective piezoelectric element 440 is provided at each of four places on the arm 441; the piezoelectric elements 440 serve as anti-vibration actuators. I.e., the piezoelectric elements 440 perform controlled elongation and contraction for canceling vibrations of the arm 441 especially as the arm 441 is being moved.

Respective planar motor actuators 445, which have a square profile, are provided at the ends of the arm 441. Each planar motor actuator 445 comprises a can 444 containing multiple planar coils 443. A passage 441e is defined inside the arm 441. The passage 441e can include respective conduits for delivering a coolant fluid to the coils 443 and for routing electrical wiring to the coils 443 for energizing the coils. The conduits are connected to respective hoses and wiring (not shown) connected to the moving stage 471a. Thus, the coolant fluid and electrical power are supplied from outside the stage apparatus 401.

Beneath the planar motor actuators 445, as shown in FIG. 24, are respective linear-motor stators 442a, 442b. Typically, the linear-motor stators 442a, 442b have a flat box-like profile, with the opening in the respective edges of the stators facing each other (in FIG. 24 each stator 442a, 442b is shown with a respective upper panel removed to reveal underlying detail). Each combination of a linear-motor actuator 445 and a respective linear-motor stator 442a, 442b constitutes a respective planar motor by which the moving stages 471a, 471b are driven in the X and Y directions in the guide plane and about an axis orthogonal to the guide plane (θ-direction movement). Respective magnetic-pole units 446a, 446b (described later below) are provided on the inner surfaces of the upper and lower portions of the linear-motor stators 442a, 442b.

As shown in FIG. 24, because the stage apparatus 401 comprises two planar motors 460, the moving stages 471a, 471b can be driven collectively around an axis orthogonal to the guide plane (θ-direction movement). For example, current flow in the coils in the planar motor 460 on the right side of FIG. 24 drives that planar motor in one X direction, and current flow in the coils of the planar motor 460 on the left side of FIG. 24 drives that planar motor in the opposite X direction. Under such conditions, a moment force is created about an axis orthogonal to the guide plane, causing the arm 441 and moving stages 471a, 471b to rotate collectively (θ-direction motion) about an axis orthogonal to the guide plane. By adjusting the relative propulsion forces imparted by the respective linear-motor actuators 445, stage drive can be performed accurately with very little play. In addition, each planar motor 460 is disposed on an axis passing near the centroid of the arm 441 and the moving stages 471a, 471b. As a result, drive force can be applied to the centroid of each movable member, allowing stage position to be controlled with high precision and at high speed.

Further with respect to FIG. 24, the moving stage 471a defines a box-like through-hole having a rectangular cross-sectional profile and extending in the X direction. The moving stage 471a is affixed to the arm 441 from beneath the arm 441. Extending in the Y direction from the side of the moving stage 471a, as shown in FIG. 25, is the moving stage 471b that also defines a box-like through-hole having a rectangular cross-sectional profile and extending in the X direction. The moving stages 471a, 471b are connected mutually together so as to be movable in an integral manner. The guide member 473a, having a square transverse profile, extends through the through-hole of the moving stage 471a and engages the moving stage 471a via gas bearings (not shown). Similarly, the guide member 473b, having a square transverse profile, extends through the through-hole of the moving stage 473b and engages the moving stage 473b via gas bearings (not shown)). By employing gas bearings the moving stages 471a, 471b can slide as a unit in the X direction on the guide members 473a, 473b, respectively, at low friction. Also, providing two guide members 473a, 473b allows the moving stage 471a to be moved accurately in the X direction without play.

The slider 475, attached to respective ends of the guide members 473a, 473b, defines a box-like through-hole having a rectangular cross-sectional profile and extending in the Y direction. The guide member 477, having a square transverse profile, extends through the through-hole of the slider 475, and thus contacts the slider 475 via gas bearings (not shown in FIG. 24 but see FIG. 26). The interior of the guide member 477, described further below, defines a passage in which conduits are routed for supplying and exhausting gas to the gas bearings. Routing conduits in this manner eliminates the need to connect such conduits from externally to the slider 475, thereby improving stage controllability. The gas bearings enable the slider 475 to slide with low friction along the guide member 477 while suppressing motion of the moving stage 471a in the X direction and while suppressing rotation around the Z axis.

The slider 476, having a flat rectangular shape, is provided at the opposite end of the guide members 473a, 473b. The slider 476 slides between the guide members 478, 479 each having a rectangular transverse profile. Thus, the upper and lower surfaces of the slider 476 contact respective surfaces of the guide members 478, 479, respectively, via gas bearings (not shown in FIG. 24 but see FIG. 26). Each of the guide members 478, 479 defines an internal passage in which conduits are routed for supplying gas to and exhausting gas from the gas bearings. The gas bearings enable the slider 476 to slide with low friction relative to the guide members 478, 479. Thus, movement of the moving stage 471a in the X and Y directions is controlled by two guide members in each direction, allowing the moving stage 471a to slide accurately in the X and Y directions without play.

Figure 26:
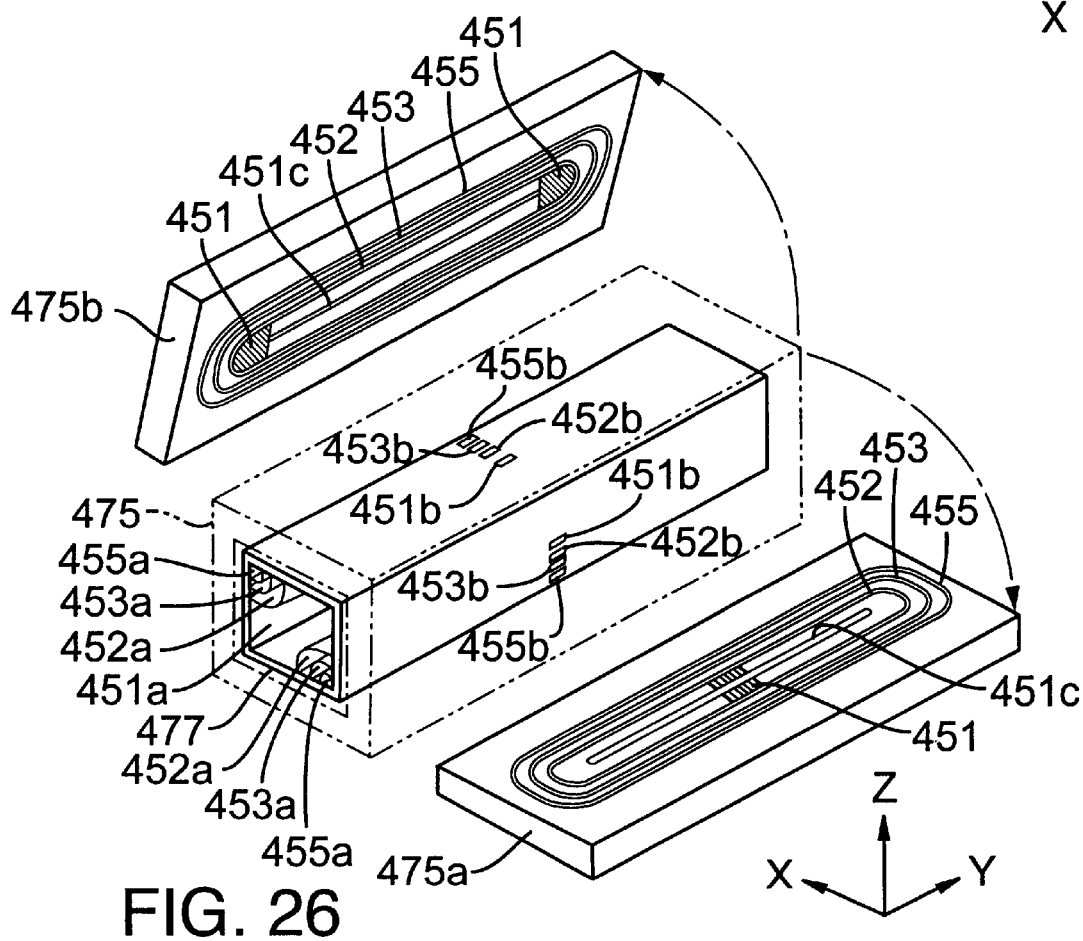
FIG. 26 is an oblique folded-out view showing details of a gas bearing on a slider of the embodiment of FIG. 24.

An exemplary gas bearing is shown in FIG. 26, depicting the guide member 477 of the stage apparatus 401. Shown in exploded view about the guide member 477 are an upper side 475b and a lateral side 475a of the slider 475. The exploded view allows the respective inner surfaces of the sides 475a, 475b to be revealed. The respective inner surfaces of the sides 475a, 475b normally engage respective surfaces of the guide member 477. It will be understood, however, that the specific configuration shown in FIG. 26 is exemplary only and is not intended to be limiting.

On the inner surface of the side 475b, two air pads 451 are provided. Each air pad 451 comprises a respective unit of a porous material and is provided at a respective end of the inner surface. A linear air-supply channel 451c is defined along the center line of the inner surface of the side 475b; the channel 451 extends in the Y direction between the two air pads 451. Also defined by the inner surface, in sequence outwardly from the air pads 451 and air-supply channel 451c, are an atmospheric-venting guard ring 452 (by which air from the bearing is released to the external atmosphere), a low-vacuum guard ring 453 to exhaust to low vacuum, and a high-vacuum guard ring 455 to exhaust to high vacuum. The respective ends of each guard ring 452, 453, 455 are semicircular, and the central part of each guard ring is extended in the Y direction.

On the inner surface of the side 475a an air pad 451 is provided in the center of the sliding surface. A linear air-supply channel 451c is defined along the center line of the inner surface of the side 475a; the channel 451 extends in the Y direction and cuts across the air pad 451. Also defined by the inner surface, in sequence outwardly from the air pad 451 and air-supply channel 451c, are an atmospheric-venting guard ring 452 (by which air from the bearing is released to the external atmosphere), a low-vacuum guard ring 453, and a high-vacuum guard ring 455. The respective ends of each guard ring 452, 453, 455 are semicircular, and the central part of each guard ring is extended in the Y direction.

The guide member 477 defines an internal passage through which respective conduits are routed for supplying, recovering, and exhausting air from each air pad 451 and guard rings 452, 453, 455. In this embodiment, a respective high-vacuum exhaust conduit 455a is formed in the upper left and lower right of the cross-section of the guide member 477 (as shown in FIG. 26). The high-vacuum exhaust conduits 455a extend longitudinally (in the Y direction) through the guide member 477. A respective low-vacuum exhaust conduit 453a extends parallel to and concentrically relative to each high-vacuum exhaust conduit 455a, and a respective atmospheric-venting conduit 452a extends parallel to and concentrically relative to each low-vacuum exhaust conduit 453a. The remaining portion of the passage extending through the guide member 477 serves as an air-supply conduit 451a for supplying air to the air pads 51.

The central region of the guide member 477 defines multiple holes 455b, 453b, 452b, 451b that communicate with the conduits 455a, 453a, 452a, 451a, respectively, and connect to the guard rings 455, 453, 452, and channel 451c, respectively. Since the respective center portions of each guard ring 452, 453, 455, and the channel 451c are linear, even when the slider 475 moves in the Y direction, the respective holes 452b, 453b, 455b, 451 remain connected with the respective guard rings 452, 453, 455, and channel 451c. This allows air supply, air recovery, and air exhaust always to be performed from each hole.

Air is supplied from the air-supply conduit 451a to the channel 451c, and released from the air pad 451. The released air passes through the atmospheric-venting guard ring 452 and is discharged to the atmosphere via the atmospheric-venting conduit 452a. Gas leaking from the atmospheric-release guard ring 452 passes through the low-vacuum guard ring 453 and is exhausted via the low-vacuum exhaust conduit 453a. Leaking gas also can enter the high-vacuum guard ring 455 and be exhausted via the high-vacuum exhaust conduit 455a. As a result, substantially no air from the air pad leaks out inside the wafer chamber, which is maintained at a high vacuum.

In this embodiment a respective air pad 451 is provided near each end of each of the upper and lower inner surfaces of the moving stage 471a and of the moving stage 471b, and one respective air pad 451 is provided in the center part of each side face. Also, a respective air pad 451 is provided near each end of each of the upper and lower inner surfaces of the slider 475, and respective air pad 451 is provided in the center part of each side face. In addition, two air pads 451 are formed respectively at positions, opposite the guide members 78, 79, on the slider 476. Air is discharged from holes in each air pad 451, applying pressure between each guide member and the respective slider or sliding stage. The resulting air "cushion" yields a fixed separation that is maintained between each guide member and the corresponding slider or moving stage.

The air pads 451 are disposed so as to provide the stage a limited freedom of motion around an axis orthogonal to the XY plane (θ direction). Hence, by varying the balance of propulsion forces generated by oppositely situated planar-motor actuators 445, limited rotations (θ-direction movements) of the stage are possible. The angle of such rotation about the axis is extremely small because the angle is limited by the gap separation in the gas bearings.

Seventh Representative Embodiment

Figure 27:
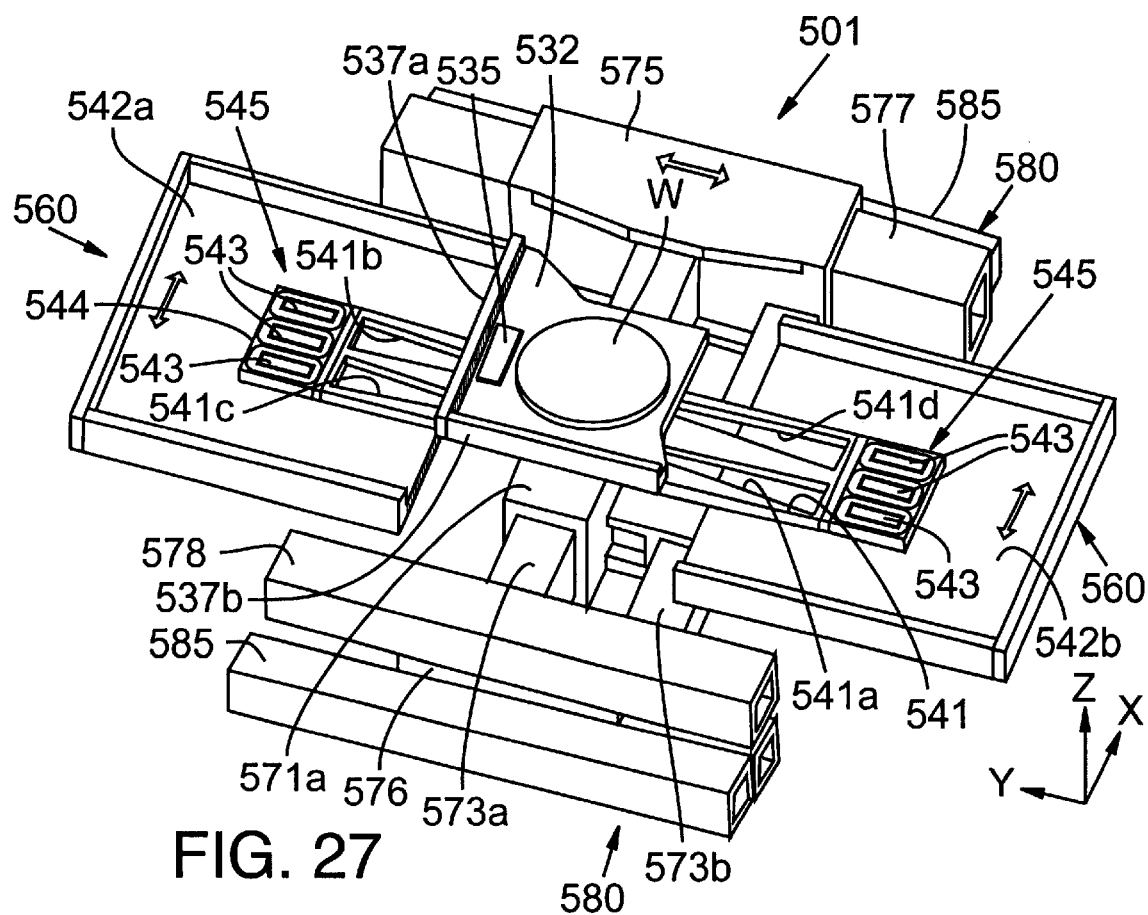
FIG. 27 is an oblique view showing the overall configuration of a stage apparatus according to a seventh representative embodiment.

A stage apparatus 501 according to this embodiment is depicted in FIG. 27. An elevational section of a portion of a linear motor in this embodiment is shown in FIG. 28.

Whereas in the sixth representative embodiment the planar motor is a uni-axial drive linear motor consisting of an armature and a magnet, in this seventh representative embodiment linear motors have been added outboard of the sliders 475 and 476 of the sixth representative embodiment. Such a configuration provides higher propulsion forces and suppresses yawing.

Turning to FIG. 27, three respective armature coils 543 are disposed, parallel to each other in the X direction, at each end of the arm 541 of the stage apparatus 501. The armature coils 543 and magnet arrays 542a, 542b form respective linear motors 560 that provide stage motion in the X direction.

Figures 28, 29:
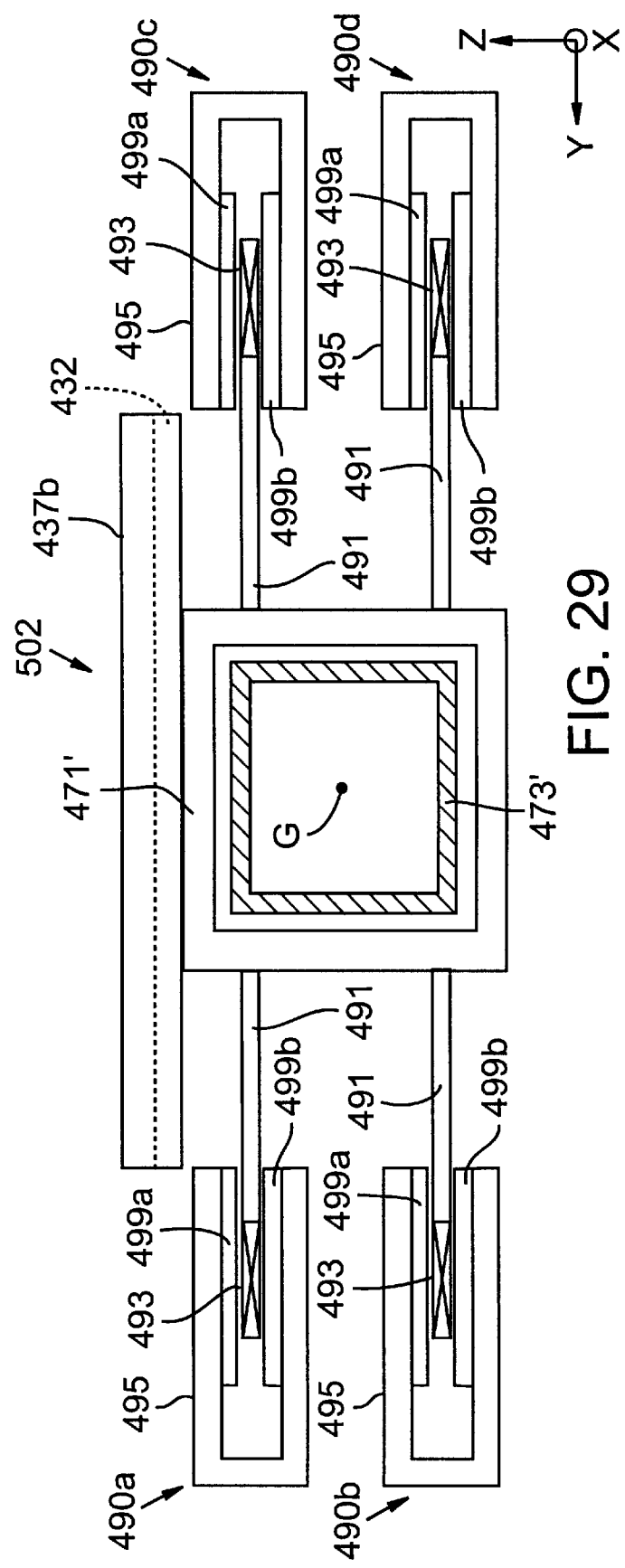
FIG. 28 is an elevational section of a portion of the linear motor of the stage apparatus of FIG. 27.
FIG. 29 is an elevational section of an actuator of a stage apparatus according to an eighth representative embodiment.
Figure 30:
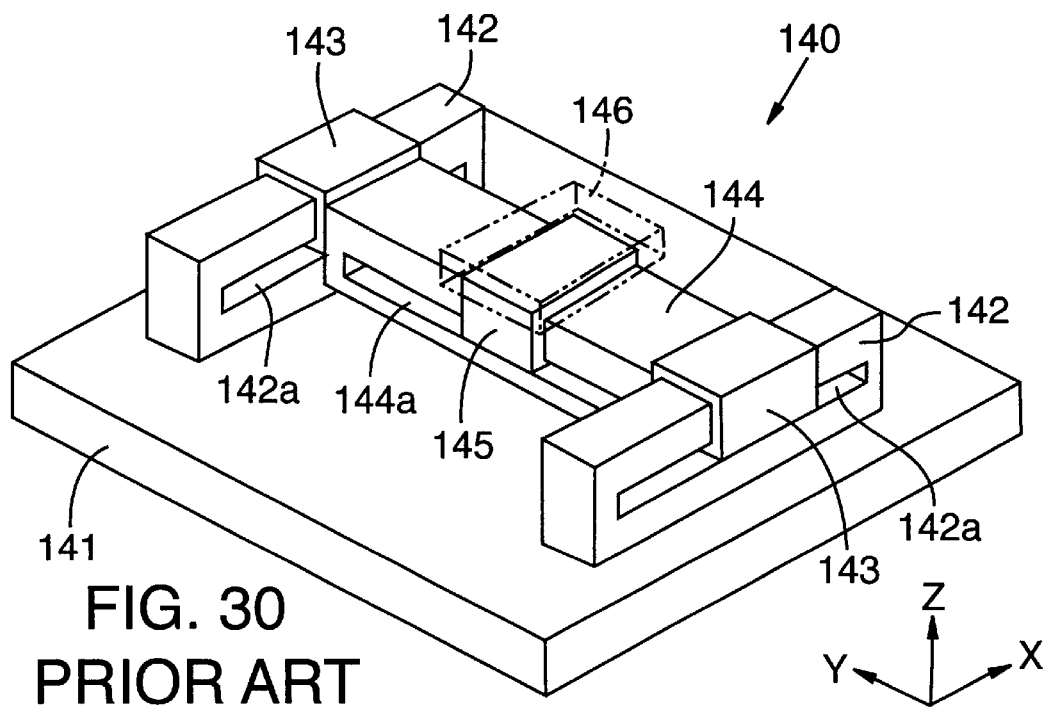
FIG. 30 is an oblique view of a conventional stage apparatus as disclosed in Japan Kôkai Patent Document No. Sho 62-182692.
Figure 31:
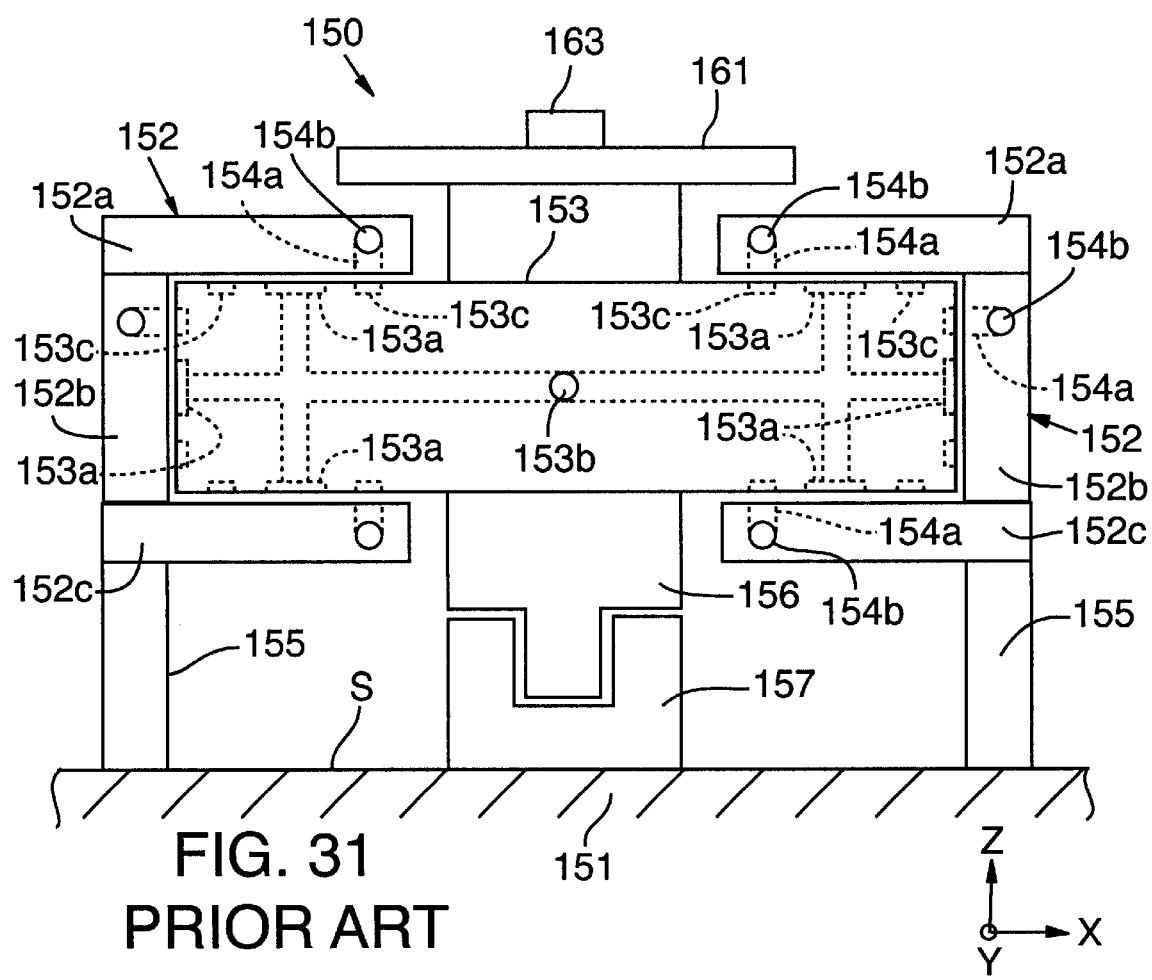
FIG. 31 is an elevational section of a conventional stage apparatus as disclosed in International Publication No. WO 99/66221.

Extending outward from each slider 575, 576 is a respective coil mounting 581 having a planar longitudinal profile (see FIG. 28). Each coil mounting 581 terminates with a respective armature 583 having a planar longitudinal shape. The coil mountings 581 are inserted into respective C-shaped members 585 that extend in the Y direction. Each C-shaped member 585 is sufficiently long so that the respective coil mounting 581 remains enclosed therein over the full range of movement (in the Y direction) of the respective armature 583 relative to the C-shaped member 585. The C-shaped members 585 are secured to a base via appropriate mountings (not shown). A respective magnet array 589a, 589b, each having a flat longitudinal shape, is mounted to each inside-facing surface of the C-shaped member (FIG. 28).

Each armature 583 is situated between respective magnet arrays 589a, 589b that define a respective gap in the Z direction for receiving the armature 583. The armatures 583 and respective magnet arrays 589a, 589b collectively define a linear motor 580. In the configuration shown in FIG. 27, the drive direction of the linear motor 580 is the Y direction. A gap also exists between the distal edge of the armature 583 and the opposing interior surface of the C-shaped member 585. This gap provides a corresponding freedom of movement of the armature 583 relative to the C-shaped member that is outside the drive direction of the linear motor 580.

The linear motors 560 provided on the arm 541 provide the stage apparatus 501 with stage-driving motion in the X direction, and the linear motors 580 provided on the sliders 575, 576 provide the stage apparatus 501 with stage-driving motion in the Y direction. Each linear motor utilizes a respective armature, so magnetic-field turbulence along the optical axis of the microlithography apparatus (with which the stage apparatus 501 is used) is small, and adequate magnetic shielding is simple to achieve. Also, each linear motor is situated on an axis passing through the centroid of the respective movable member. As a result, drive force is applied to the centroid part of the respective movable member, and the position of the respective movable member can be controlled with high precision and high speed.

A very limited range of rotational drive (θ-direction motion) is achieved by selectively varying the balance of propulsion force of linear motors extending parallel to each other. The angle of rotation is dictated by the gaps in the respective gas bearings, which is very small. Also, by adjusting the balance of propulsion force generated by the linear motors it is possible to achieve highly accurate drive with little play. Also, with respect to this embodiment, the linear motors added outboard of the sliders 575 and 576 provide even higher propulsion force and better suppression of yawing.

Eighth Representative Embodiment

A stage apparatus 502 according to this embodiment is shown in FIG. 29. This embodiment differs from the sixth representative embodiment in that, in the present embodiment, the planar motor driving the wafer table in the X direction comprises two vertically stacked and overlapping linear motors. Such a configuration applies drive forces directly to the centroid of the respective movable members, and the respective positions of the movable members can be controlled with high precision and high speed.

FIG. 29 shows a cross-section of a guide member 473'. As in the sixth representative embodiment, the ends of the guide member 473' are attached to respective sliders 475, 476 (not shown but see FIG. 24). The sliders 475, 476 engage respective guide members 477 and 478, 479 via respective gas bearings (see FIG. 24), thereby allowing the guide member 473' to slide in the Y direction.

Returning to FIG. 29, the guide member 473' extends through a moving stage 471', wherein the moving stage 471' moves in the X direction relative to the guide member 473' on air bearings. The moving stage 471' in this embodiment corresponds to the moving stage 471a in FIG. 24. The wafer table 432 is mounted to an upper surface of the moving stage 471'. The centroid G of the moving members (including the wafer table 432) is shown near the center of the moving stage 471'.

Four coil mountings 491 extend outward from the moving stage 471', two from each lateral side of the moving stage 471'. Hence, on each side the respective two coil mountings overlap each other vertically. Each coil mounting 491 terminates with a respective armature 493. Each armature 493 is flat with a defined thickness in the Z direction. Associated with each armature 493 is a respective C-shaped member 495, wherein the armatures 493 extend into the open side of the respective C-shaped member 495. On the planar inside surfaces of each C-shaped member 495 (opposite the respective armature 493) are respective magnet arrays 499a, 499b each having a planar longitudinal shape. The magnet arrays 499a, 499b face each other across the gap (in the Z direction) defined by the respective C-shaped member 495. Each combination of an armature 493 and respective magnet arrays 499a, 499b constitute a respective uni-axial-drive linear motor.

The linear motors 490a–490d desirably work together, but not necessarily to obtain movement in the same direction. For example, the linear motor 490a shown in the upper left in FIG. 29 and the linear motor 490d in the lower right of the figure can operate in concert to produce stage movement in the X direction. Similarly, the linear motor 490b in the lower left in the figure and the linear motor 490c in the upper right in the figure can operate in concert to produce stage movement in the Y direction. In this configuration, linear motors that produce movement in the same direction are disposed so as to apply a drive force directly to the centroid G of the respective movable members. Also, the stacked configuration of linear motors shown in FIG. 29 eliminates play around the X axis and eliminates the need to provide the moving stage 471b and guide member 473b of the sixth representative embodiment.

Whereas the invention has been described above in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A stage apparatus for moving and positioning a stage within a guide plane, comprising:
   a support structure comprising first and second linear-motor stators;
   a stage;
   an arm member connected to the stage, the arm member having a first end extending from the stage in a first direction and a second end extending from the stage in a second direction opposite the first direction in a plane parallel to the guide plane;
   first and second sets of linear-motor movers arranged on the first and second ends, respectively, and configured to interact with the first and second linear-motor stators, respectively, so as to achieve motion, relative to the support structure, of the arm member and stage in the guide plane; and
   a guide bar connected to the stage, the guide bar having a first end extending from the stage in the first direction and a second end extending from the stage in the second direction, wherein each end of the guide bar comprises a respective bearing by which the guide bar slides relative to a respective surface on the support structure without contacting the support structure.

2. The stage apparatus of claim 1, wherein:
   the stage is situated at a center of the arm member;
   the first and second ends extend symmetrically relative to the stage; and
   the first and second sets of linear-motor movers are arranged symmetrically with respect to the stage.

3. The stage apparatus of claim 1, wherein the bearings are plane bearings.

4. A stage apparatus for moving and positioning a stage within a guide plane, comprising:
   a support structure comprising first and second linear-motor stators;
   a stage;
   an arm member connected to the stage, the arm member having a first end extending from the stage in a first direction and a second end extending from the stage in a second direction;
   first and second sets of linear-motor mover coils arranged on the first and second ends, respectively, and configured to interact with the first and second linear-motor stators, respectively, so as to achieve motion of the arm member and stage, relative to the support structure, in the guide plane; and
   the arm member defining a conduit, internal with respect to the arm member, that conducts a coolant fluid to and from the mover coils.

5. A stage apparatus for moving and positioning a stage within a guide plane, comprising:
   a support structure;
   a stage;
   a guide bar attached to the stage such that the stage and guide bar have a constant positional relationship relative to each other, the guide bar defining at least three end portions extending in respective directions from the stage in a plane parallel to the guide plane; and
   each end portion comprising a respective plane bearing configured to support the respective end portion relative to the support structure without the respective plane bearing contacting the support structure.

6. The stage apparatus of claim 5 further comprising an arm connected to the stage parallel to the guide bar and including a first end and a second end, wherein the support structure further comprises a respective linear-motor stator for each of the first and second ends of the arm; and each of the first and second ends of the arm comprises a respective linear-motor mover configured to interact with a respective linear-motor stator so as to achieve motion of the arm, guide bar, and stage in the guide plane relative to the support structure.

7. The stage apparatus of claim 5, wherein:
   each plane bearing is configured as a gas bearing comprising at least one gas-bearing pad; and
   the guide bar defines internal conduits providing gas supply to and gas recovery and exhaust from the gas bearings.

8. A stage apparatus for moving and positioning a stage within a guide plane, comprising:
   a stage;
   a plurality of arm members connected to and extending from the stage, each arm member having respective first and second end portions each having attached thereto a respective linear-motor mover;

a plurality of guide bars extending from the stage, each guide bar having at least one respective end portion including a non-contacting bearing;

a support structure comprising (i) a respective linear-motor stator associated with each of the linear-motor movers, (ii) a respective guide plate associated with each linear-motor stator, wherein the bearings are configured to slide along respective guide plates, and (iii) the stators and respective guide plates are arranged in a stacked configuration relative to each other in a direction perpendicular to the guide plane.

9. A stage apparatus for moving and positioning a stage within a guide plane, comprising:

a support structure;

a main stage configured to hold a process object and to move, with the process object, relative to the support structure within a guide plane; and a substage situated relative to the main stage and the support structure, the substage being configured to mediate flow of a fluid to and from the main stage while the substage is being moved and positioned relative to the main stage, wherein the main stage and substage interrelate with each other via non-contacting plane bearings situated at respective interrelation portions of the main stage and substage at which the main stage and substage, respectively, interrelate with each other, and the flow of the fluid to and from the main stage occurs at the respective interrelation portions.

10. The stage apparatus of claim 9, wherein the plane bearings are respective air bearings each comprising a respective air pad.

11. The stage apparatus of claim 9, further comprising respective conduits for conducting the flow of fluid to and from the main stage.

12. The stage apparatus of claim 9, further comprising a linear motor situated and configured to drive the main stage in the guide plane relative to the support structure, the linear motor comprising a respective linear-motor stator at each of the interrelation portions, wherein the main stage and substage interrelate with each other in a Z direction, perpendicular to the guide plane, via the respective non-contacting plane bearings at the respective linear-motor stators.

13. The stage apparatus of claim 12, further comprising a reaction-force-attenuation mechanism situated to support a center of gravity of the linear-motor stators relative to a member vibrationally isolated from the stage apparatus.

14. A stage apparatus for moving and positioning a stage within an X–Y guide plane, the stage apparatus comprising:

a support structure;

a stage;

multiple Y-axis guide members extending in a Y direction;

a respective Y-axis slider associated with each Y-axis guide member, each Y-axis slider being situated and configured to slide in the Y direction along the respective Y-axis guide member;

at least one X-axis guide member mounted to the Y-axis sliders and extending in an X direction between the Y-axis sliders;

a respective X-axis slider situated and configured to slide in the X direction along the respective X-axis guide member, each X-axis slider being attached to the stage;

at least one respective non-contacting air bearing situated between each guide member and the respective slider; and at least one respective gas cylinder situated and configured to drive each X-axis slider and the Y-axis sliders relative to the respective guide members.

15. The stage apparatus of claim 14, wherein:

each slider includes multiple air bearings situated between the respective slider and the respective guide member;

each air bearing includes at least one respective guard ring situated and configured to exhaust air from the respective air bearing.

16. The stage apparatus of claim 15, wherein each guard ring is situated and configured to exhaust air from the respective gas cylinder.

17. The stage apparatus of claim 14, wherein each guide member defines a respective internal passage that includes at least one conduit for exhausting gas from the respective gas cylinder and from the respective air bearings.

18. The stage apparatus of claim 14, wherein each gas cylinder is configured to be pressurized at a pressure of at least $4 \times 10^5$ Pa.

19. A microlithography system for transferring a pattern onto a sensitive substrate, comprising a stage apparatus as recited in claim 1.

20. A microlithography system for transferring a pattern onto a sensitive substrate, comprising a stage apparatus as recited in claim 4.

21. A microlithography system for transferring a pattern onto a sensitive substrate, comprising a stage apparatus as recited in claim 5.

22. A microlithography system for transferring a pattern onto a sensitive substrate, comprising a stage apparatus as recited in claim 9.

23. A microlithography system for transferring a pattern onto a sensitive substrate, comprising a stage apparatus as recited in claim 14.

24. A stage apparatus for moving and positioning a stage within a guide plane and relative to an axis extending perpendicularly to the guide plane, comprising:

a guide member;

a slider situated relative to the guide member and configured to undergo a sliding motion in the guide plane relative to the guide member as guided by the guide member, the sliding motion being on at least one non-contacting gas bearing situated between the slider and the guide member;

a stage attached to the slider; and a drive mechanism operably coupled to the slider so as to cause the sliding motion of the slider relative to the guide member, the drive mechanism comprising at least one linear motor and at least one gas cylinder, the gas cylinder being configured to provide a driving force, assisting a driving force imparted to the slider by the linear motor, during acceleration and deceleration of the slider.

25. The apparatus of claim 24, wherein the gas cylinder is hydraulically connected to the gas bearings.

26. The stage apparatus of claim 25, further comprising a respective guard ring associated with each gas bearing, the guard rings being configured to exhaust air from the respective gas bearing and from the gas cylinder.

27. The stage apparatus of claim 24, wherein:

a first gas cylinder and respective linear motor are situated in at a central region of the slider; and a second gas cylinder and respective linear motor are situated in opposition to the first gas cylinder and respective linear motor so as to flank the slider.

28. The stage apparatus of claim 24, comprising multiple guide members connected to a base by respective dampers.

29. The stage apparatus of claim 24, wherein each linear motor comprises a respective stator each including permanent magnets and having a C-shaped transverse profile.

30. The stage apparatus of claim 29, comprising multiple stators, the stators being situated such that respective openings in the C-shaped profiles face away from the axis.

31. A stage apparatus for moving and positioning a stage within an X–Y guide plane that is perpendicular to an axis, comprising:
- a support structure comprising multiple Y-axis guide members extending in the Y direction;
- a respective Y-axis slider associated with each Y-axis guide member, each Y-axis slider comprising at least one gas bearing, each Y-axis slider being situated relative to the respective Y-axis guide member and being configured to slide on the at least one gas bearing relative to the respective Y-axis guide member, as guided by the respective Y-axis guide member, but without contacting the respective Y-axis guide member;
- an X-axis guide member attached to the Y-axis sliders and extending in the X direction relative to the Y-axis guide members;
- an X-axis slider comprising at least one gas bearing, the X-axis slider being situated relative to the X-axis guide member and being configured to slide on the at least one gas bearing relative to the X-axis guide member, as guided by the X-axis guide member, but without contacting the X-axis guide member;
- a stage mounted to the X-axis slider; and
- a respective drive mechanism associated with each of the Y-axis sliders and with the X-axis slider, each respective drive mechanism comprising a respective linear motor and a respective gas cylinder, each respective gas cylinder being connected to the respective at least one gas bearing so as to augment a driving force applied to the respective slider by the respective linear motor during acceleration and deceleration of the respective slider.

32. The stage apparatus of claim 31, further comprising a respective guard ring associated with each gas bearing, the guard rings being configured to exhaust air from the respective gas bearing and from the respective gas cylinder.

33. The stage apparatus of claim 31, wherein, with respect to each drive mechanism, the respective gas cylinder comprises a first gas subchamber and a second gas subchamber, the first and second gas subchambers being situated in opposition to each other so as to impart motion to the respective slider in both longitudinal directions relative to the respective guide member.

34. The stage apparatus of claim 33, wherein the first and second gas subchambers are situated in a central region of the respective slider.

35. The stage apparatus of claim 33, wherein the first and second gas subchambers are separated from each other by a division plate.

36. The stage apparatus of claim 33, wherein the first and second gas subchambers are flanked by the respective linear motors.

37. The stage apparatus of claim 31, wherein the guide members are connected to a base by respective dampers.

38. The stage apparatus of claim 31, wherein, with respect to each drive mechanism, the respective linear motor comprises stators each including permanent magnets and having a C-shaped transverse profile, the stators being situated such that respective openings in the C-shaped profiles face away from the axis.

39. A microlithography system for transferring a pattern onto a sensitive substrate, comprising a stage apparatus as recited in claim 24.

40. A microlithography system for transferring a pattern onto a sensitive substrate, comprising a stage apparatus as recited in claim 31.

41. A stage apparatus for moving and positioning a stage within a guide plane defined by first and second orthogonal dimensional axes, relative to a third axis perpendicular to the guide plane, the stage apparatus comprising:
- a support structure comprising two first-axis guide members extending in the first-axis direction;
- two first-axis sliders each comprising non-contacting gas bearings, each first-axis slider comprising an upper, a lower, a left, and a right sliding surface, the first-axis sliders being situated relative to respective first-axis guide members and configured to slide on the gas bearings relative to and as guided by the respective first-axis guide members;
- a second-axis guide member attached to and extending in the second-axis direction between the two first-axis sliders;
- a second-axis slider comprising non-contacting gas bearings, the second-axis slider being situated relative to the second-axis guide member and configured to slide on the gas bearings relative to and as guided by the second-axis guide member;
- a stage mounted to the second-axis slider; and
- a respective gas bearing situated on each of the upper, lower, left, and right sliding surfaces of one of the first-axis sliders, and a respective gas bearing situated on each of the upper and lower sliding surfaces of the other first-axis slider.

42. The stage apparatus of claim 41, further comprising two second-axis guide members situated parallel to each other and attached to and extending in the second-axis direction between the two first-axis sliders.

43. The stage apparatus of claim 41, wherein each gas bearing is an air bearing comprising a respective air pad.

44. The stage apparatus of claim 43, wherein each air bearing comprises a respective guard ring situated and configured to recover and exhaust air discharged into the respective air bearing.

45. The stage apparatus of claim 43, wherein:
- with respect to each air bearing, the respective guide member includes respective conduits for supplying, recovering, and exhausting air from the air bearings on the respective slider; and
- each air bearing is connected to the respective conduits.

46. The stage apparatus of claim 41, further comprising:
- an arm member attached to the stage, the arm member including end portions extending from the stage in a plane parallel to the guide plane; and
- at least one respective set of linear-motor movers or planar-motor movers situated on each end portion, the sets of movers being configured to interact with and move relative to respective stators of respective linear motors or planar motors, respectively, to move the stage in at least one of the first-axis and second-axis directions.

47. The stage apparatus of claim 46, wherein:
- each end portion of the arm member comprises two respective sets of linear-motor movers;
- each set of linear-motor movers is configured to interact with and move relative to a respective stator;

the two respective sets of linear-motor movers associated with each end portion are disposed in a symmetrically stacked arrangement in a direction parallel to the third axis;

of the two sets of linear-motor movers on one end portion, one set drives the stage in the first-axis direction and the other set drives the stage in the second-axis direction; and of the two sets of linear-motor movers on the other end portion, one set drives the stage in the first-axis direction and the other set drives the stage in the second axis direction.

48. The stage apparatus of claim 47, wherein:

the stage and second-axis slider collectively have a centroid; and respective drive forces imparted by the linear motors associated with the end portions of the arm member are centered on the centroid.

49. The stage apparatus of claim 46, wherein:

each end portion of the arm member has a respective set of linear-motor movers configured to mover the second-axis slider, with the stage, along the second-axis guide member; and each first-axis slider has associated therewith a respective first-axis linear motor configured to move the respective first-axis slider along the respective first-axis guide member.

50. The stage apparatus of claim 46, wherein:

the stage is provided with a freedom to undergo an amount of θ-direction rotation about the third axis; and the sets of respective linear-motor movers situated on the end portions of the arm member are configured to apply a motive force to the arm member sufficient to apply a θ-direction rotation to the stage.

51. The stage apparatus of claim 46, wherein:

each gas bearing is configured to provide the stage with a freedom to undergo an amount of θ-direction rotation about the third axis; and the sets of respective linear-motor movers situated on the end portions of the arm member are configured to apply a motive force to the arm member sufficient to apply a θ-direction rotation to the stage.

52. The stage apparatus of claim 46, wherein each linear-motor mover is a respective armature coil exhibiting substantially no variation in magnetic field during motion of the coil relative to the respective stator.

53. The stage apparatus of claim 46, wherein the arm member defines an internal passage configured to route a coolant fluid to and from the respective sets of linear-motor movers.

54. The stage apparatus of claim 46, wherein the arm member comprises multiple anti-vibration actuators.

55. The stage apparatus of claim 54, wherein each anti-vibration actuator is a respective piezoelectric element or magnetostrictive element.

56. A microlithography system for transferring a pattern onto a sensitive substrate, comprising a stage apparatus as recited in claim 41.

57. A microlithography system for transferring a pattern onto a sensitive substrate, comprising a stage apparatus as recited in claim 46.

58. A stage apparatus for moving and positioning a stage within a guide plane defined by first and second orthogonal dimensional axes, the stage apparatus comprising:

a support structure comprising at least one first-axis guide member extending in the first-axis direction;

a respective first-axis slider associated with each first-axis guide member, each first-axis slider comprising multiple gas bearings configured to allow the first-axis slider to slide along the respective first-axis guide member, as guided by the first-axis guide member, without contacting the first-axis guide member;

at least one second-axis guide member attached to the at least one first-axis slider and extending in the second-axis direction relative to the at least one first-axis slider;

a respective second-axis slider associated with each second-axis guide member, each second-axis slider comprising multiple gas bearings configured to allow the second-axis slider to slide along the respective second-axis guide member, as guided by the second-axis guide member, without contacting the second-axis guide member; and a stage mounted to the at least one second-axis slider.

59. The stage apparatus of claim 58, comprising one second-axis guide member extending between the first-axis sliders, and one second-axis slider associated with the second-axis guide member.

60. The stage apparatus of claim 59, wherein:

the second-axis slider comprises first and second linear motors attached to one side and third and fourth linear motors attached to an opposing side of the second-axis slider;

one of the first and second linear motors and one of the third and fourth linear motors actuates movement of the second-axis slider in the first-axis direction; and the other of the first and second linear motors and the other of the third and fourth linear motors actuates movement of the second-axis slider in the second-axis direction.

61. The stage apparatus of claim 60, wherein:

a moving mass represented by the second-axis slider and stage has a centroid; and of the first, second, third, and fourth linear motors, the linear motors that actuate movement of the second-axis slider in the first-axis direction are symmetrically situated relative to the centroid, and the linear motors that actuate movement of the second-axis slider in the second-axis direction are symmetrically situated relative to the centroid so as to apply respective drive forces to the centroid in the first-axis direction and second-axis direction.

62. A microlithography system for transferring a pattern onto a sensitive substrate, comprising a stage apparatus as recited in claim 58.

* * * * *

UNITED STATES PATENT AND TRADEMARK OFFICE
CERTIFICATE OF CORRECTION

PATENT NO.      : 6,583,597 B2                                                   Page 1 of 1
DATED           : June 24, 2003
INVENTOR(S)     : Tanaka et al.

It is certified that error appears in the above-identified patent and that said Letters Patent is hereby corrected as shown below:

Title page, Item [54] and Column 1, lines 1-2,
Title, "NON-CONTAINING" should be -- NON-CONTACTING --.

Column 10,
Line 37, "Fig. 6 an" should be -- Fig. 6 is an --.

Column 11,
Line 11, "section of along" should be -- section along --.

Column 26,
Line 10, "(mounted to the side of the slider 327," should be -- (mounted to the side of the slider 327), --.

Column 41,
Line 22, "mover" should be -- move --.

Signed and Sealed this

Thirtieth Day of December, 2003

JAMES E. ROGAN
*Director of the United States Patent and Trademark Office*